(12) United States Patent
Sato et al.

(10) Patent No.: US 8,460,850 B2
(45) Date of Patent: Jun. 11, 2013

(54) ACTINIC RAY-SENSITIVE OR RADIATION-SENSITIVE RESIN COMPOSITION AND PATTERN FORMING METHOD USING SAME

(75) Inventors: Kenichiro Sato, Haibara-gun (JP); Akinori Shibuya, Haibara-gun (JP); Shuhei Yamaguchi, Haibara-gun (JP); Hiroshi Inada, Haibara-gun (JP)

(73) Assignee: FUFIFILM Corporation, Tokyo (JP)

( * ) Notice: Subject to any disclaimer, the term of this patent is extended or adjusted under 35 U.S.C. 154(b) by 333 days.

(21) Appl. No.: 12/493,830

(22) Filed: Jun. 29, 2009

(65) Prior Publication Data

US 2009/0325103 A1 Dec. 31, 2009

Related U.S. Application Data

(60) Provisional application No. 61/078,028, filed on Jul. 3, 2008.

(30) Foreign Application Priority Data

Jun. 30, 2008 (JP) ................................. 2008-171872
Jun. 12, 2009 (JP) ................................. 2009-141027

(51) Int. Cl.
  *G03F 7/039* (2006.01)
  *G03F 7/30* (2006.01)
(52) U.S. Cl.
  USPC .......................... 430/270.1; 430/326; 430/325
(58) Field of Classification Search
  None
  See application file for complete search history.

(56) References Cited

U.S. PATENT DOCUMENTS

| 7,566,522 B2 | 7/2009 | Takata et al. | |
| 2005/0260525 A1* | 11/2005 | Takemoto et al. | 430/270.1 |
| 2006/0127801 A1* | 6/2006 | Momose et al. | 430/270.1 |
| 2007/0122750 A1 | 5/2007 | Yamaguchi et al. | |
| 2008/0026331 A1 | 1/2008 | Hasegawa et al. | |
| 2008/0268370 A1* | 10/2008 | Tanaka et al. | 430/270.1 |
| 2009/0220890 A1* | 9/2009 | Hata et al. | 430/286.1 |

FOREIGN PATENT DOCUMENTS

| CN | 101 206 405 A | 6/2008 |
| EP | 1 612 602 A | 1/2006 |
| EP | 1 757 628 A | 2/2007 |
| EP | 1 903 394 A | 3/2008 |
| JP | 2003-005375 A | 1/2003 |
| JP | 2003-252933 A | 9/2003 |
| JP | 2003-255537 A | 9/2003 |
| JP | 2004-210917 A | 7/2004 |
| JP | 2005-352466 A | 12/2005 |
| JP | 2008-031298 A | 2/2008 |

* cited by examiner

*Primary Examiner* — Cynthia Hamilton
(74) *Attorney, Agent, or Firm* — Sughrue Mion, PLLC

(57) ABSTRACT

An actinic ray-sensitive or radiation-sensitive resin composition includes (A) a resin having at least two of repeating units represented by general formula (1) below and exhibiting increased solubility in an alkali developer when acted on by an acid, and (B) a compound that generates an acid when exposed to actinic rays or radiation.

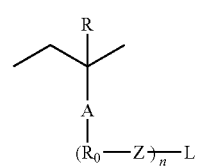

(1)

In the formula, each of R, A, $R_0$, Z, L and n represents the same as defined in the claims and in the specification.

17 Claims, No Drawings

ACTINIC RAY-SENSITIVE OR RADIATION-SENSITIVE RESIN COMPOSITION AND PATTERN FORMING METHOD USING SAME

CROSS REFERENCE TO RELATED APPLICATIONS

This application claims the benefit of U.S. Provisional Application No. 61/078,028, filed Jul. 3, 2008.

This application is based upon and claims the benefit of priority from prior Japanese Patent Applications No. 2008-171872, filed Jun. 30, 2008; and No. 2009-141027, filed Jun. 12, 2009, the entire contents of both of which are incorporated herein by reference.

BACKGROUND OF THE INVENTION

1. Field of the Invention

The present invention relates to an actinic ray-sensitive or radiation-sensitive resin composition that undergoes a reaction when exposed to actinic rays or radiation thereby changing its properties, and also relates to a method of forming a pattern therewith. More particularly, the present invention relates to an actinic ray-sensitive or radiation-sensitive resin composition for use in a production of a semiconductor such as an IC and a production of a circuit board for a thermal head, a liquid crystal and the like; for use in other photofabrication processes; for use in a production of a lithographic printing plate; and for use as an acid-setting composition; and also relates to a method of forming a pattern therewith.

In the present invention, the terms "actinic rays" and "radiation" mean, for example, a mercury lamp bright line spectrum, far ultraviolet rays represented by an excimer laser, extreme ultraviolet rays, X-rays, electron beams and the like. In the present invention, the term "light" means actinic rays or radiation.

2. Description of the Related Art

A chemical amplification resist is capable of, upon exposure to far ultraviolet rays or other radiation, generating an acid at the exposed area. A reaction catalyzed by the generated acid allow the solubility of the exposed area in a developer to be different from that of the non-exposed area. The difference in the solubility between those areas makes it possible to attain pattern formation on a substrate.

In using a KrF excimer laser as an exposure light source, a resin whose fundamental skeleton consists of a poly(hydroxystyrene) exhibiting a low absorption mainly in the region of 248 nm is employed as a major component. Accordingly, favorable pattern with high sensitivity and high resolving power can be formed. Thus, a system superior to the conventional naphthoquinone diazide/novolak resin system has been realized.

On the other hand, in using a light source of a further shorter wavelength, for example, an ArF excimer laser (193 nm) as an exposure light source, the above-mentioned chemical amplification system has not been satisfactory because the compounds having an aromatic group inherently exhibit a sharp absorption in the region around 193 nm.

Therefore, various resists for an ArF excimer laser containing an alicyclic hydrocarbon structure have been developed. However, the current situation is that it is extremely difficult to discover an appropriate combination among an employed resin, a photoacid generator, an additive and a solvent, etc., from the viewpoint of the comprehensive performance of a resist. Further, in the formation of a fine pattern whose line width is, for example, 65 nm or less, it has been demanded to improve line edge roughness performance of line-pattern and resolving power.

It has been found that the resolving power and line edge roughness performance can be improved by incorporation of a repeating unit having a specific lactone structure in a resin with the above alicyclic hydrocarbon structure. For example, Jpn. Pat. Appln. KOKAI Publication No. (hereinafter referred to as JP-A-) 2005-352466 and JP-A-2004-210917 describe resist compositions containing resins having specific lactone repeating units in which a spacer is introduced between the polymer principal chain and the lactone skeleton. Further, JP-A-2008-31298 describes that not only the resolving power and line edge roughness but also the dependency on density distribution and exposure margin can be improved by use of a resist composition containing a resin having a specific lactone repeating unit in which a similar spacer is incorporated.

Still further, JP-A-2003-5375, JP-A-2003-255537 and JP-A-2003-252933 disclose compositions characterized by containing resins obtained by copolymerization of two or more types of lactone monomers.

However, in view of the most recent developments in which use is made of a line width of 45 nm or less and to which a liquid immersion process is applied, it is demanded to raise the level of relevant technology. Accordingly, the above-mentioned prior art is not always satisfactory and the current situation is that deficiency is encountered not only in the Line Width Roughness (LWR) but also in the exposure latitude and Mask Enhancement Error Factor (MEEF).

BRIEF SUMMARY OF THE INVENTION

An object of the present invention is to provide an actinic ray-sensitive or radiation-sensitive resin composition with improved LWR, exposure latitude and MEEF, being suitable for use in a liquid immersion process for a line width of 45 nm or less, and to provide a method of forming a pattern therewith.

Some aspects of the present invention will be described below:

[1] An actinic ray-sensitive or radiation-sensitive resin composition characterized by comprising:

(A) a resin having at least two of repeating units represented by general formula (1) below and exhibiting increased solubility in an alkali developer when acted on by an acid; and (B) a compound that generates an acid when exposed to actinic rays or radiation;

wherein:

R represents a hydrogen atom or an optionally substituted alkyl group;

A represents:

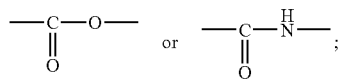

$R_0$, each independently in the presence of two or more groups, represents an optionally substituted alkylene group, an optionally substituted cycloalkylene group or a combination thereof, with the proviso that an alkylene group having two or more carbon atoms is excluded when L represents a butyrolactone;

Z, each independently in the presence of two or more groups, represents an ether bond, an ester bond, an amido bond, a urethane bond or a urea bond;

L represents a substituent with a lactone structure; and n represents the number of repetitions and is an integer of 1 to 5.

[2] The composition according to [1], characterized in that the resin (A) has at least one of repeating units represented by general formula (1-1) below as the repeating unit represented by the general formula (1);

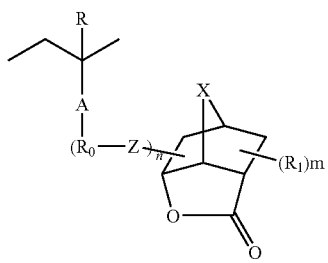

(1-1)

wherein:

R, A, $R_0$, Z and n are as defined above with respect to the general formula (1) of [1];

$R_1$, each independently in the presence of two or more groups, represents an optionally substituted alkyl group, an optionally substituted cycloalkyl group, an optionally substituted ester group, a cyano group, a hydroxy group or an alkoxy group, and provided that two or more $R_1$s are present, two thereof may be bonded to each other to form a ring;

X represents an alkylene group, an oxygen atom or a sulfur atom; and m represents the number of substituents and is an integer of 0 to 5.

[3] The composition according to [2], characterized in that the resin (A) has at least two of the repeating units represented by the general formula (1-1).

[4] The composition according to any one of [1] to [3], characterized in that each of the at least two of the repeating units represented by the general formula (1) has different rates of alkali hydrolysis.

[5] The composition according to any one of [1] to [4], characterized in that a glass transition point of the resin (A) is within the range of 130° C. to 170° C.

[6] The composition according to any one of [1] to [5], characterized in that the resin (A) has both at least one repeating unit having any of groups represented by general formula (2-1) below and at least one repeating unit having any of groups represented by general formula (2-2) below;

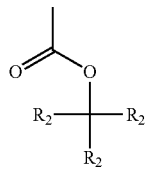

(2-1)

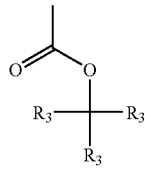

(2-2)

wherein:

in the general formula (2-1), each of $R_2$s independently represents an optionally substituted alkyl group or an optionally substituted monocyclic alkyl group, with the proviso that at least one of the $R_2$s is an optionally substituted monocyclic alkyl group, and provided that when all of the $R_2$s are alkyl groups, two $R_2$s are bonded to each other to form a monocyclic alkyl group; and in the general formula (2-2), each of $R_3$s independently represents an optionally substituted alkyl group or an optionally substituted polycyclic alkyl group, with the proviso that at least one of the $R_3$s is an optionally substituted polycyclic alkyl group, and provided that when all of the $R_3$s are optionally substituted alkyl groups, two $R_3$s are bonded to each other to form a polycyclic alkyl group.

[7] The composition according to any one of [1] to [6], characterized by containing any of compounds represented by general formula (I) below as the compound (B);

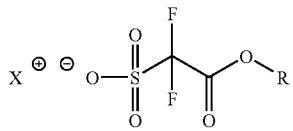

(I)

wherein $X^+$ represents a sulfonium or an iodonium, and R represents a hydrogen atom or a substituent having one or more carbon atoms.

[8] The composition according to any one of [1] to [7], characterized by further comprising (C) a hydrophobic resin.

[9] A method of forming a pattern, characterized by comprising:

forming the composition according to any one of [1] to [8] into a film, exposing the obtained film, and developing the exposed film.

The present invention has made it feasible to provide an actinic ray-sensitive or radiation-sensitive resin composition with improved LWR, exposure latitude and MEEF, being suitable for use in a liquid immersion process for a line width of 45 nm or less and to provide a method of forming a pattern therewith.

DETAILED DESCRIPTION OF THE INVENTION

The present invention will be described below.

Note that, with respect to the expression of a group (or an atomic group) used in this specification, the expression without explicitly referring to whether the group is substituted or unsubstituted encompasses not only groups with no substituents but also groups having one or more substituents. For example, the expression "alkyl group" encompasses not only alkyl groups having no substituents (viz. unsubstituted alkyl groups) but also alkyl groups having one or more substituents (viz. substituted alkyl groups).

Also note that, in this specification, mass ratio is equal to weight ratio.

[1] resin (A) whose solubility in an alkali developer is increased by the action of an acid:

The resin (A) contained in the actinic ray-sensitive or radiation-sensitive resin composition according to the present invention has at least two of the repeating units represented by the following general formula (1).

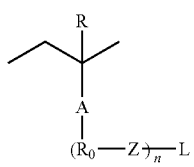

(1)

In the general formula (1),

R represents a hydrogen atom or an optionally substituted alkyl group.

A represents:

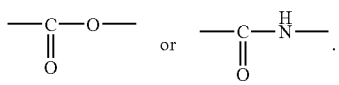

$R_0$, each independently in the presence of two or more groups, represents an optionally substituted alkylene group, an optionally substituted cycloalkylene group or a combination thereof, with the proviso that a chain alkylene group having two or more carbon atoms is excluded when L represents a butyrolactone.

Z, each independently in the presence of two or more groups, represents an ether bond, an ester bond, an amido bond, a urethane bond or a urea bond.

L represents a substituent with a lactone structure, and n represents the number of repetitions and is an integer of 1 to 5.

A further detailed description will be made with respect to the general formula (1).

The alkyl group represented by R is preferably an alkyl group having 1 to 4 carbon atoms, more preferably a methyl group or an ethyl group, and most preferably a methyl group. As substituents on R, a halogen atom such as a fluorine atom, a chlorine atom or a bromine atom, a mercapto group, a hydroxy group, an alkoxy group such as a methoxy group, an ethoxy group, an isopropoxy group, a t-butoxy group or a benzyloxy group, an acyl group such as an acetyl group or a propionyl group, and an acetoxy group.

The group represented by $R_0$ is any of a chain alkylene group, a cycloalkylene group and a combination thereof, with the proviso that a chain alkylene group having two or more carbon atoms is excluded when the group represented by L is a butyrolactone. The chain alkylene group is preferably a chain alkylene group having 1 to 10 carbon atoms, more preferably 1 to 5 carbon atoms, for example, a methylene group, an ethylene group or a propylene group. The cycloalkylene group is preferably a cycloalkylene group having 4 to 20 carbon atoms, for example, a cyclohexylene group, a cyclopentylene group, a norbornylene group or an adamantylene group. The chain alkylene groups are preferred from the viewpoint of the exertion of the effect of the present invention. Of these, the methylene group is particularly preferred. As a possible substituent of the chain or cyclic alkylene group represented by $R_0$, a hydroxy group, a cyano group, an alkoxy group having 1 to 4 carbon atoms, an alkoxycarbonyl group and an acyloxy group can be exemplified.

Z preferably represents an ether bond, an ester bond or a urethane bond, more preferably an ether bond or an ester bond.

n is preferably 1.

The substituents with a lactone structure represented by L are not particularly limited as long as a lactone structure is contained therein. However, lactone structures of a 5- to 7-membered ring are preferred, and particularly preferred are those resulting from condensation of lactone structures of a 5- to 7-membered ring with other cyclic structures effected in a fashion to form a bicyclo structure or spiro structure. More preferred is a lactone structure represented by any of general formulae (LC1-1) to (LC1-17) below. The lactone structures may be directly bonded to the principal chain of the resin. Preferred lactone structures are those of formulae (LC1-1), (LC1-4), (LC1-5), (LC1-6), (LC1-13), (LC1-14), and (LC1-17).

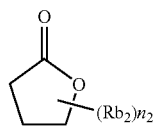

LC1-1

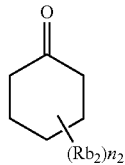

LC1-2

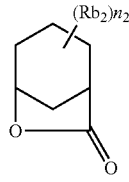

LC1-3

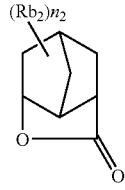

LC1-4

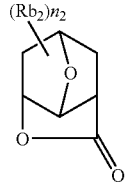

LC1-5

-continued

LC1-6 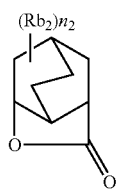

LC1-7 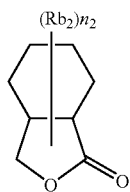

LC1-8 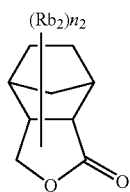

LC1-9 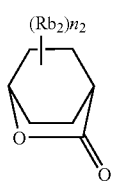

LC1-10 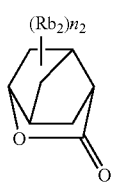

LC1-11 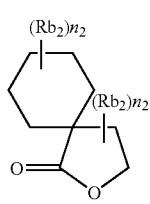

LC1-12 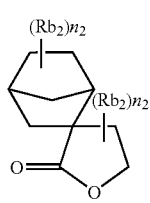

LC1-13 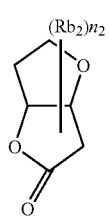

-continued

LC1-14 

LC1-15 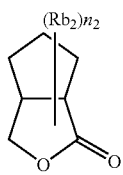

LC1-16 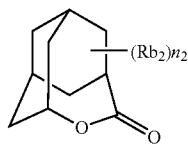

LC1-17 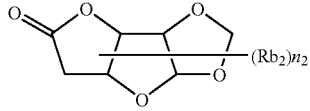

The presence of a substituent $Rb_2$ on the lactone structure is optional. As a preferred substituent $Rb_2$, an alkyl group having 1 to 8 carbon atoms, a cycloalkyl group having 4 to 7 carbon atoms, an alkoxy group having 1 to 8 carbon atoms, an alkoxycarbonyl group having 1 to 8 carbon atoms, a carboxyl group, a halogen atom, a hydroxy group, a cyano group, and an acid-decomposable group can be exemplified. Of these, an alkyl group having 1 to 4 carbon atoms, a cyano group and an acid-decomposable group are more preferred. In the formulae, $n_2$ is an integer of 0 to 4. When $n_2$ is 2 or greater, the plurality of present substituents $Rb_2$ may be identical to or different from each other. Further, the plurality of present substituents $Rb_2$ may be bonded to each other to form a ring.

As especially preferred lactone repeating units, those represented by the following general formula (1-1) can be exemplified.

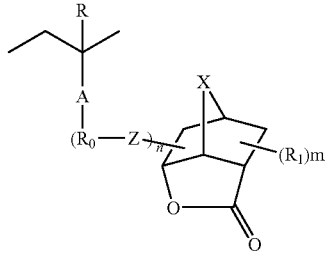

(1-1)

In the general formula (1-1),
R, A, $R_0$, Z and n are as defined above with respect to the general formula (1).
$R_1$, each independently in the presence of two or more groups, represents an optionally substituted alkyl group, an optionally substituted cycloalkyl group, an optionally substituted ester group, a cyano group, a hydroxy group or an alkoxy group. In the presence of two or more R₁s, two thereof may be bonded to each other to form a ring.

X represents an alkylene group, an oxygen atom or a sulfur atom.

m represents the number of substituents and is an integer of 0 to 5, and preferably 0 or 1.

A further detailed description will be made with respect to the general formula (1-1).

The preferred examples of the groups represented by R and $R_0$ are the same as mentioned with respect to the general formula (1).

The alkyl group represented by $R_1$ is preferably an alkyl group having 1 to 4 carbon atoms, more preferably a methyl group or an ethyl group, and most preferably a methyl group. As the cycloalkyl group, a cyclopropyl group, a cyclobutyl group, a cyclopentyl group and a cyclohexyl group can be exemplified. As the ester group, a methoxycarbonyl group, an ethoxycarbonyl group, an n-butoxycarbonyl group and a t-butoxycarbonyl group can be exemplified. As the alkoxy group, an alkoxy group having 1 to 4 carbon atoms is preferred. As the substituent therefor, a hydroxy group, an alkoxy group such as a methoxy group or an ethoxy group, a cyano group, and a halogen atom such as a fluorine atom can be exemplified.

$R_1$ preferably represents a methyl group, a cyano group or an alkoxycarbonyl group. Of these, a cyano group is particularly preferred.

As the alkylene group represented by X, a methylene group and an ethylene group can be exemplified. X preferably represents an oxygen atom or a methylene group. Of these, a methylene group is particularly preferred.

When m is 1 or greater, the substitution site of at least one $R_1$ is preferably the α-position or β-position of the carbonyl group of the lactone. The substitution at the α-position is especially preferred.

Specific examples of the repeating units having groups with a lactone structure expressed by the general formula (1) will be shown below, which however in no way limit the scope of the present invention.

In the following specific examples, R represents a hydrogen atom, an optionally substituted alkyl group or a halogen atom. Preferably, R represents a hydrogen atom, a methyl group, a hydroxymethyl group or an acetoxymethyl group.

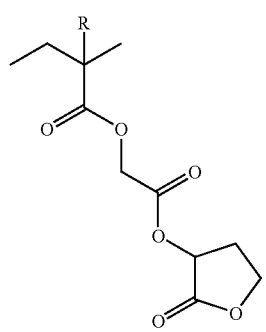

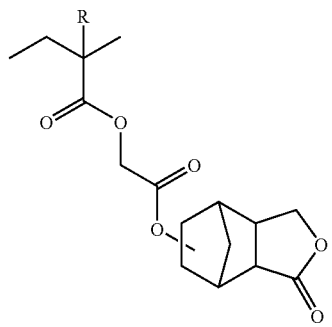

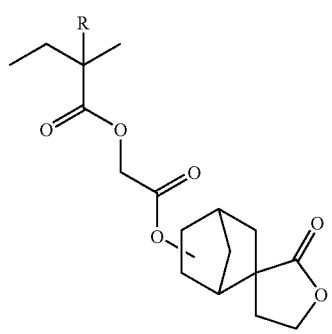

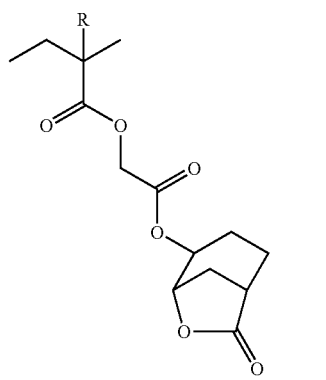

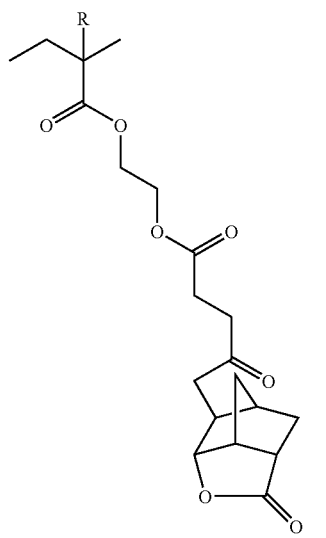

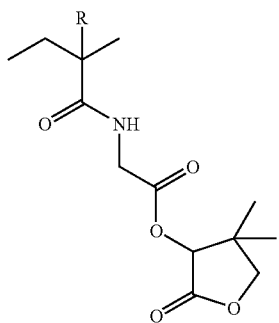
Especially preferred specific examples of the repeating units represented by the general formula (1-1) are as follows.
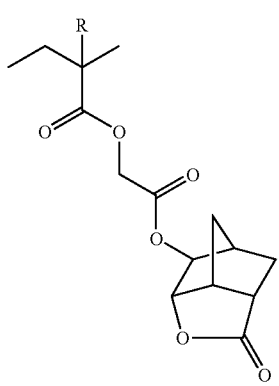
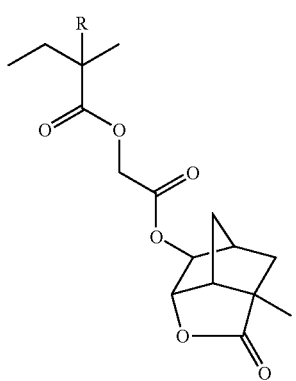
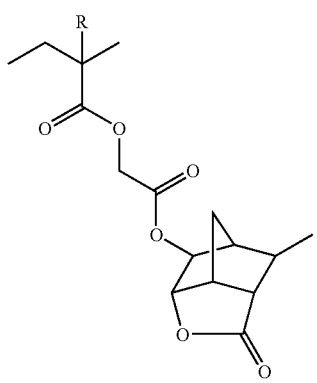
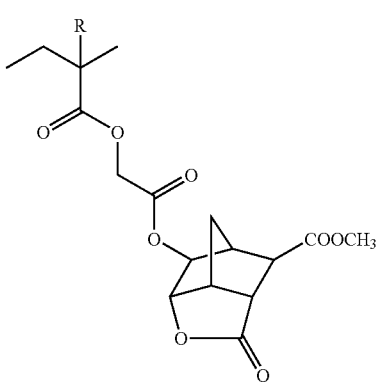
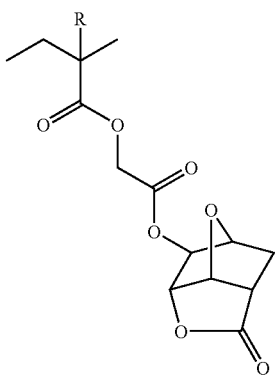
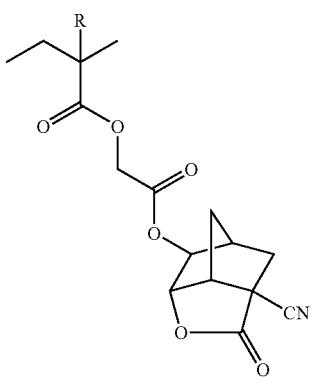
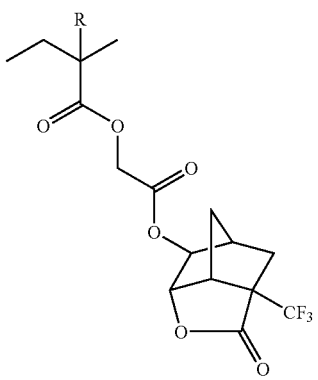

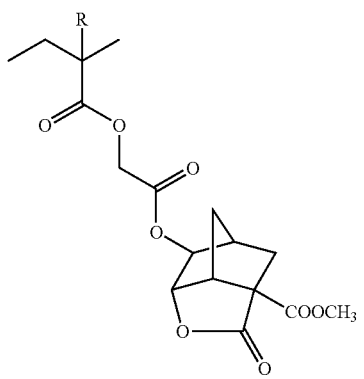
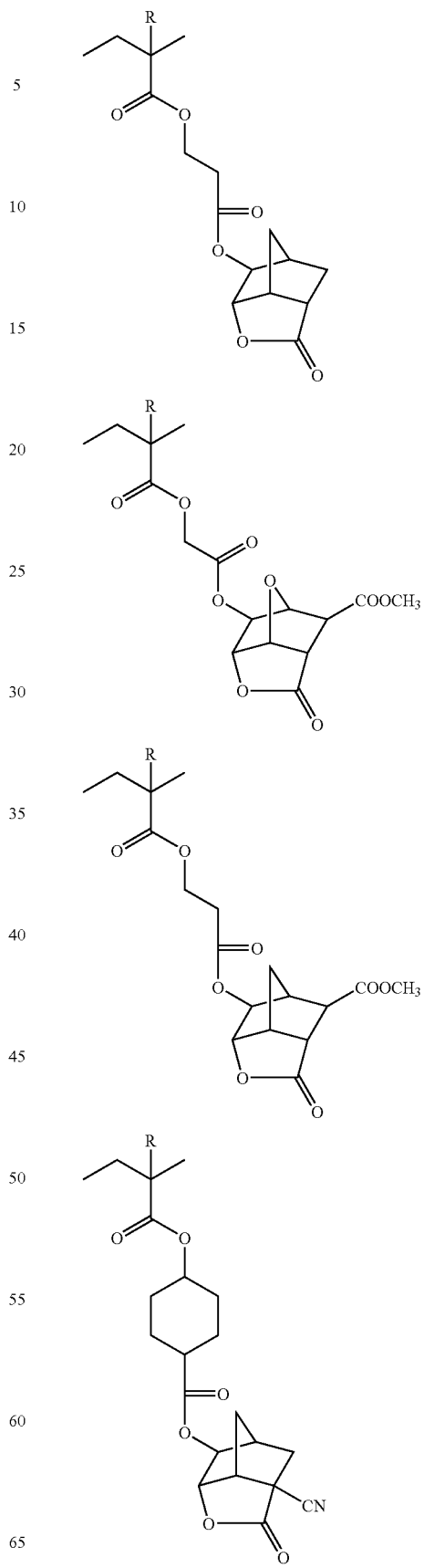

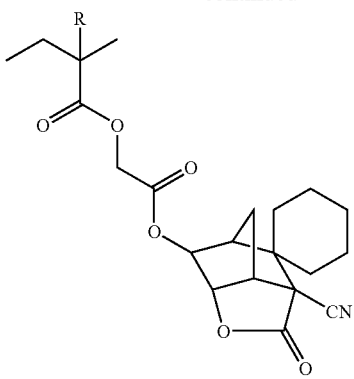

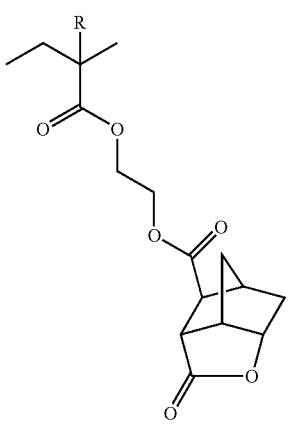

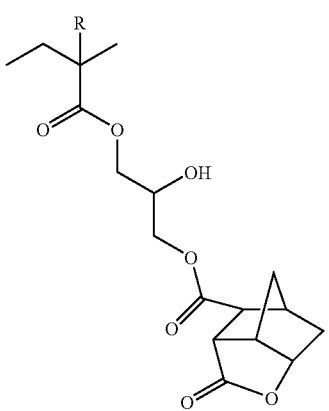

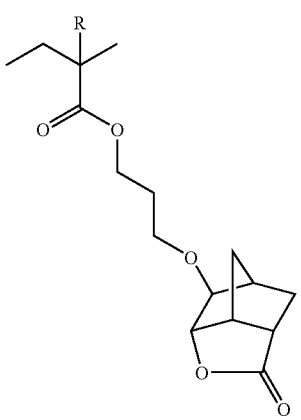

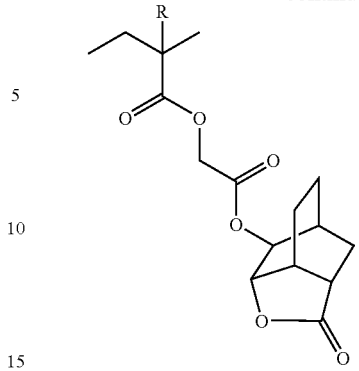

The effects of the present invention can be fully exerted through copolymerization of at least two lactone monomers according to the present invention. Although the reasons therefor has not been elucidated, the use of a single monomer does not ensure full exertion of the effects of the present invention.

The monomer combination for the copolymerization is preferably such that the lactone monomers corresponding to the repeating units represented by the general formula (1) are different from each other in the rate of alkali hydrolysis. Further, it is preferred to select two or more types from the lactone repeating units of the general formula (1) in which n is 1 and make simultaneous use thereof. Preferably, the two or more types of lactone repeating units are obtained by copolymerizing a monomer corresponding to a repeating unit having a substituent at the α-position or β-position of the carbonyl group of the lactone in combination with a monomer corresponding to a repeating unit having no substituent at both the α-position and the β-position of the carbonyl group of the lactone. In particular, it is preferred to combine a repeating unit having an ester group or a cyano group at the α-position or β-position with a repeating unit having no substituent.

As a way to increase the rate of hydrolysis of a lactone repeating unit, introduction of an electron withdrawing group as a substituent of the lactone group ($R_1$ in general formula [1-1]) can be exemplified. As the electron withdrawing group, a cyano group, a nitro group, a carboxy group and an ester group can be exemplified. Preferred electron withdrawing groups includes a cyano group, a nitro group and an ester group. Especially preferred electron withdrawing group is a cyano group. The site at which the electron withdrawing group is introduced is preferably the α-carbon of the carbonyl group of the lactone.

The rate of alkali hydrolysis is that determined by causing a lactone monomer dissolved in an organic solvent to react with an alkali aqueous solution and measuring the rate of consumption by means of high-performance liquid chromatography (HPLC). The experimental procedure is as follows.
(Measuring Conditions for HPLC)
Apparatus: New Shimadzu,
column: Sympack column (ODS),
eluate: acetonitrile/buffer=70/30, 1 ml/min,
buffer: distilled water/phosphoric acid/triethylamine=1000/1/1, and
detection: 254 nm.
(Preparation of Solution)
(A) Anisole Solution (Internal Standard)
1 g of 2,4-dimethylanisole is placed in a 50 ml measuring flask and measured up with acetonitrile.

(B) Lactone Sample Solution 1 mmol of a sample and 2 ml of the anisole solution (A) are placed in a 10-ml measuring flask and measured up with acetonitrile.

(Measurement)

(1) Reference Measurement 0.3 ml of a sample solution and 2.7 ml of acetonitrile are placed in an HPLC sample tube and measured by HPLC.

(2) Sample Measurement (Reaction with Alkali: Evaluation of Hydrolyzability)

0.3 ml of a sample solution and 1.2 ml of acetonitrile are placed in an HPLC sample tube, and 1.5 ml of a pH-10 standard solution is added thereto, gently shaken so as to obtain a homogeneous mixture, and then measured by HPLC.

(3) Sample Measurement (Reaction with Water: Evaluation of Stability)

The procedure of the item (2) above is repeated except that water is used in place of the pH-10 standard solution.

An area ratio between that of the monomer and of the internal standard at the beginning of reaction is set as an base quantity (100%), and the area ratio at each reaction time is divided by the base quantity to give a monomer residual ratio (%). The monomer residual ratio (%) at the lapse of a given time is defined to be the rate of alkali hydrolysis.

Monomer combination in the copolymerization is preferably such that the ratio between relative values of the rate of alkali hydrolysis determined by the calculation method to be described in the Examples below is 1.5 or more. A more preferred monomer combination is such that the ratio is in the range of 2 to 1000.

The resin (A) according to the present invention preferably has a glass transition point within the range of 130° C. to 170° C., more preferably 140° C. to 160° C.

The total content of repeating units represented by the general formula (1) based on all the repeating units of the resin (A) is preferably in the range of 5 to 65 mol %, more preferably 10 to 60 mol %, and still more preferably 15 to 55 mol %. When one of the repeating units represented by general formula (1) is used in combination with another of the repeating units represented by general formula (1), the molar ratio between them is preferably in the range of 90/10 to 10/90, more preferably 80/20 to 20/80, and still more preferably 75/25 to 25/75.

The resin (A) is a resin whose solubility in an alkali developer is increased by the action of an acid, especially a resin provided at its principal chain or side chain or both thereof with a group that is decomposable by the action of an acid to generate an alkali-soluble group (also referred to as an "acid-decomposable group").

As the alkali-soluble group, a phenolic hydroxy group, a carboxy group, a fluoroalcohol group, a sulfonate group, a sulfonamido group, a sulfonylimido group, an (alkylsulfonyl)(alkylcarbonyl)methylene group, an (alkylsulfonyl)(alkylcarbonyl)imido group, a bis(alkylcarbonyl)methylene group, a bis(alkylcarbonyl)imido group, a bis(alkylsulfonyl)methylene group, a bis(alkylsulfonyl)imido group, a tris(alkylcarbonyl)methylene group, and a tris(alkylsulfonyl)methylene group can be exemplified.

As preferred alkali-soluble groups, a carboxy group, a fluoroalcohol group (preferably hexafluoroisopropanol) and a sulfonate group can be exemplified.

The acid-decomposable group is preferably a group as obtained by substituting the hydrogen atom of any of these alkali-soluble groups with an acid-eliminable group.

As the acid-eliminable group, groups represented by —$C(R_{36})(R_{37})(R_{38})$, —$C(R_{36})(R_{37})(OR_{39})$ and —$C(R_{01})(R_{02})(OR_{39})$ can be exemplified.

In the formulae, each of $R_{36}$ to $R_{39}$ independently represents an alkyl group, a cycloalkyl group, an aryl group, an aralkyl group or an alkenyl group. $R_{36}$ and $R_{37}$ may be bonded to each other to form a ring.

Each of $R_{01}$ and $R_{02}$ independently represents a hydrogen atom, an alkyl group, a cycloalkyl group, an aryl group, an aralkyl group or an alkenyl group.

The acid-decomposable group is preferably a cumyl ester group, an enol ester group, an acetal ester group, a tertiary alkyl ester group or the like. Particularly preferred is a tertiary alkyl ester group.

The tertiary alkyl ester group is preferably any of the groups represented by the following general formula.

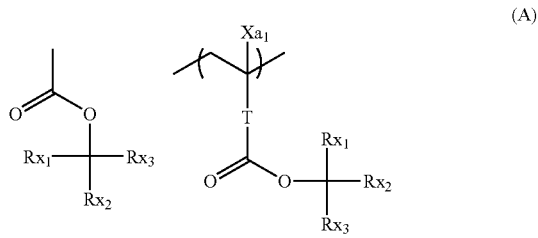

(A)

In general formula (A), $Xa_1$ represents a hydrogen atom, a methyl group, a trifluoromethyl group or a hydroxymethyl group, T represents a single bond or a bivalent connecting group, and each of $Rx_1$ to $Rx_3$ independently represents an alkyl group (linear or branched) or a cycloalkyl group (monocyclic or polycyclic), wherein at least two of $Rx_1$ to $Rx_3$ may be bonded to each other to form a monocyclic or polycyclic alkyl group.

As the bivalent connecting group represented by T, an alkylene group, a group of the formula —COO-Rt-, and a group of the formula —O-Rt- can be exemplified. In the formulae, Rt represents an alkylene group or a cycloalkylene group.

T is preferably a single bond or a group of the formula —COO-Rt-. Rt is preferably an alkylene group having 1 to 5 carbon atoms, more preferably a —$CH_2$— group or —$(CH_2)_3$— group.

The alkyl group represented by each of $Rx_1$ to $Rx_3$ is preferably one having 1 to 4 carbon atoms, such as a methyl group, an ethyl group, an n-propyl group, an isopropyl group, an n-butyl group, an isobutyl group or a t-butyl group.

The cycloalkyl group represented by each of $Rx_1$ to $Rx_3$ is preferably a monocyclic alkyl group such as a cyclopentyl group or a cyclohexyl group, or a polycyclic alkyl group such as a norbornyl group, a tetracyclodecanyl group, a tetracyclododecanyl group or an adamantyl group.

The cycloalkyl group formed by bonding of at least two of $Rx_1$ to $Rx_3$ is preferably a monocyclic alkyl group such as a cyclopentyl group or a cyclohexyl group, or a polycyclic alkyl group such as a norbornyl group, a tetracyclodecanyl group, a tetracyclododecanyl group or an adamantyl group.

As the above tertiary alkyl ester group, it is preferred to use either any of the groups represented by general formula (2-1) below or any of the groups represented by general formula (2-2) below.

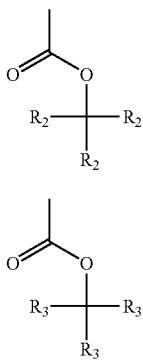

(2-1)

(2-2)

In the general formula (2-1), each of R$_2$s independently represents an optionally substituted alkyl group or an optionally substituted monocyclic alkyl group. At least one of R$_2$s is an optionally substituted monocyclic alkyl group, or provided that all of R$_2$s are alkyl groups, two thereof are bonded to each other to form a monocyclic alkyl group.

In the general formula (2-2), each of R$_3$s independently represents an optionally substituted alkyl group or an optionally substituted polycyclic alkyl group. At least one of R$_3$s is an optionally substituted polycyclic alkyl group, or provided that all of R$_3$s are optionally substituted alkyl groups, two thereof are bonded to each other to form a polycyclic alkyl group.

The alkyl group represented by each of R$_2$ and R$_3$ is preferably one having 1 to 4 carbon atoms, such as a methyl group, an ethyl group, an n-propyl group, an isopropyl group, an n-butyl group, an isobutyl group or a t-butyl group.

The monocyclic alkyl group represented by R$_2$ is preferably a cycloalkyl group having 5 to 8 carbon atoms, such as a cyclopentyl group or a cyclohexyl group, more preferably a cyclopentyl group or a cyclohexyl group.

As the polycyclic alkyl group represented by R$_3$, a norbornyl group, a tetracyclodecanyl group, a tetracyclododecanyl group and an adamantyl group can be exemplified.

From the viewpoint of enhancing the effects of the present invention, it is preferred to simultaneously use two types of acid-decomposable groups each represented by the general formulae (2-1) and (2-2).

The content of repeating units having acid-decomposable groups based on all the repeating units of the resin (A) is preferably in the range of 20 to 60 mol %, more preferably 25 to 55 mol %.

In particular, when the groups respectively represented by the general formulae (2-1) and (2-2) are simultaneously used, each thereof is contained preferably in an amount of 5 to 55 mol % based on all the repeating units.

Specific examples of the repeating units having preferred acid-decomposable groups will be shown below, which however in no way limit the scope of the present invention.

In the specific examples, each of Rx and X$_{a1}$ represents a hydrogen atom, CH$_3$, CF$_3$, or CH$_2$OH. Each of Rxa and Rxb represents an alkyl group having 1 to 4 carbon atoms, respectively. Z represents a substituent containing one or more polar groups. When two or more of Z are present, they are independent from one another. P represents 0 or a positive integer.

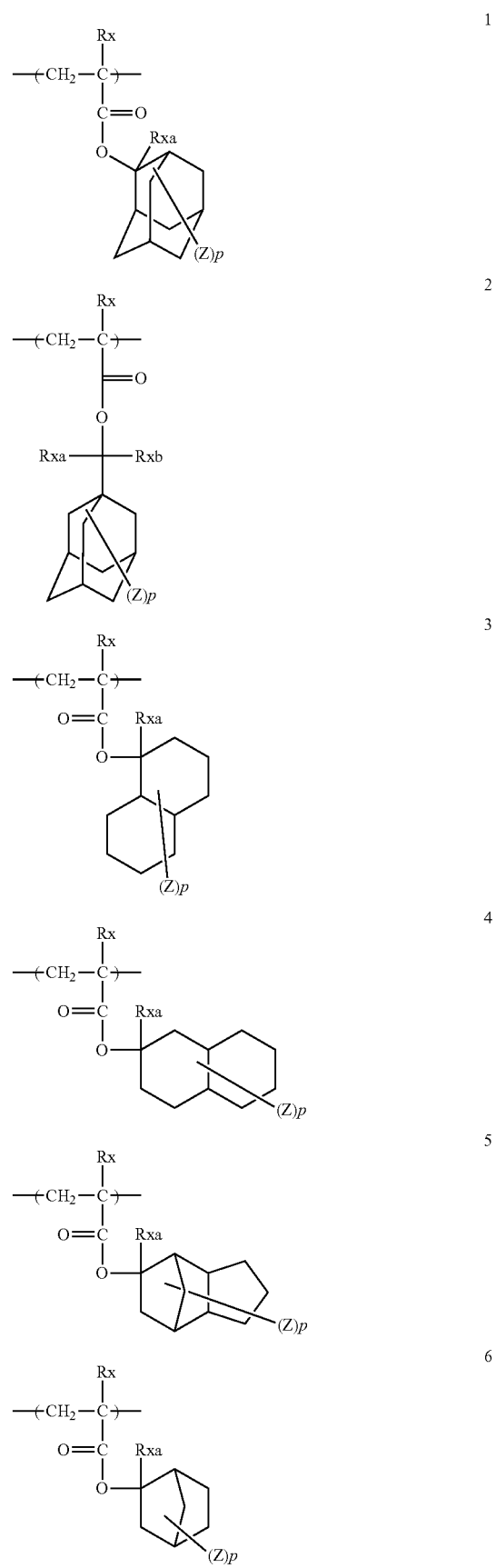

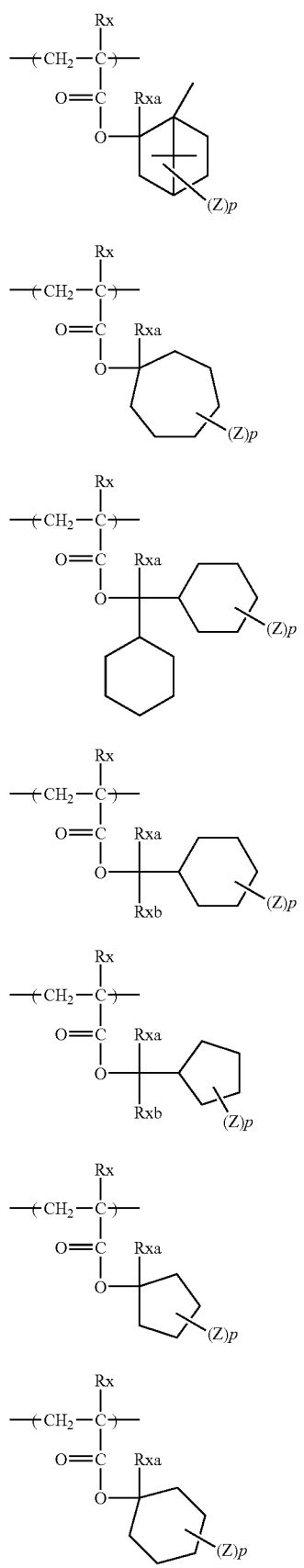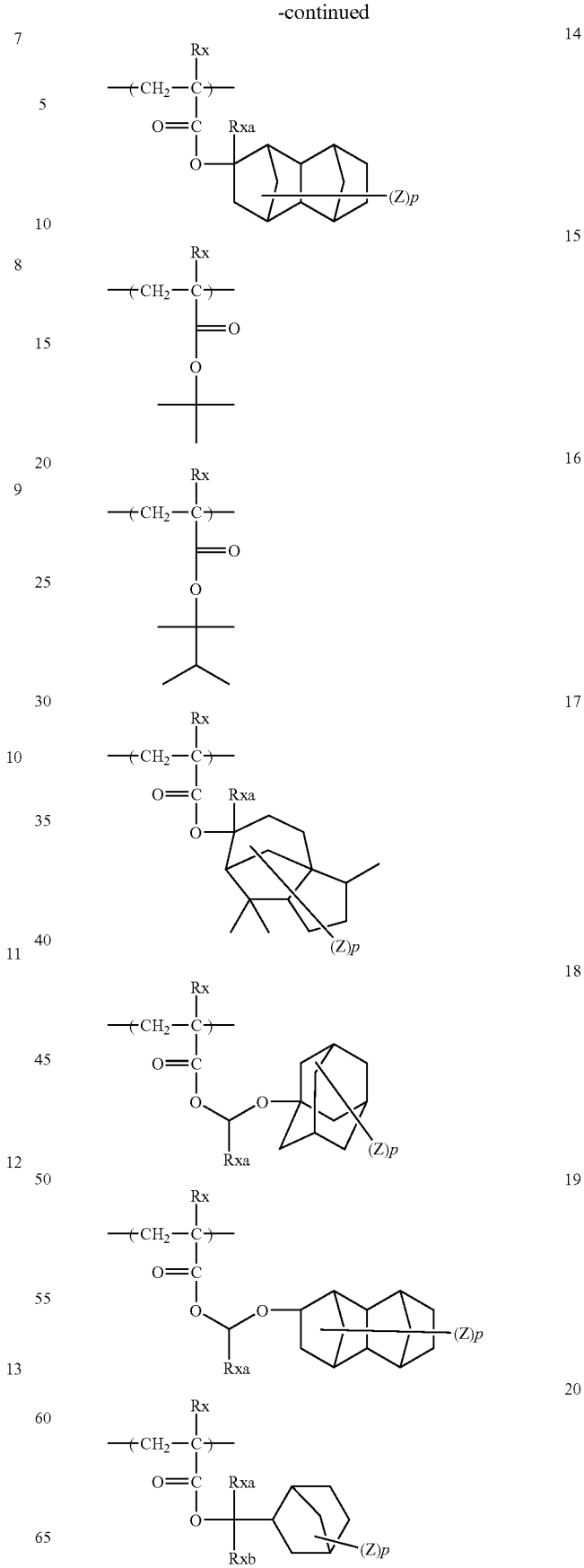

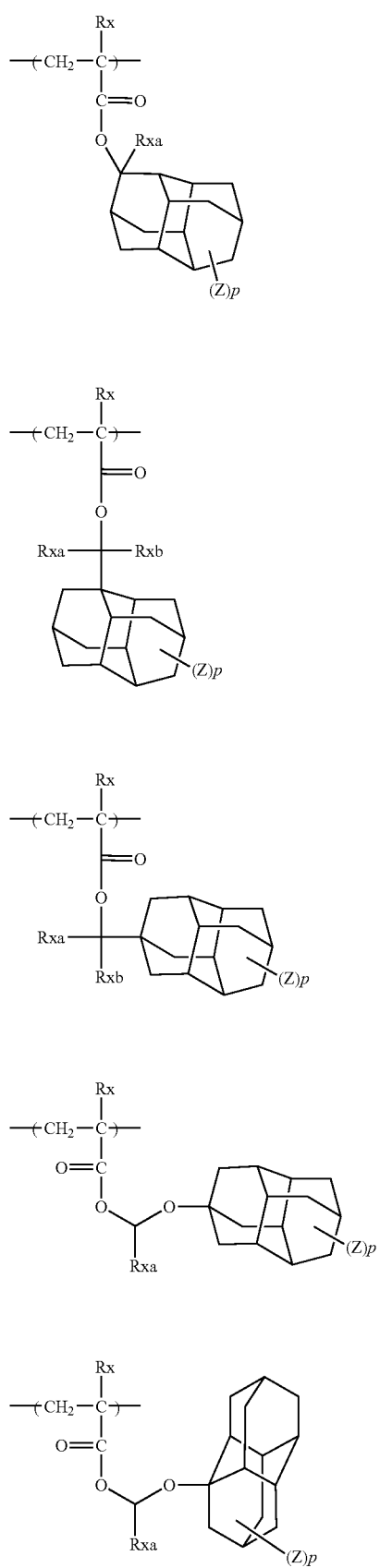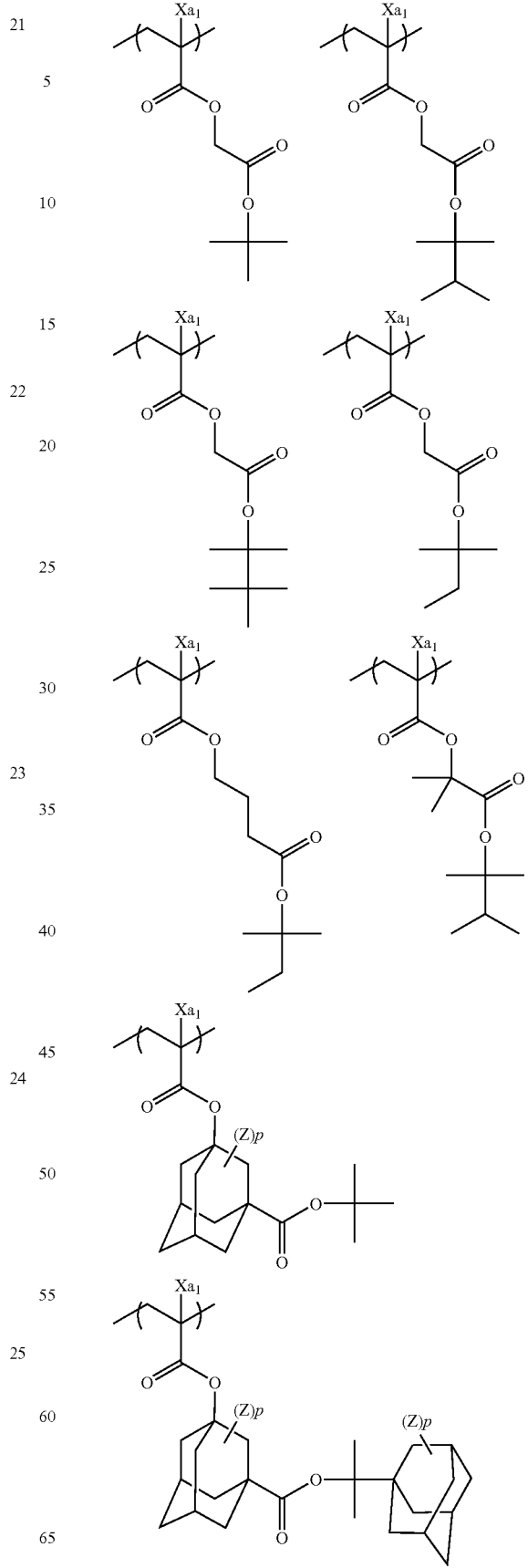

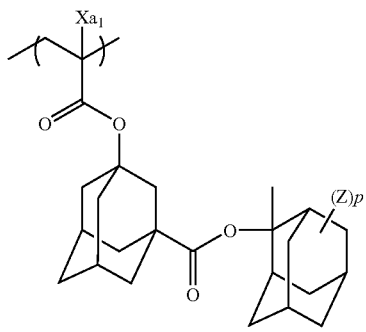
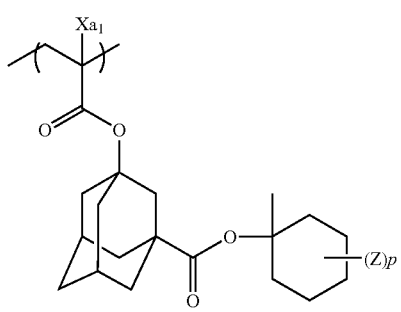
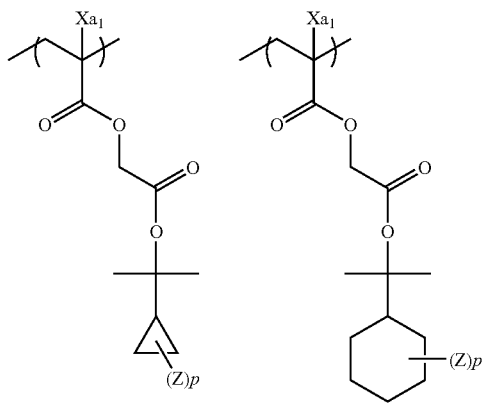
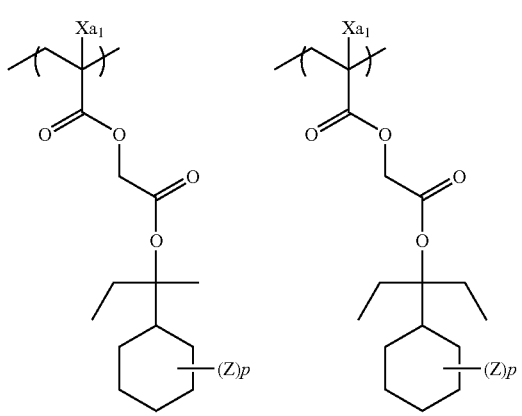
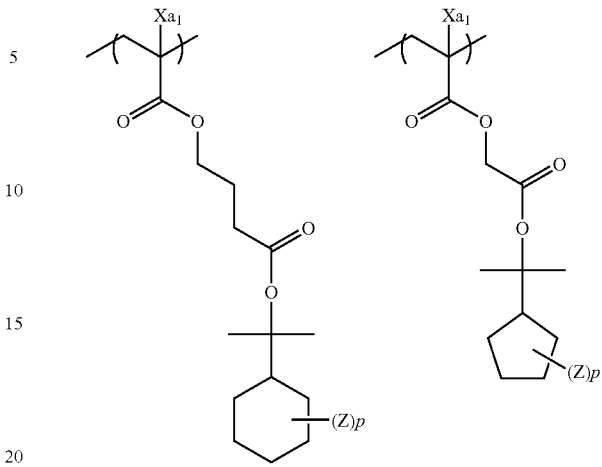
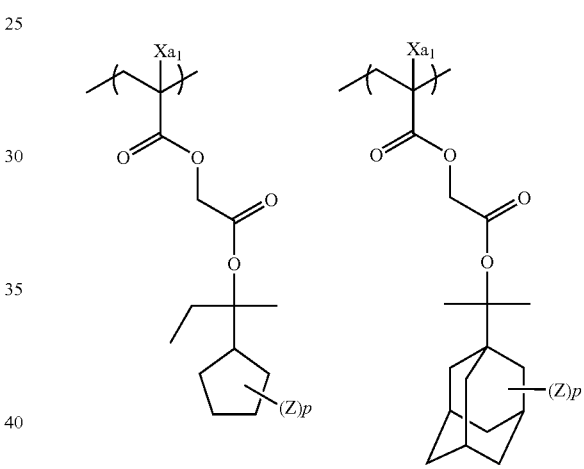
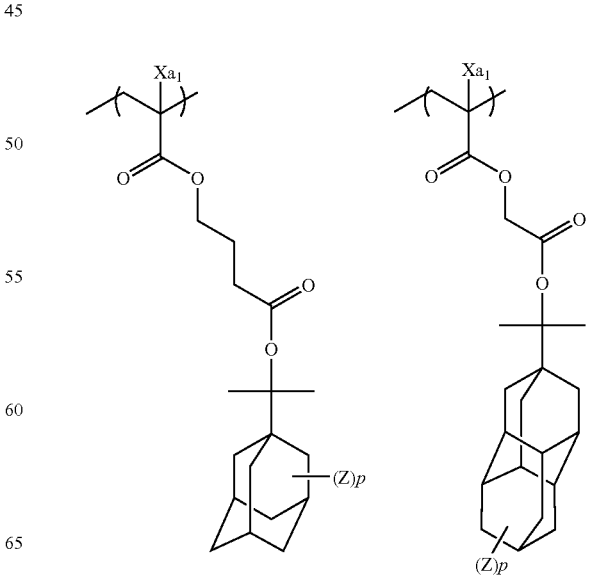

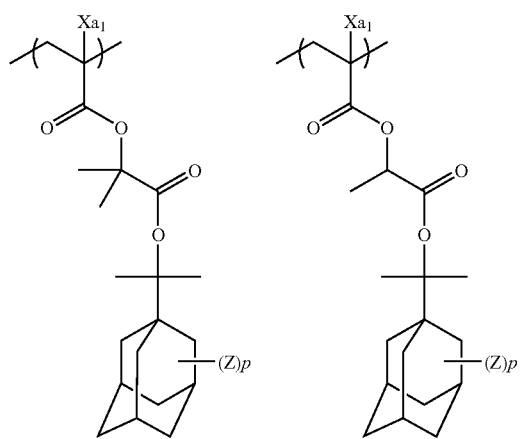
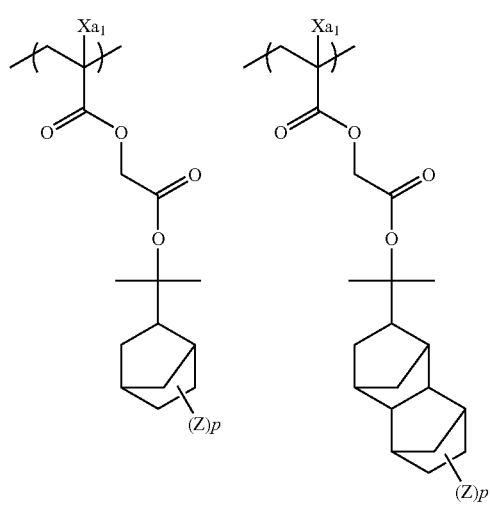
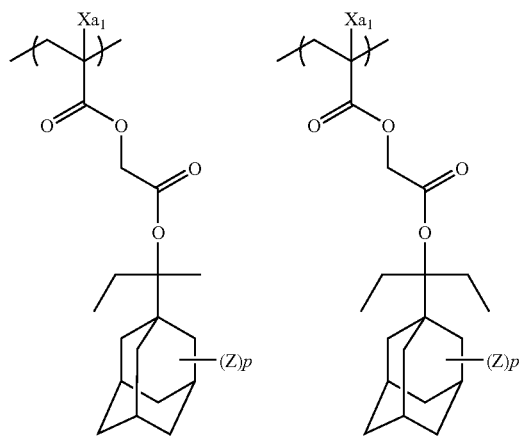
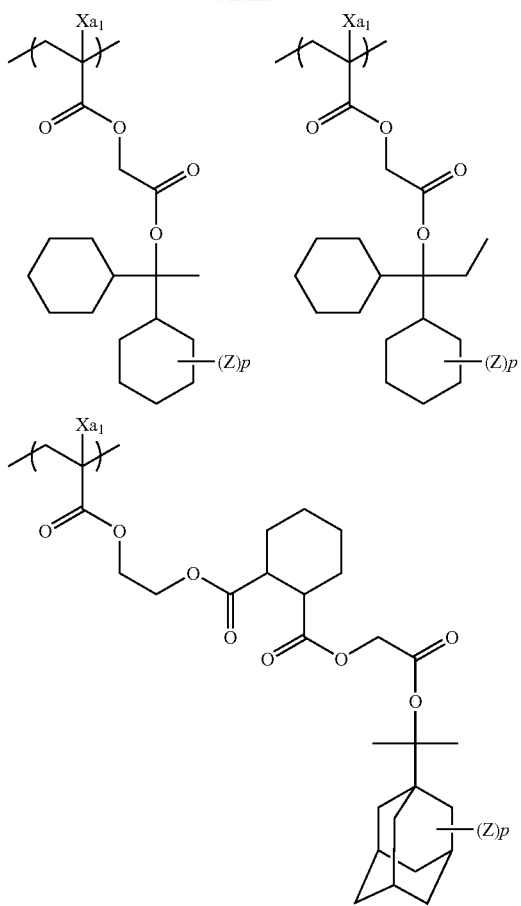
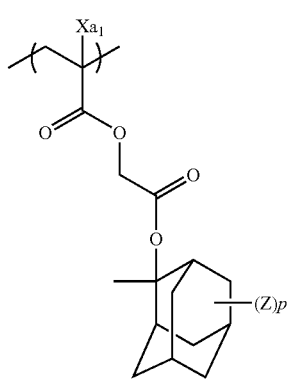
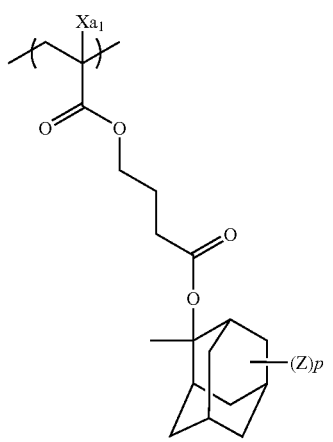

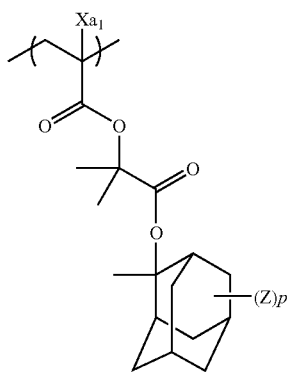
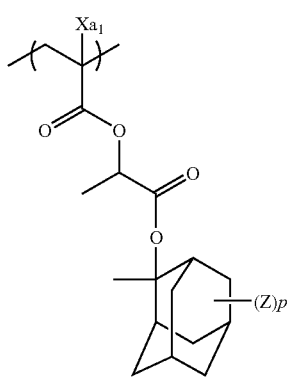
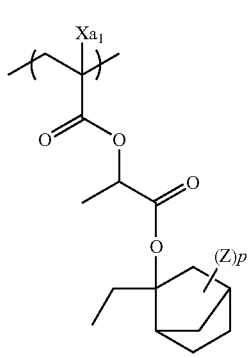
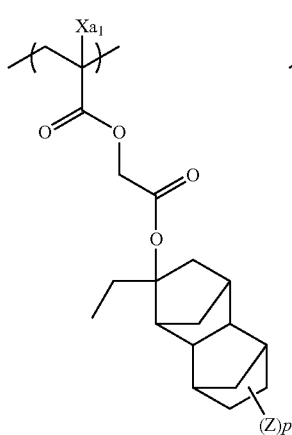
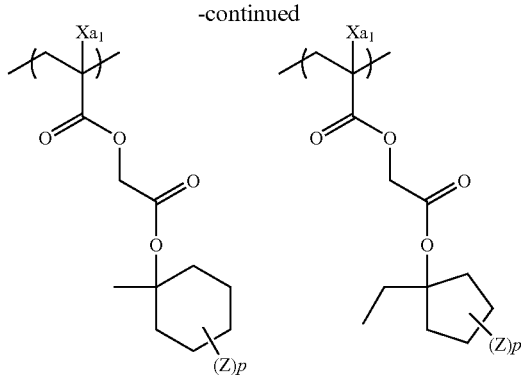
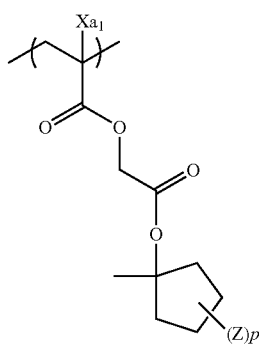
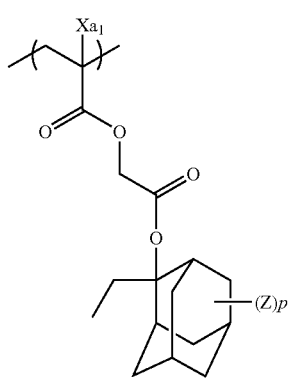
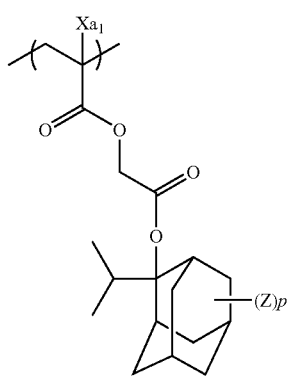
In particular, the following repeating unit with a polycyclic acid-decomposable group is preferred from the viewpoint of improving roughness.

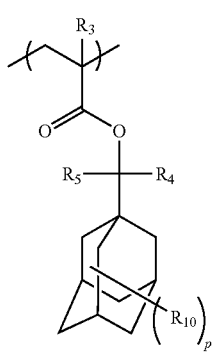
(A-1)

In the formula (A-1),

R$_3$ to R$_5$ have the same meaning as the corresponding groups of the general formula (A).

R$_{10}$ represents a substituent containing a polar group. When two or more R$_{10}$s are introduced, they may be identical to or different from each other. As the substituent containing a polar group, a linear or branched alkyl group or cycloalkyl group having a hydroxyl group, a cyano group, an amino group, an alkylamido group and a sulfonamido group can be exemplified. An alkyl group having a hydroxyl group is preferred. A branched alkyl group having a hydroxyl group is more preferred. An especially preferred branched alkyl group is an isopropyl group.

In the formula, p is an integer of 0 to 15, preferably 0 to 2 and more preferably 0 or 1.

The repeating units represented by the general formula (A-1) are preferably those shown below.

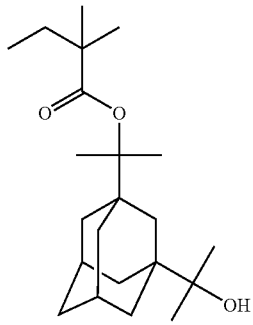

Preferably, the resin (A) further contains a repeating unit having a hydroxy group or a cyano group other than that represented by the general formula (1) and (A). The containment of this repeating unit would realize enhancements of adhesion to substrate and developer affinity. The repeating unit having a hydroxy group or a cyano group is preferably a repeating unit having an alicyclic hydrocarbon structure substituted with a hydroxy group or a cyano group. Further, the repeating unit having a hydroxy group or a cyano group is preferably free from the acid-decomposable group. In the alicyclic hydrocarbon structure substituted with a hydroxy group or a cyano group, the alicyclic hydrocarbon structure preferably consists of an adamantyl group, a diamantyl group or a norbornane group. As preferred alicyclic hydrocarbon structures substituted with a hydroxy group or a cyano group, the partial structures represented by the following general formulae (VIIa) to (VIId) can be exemplified.

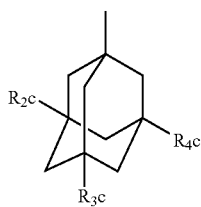
(VIIa)

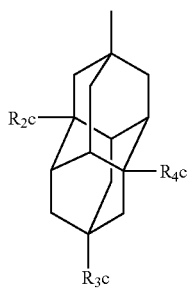
(VIIb)

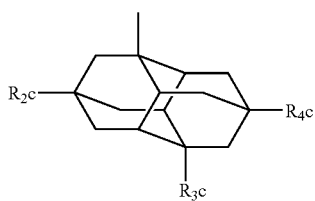
(VIIc)

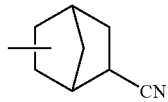
(VIId)

In the general formulae (VIIa) to (VIIc), each of R$_2$c to R$_4$c independently represents a hydrogen atom, a hydroxy group or a cyano group, with the proviso that at least one of the R$_2$c to R$_4$c represents a hydroxy group or a cyano group. Preferably, one or two of the R$_2$c to R$_4$c are hydroxy groups and the remainder is a hydrogen atom. In the general formula (VIIa), more preferably, two of the R$_2$c to R$_4$c are hydroxy groups and the remainder is a hydrogen atom.

As the repeating units having any of the partial structures represented by the general formulae (VIIa) to (VIId), those of the following general formulae (AIIa) to (AIId) can be exemplified.

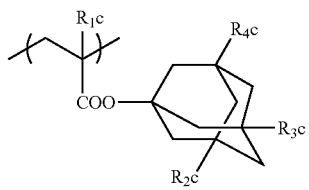
(AIIa)

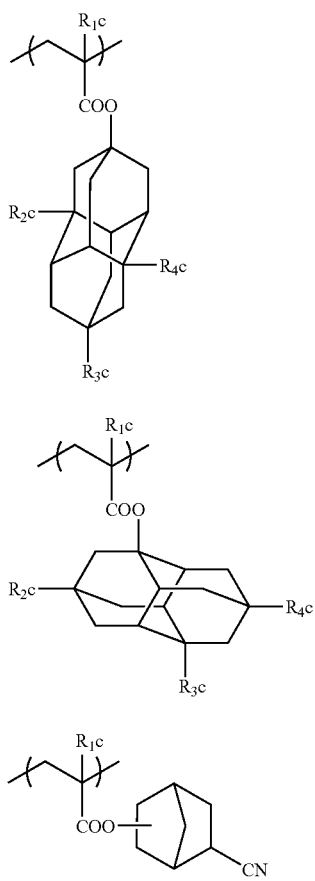

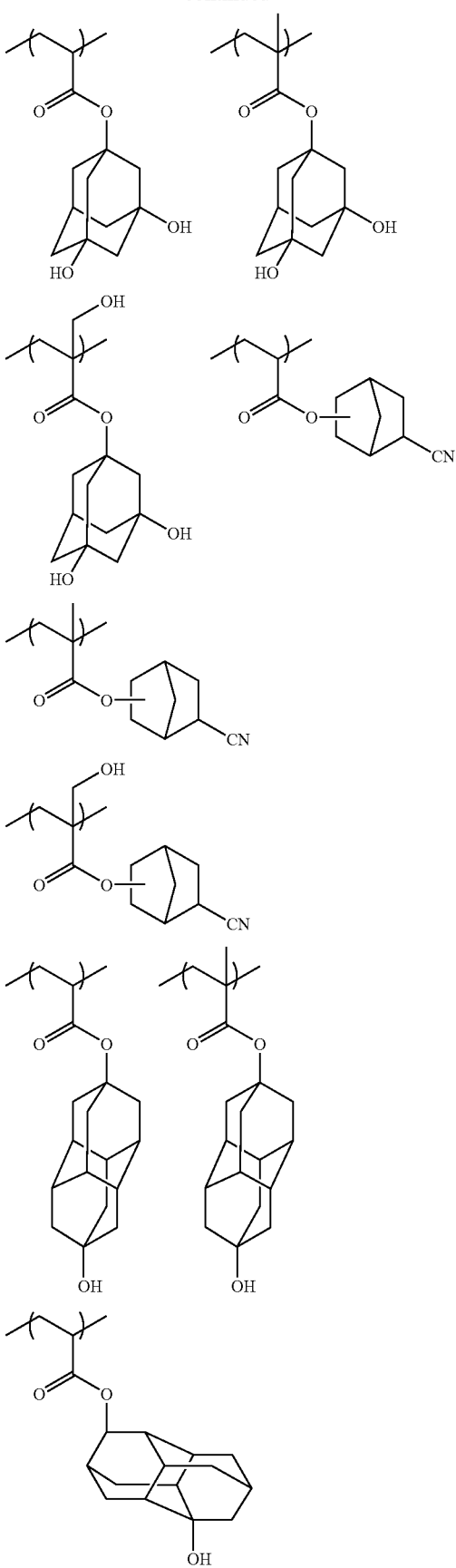

In the general formulae (AIIa) to (AIId), $R_1c$ represents a hydrogen atom, a methyl group, a trifluoromethyl group or a hydroxymethyl group.

$R_2c$ to $R_4c$ have the same meaning as those of the general formulae (VIIa) to (VIIc).

The content of repeating units having an alicyclic hydrocarbon structure substituted with a hydroxy group or a cyano group based on all the repeating units of the resin (A) is preferably in the range of 1 to 30 mol %, more preferably 3 to 28 mol % and still more preferably 5 to 25 mol %.

Specific examples of the repeating units having a hydroxy group or a cyano group will be shown below, which however in no way limit the scope of the present invention.

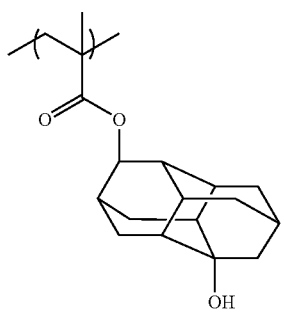

The resin as the component (A) preferably contain a repeating unit having an alkali-soluble group. As the alkali-soluble group, a carboxy group, a sulfonamido group, a sulfonylimido group, a bisulfonylimido group and an aliphatic alcohol substituted at its α-position with an electron-withdrawing group (for example, a hexafluoroisopropanol group) can be exemplified. The possession of a repeating unit having a carboxy group is more preferred. The incorporation of the repeating unit having an alkali-soluble group would increase the resolving power in contact hole usage. The repeating unit having an alkali-soluble group is preferably any of a repeating unit wherein the alkali-soluble group is directly bonded to the principal chain of a resin such as a repeating unit of acrylic acid or methacrylic acid, a repeating unit wherein the alkali-soluble group is bonded via a connecting group to the principal chain of a resin, and a repeating unit wherein the alkali-soluble group is introduced in a terminal or termini of a polymer chain by the use of a chain transfer agent or polymerization initiator having the alkali-soluble group in the stage of polymerization. The connecting group may have a monocyclic or polycyclic hydrocarbon structure. Especially preferred is the repeating unit of acrylic acid or methacrylic acid.

The content of the repeating unit having an alkali-soluble group based on all the repeating units of the resin (A) is preferably equal to or lower than 25 mol %, more preferably equal to or lower than 20 mol %, and still more preferably in the range of 1 to 15 mol %. Specific examples of the repeating units having an alkali-soluble group will be shown below, which however in no way limit the scope of the present invention. In the specific examples, Rx represents H, $CH_3$, $CF_3$ or $CH_2OH$.

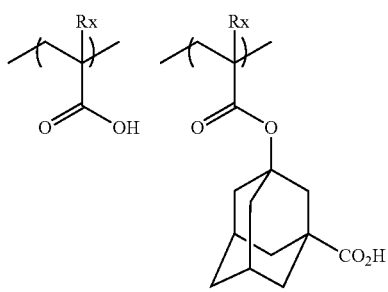

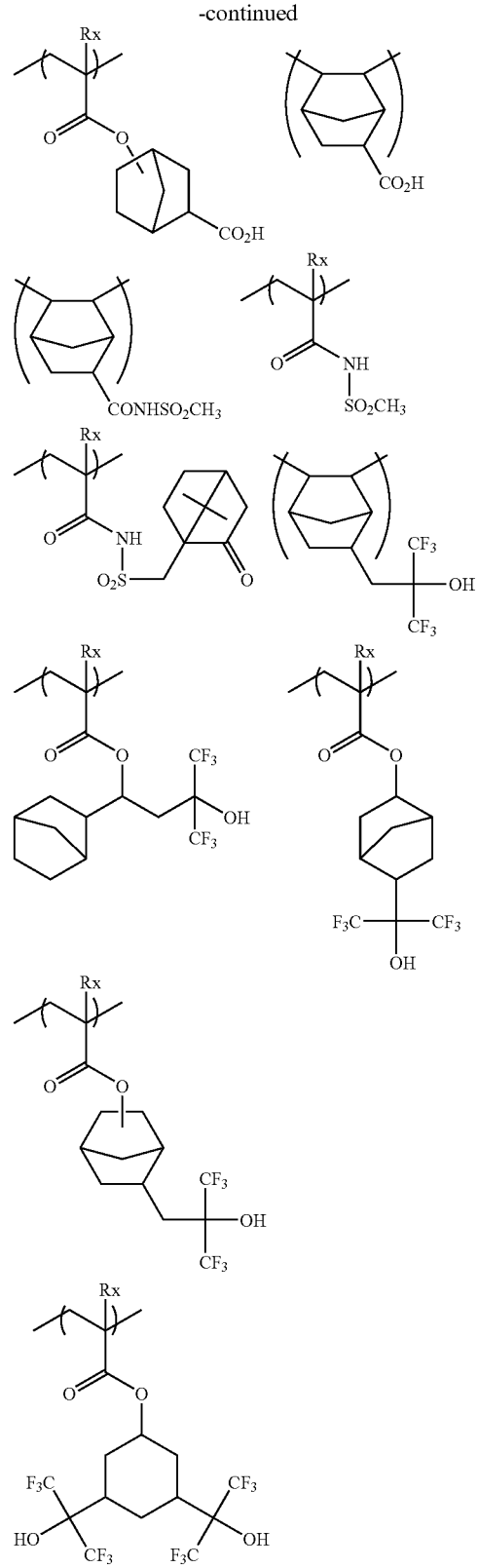

It is preferred for the resin (A) for use in the present invention to further have a repeating unit that has an alicyclic hydrocarbon structure having no polar group and does not exhibit any acid decomposability. Having this repeating unit would reduce the leaching of low-molecular components from the film into a liquid for liquid immersion at the time of liquid immersion exposure. As such a repeating unit, any of the repeating units represented by general formula (4) below can be exemplified.

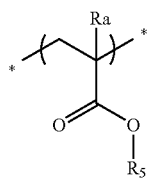

(4)

In the general formula (4), $R_5$ represents a hydrocarbon group having at least one cyclic structure in which neither a hydroxyl group nor a cyano group is contained.

Ra represents a hydrogen atom, an alkyl group or a group of the formula —$CH_2$—O—$Ra_2$ in which $Ra_2$ represents a hydrogen atom, an alkyl group or an acyl group. Ra is preferably a hydrogen atom, a methyl group, a hydroxymethyl group or a trifluoromethyl group, further preferably a hydrogen atom or a methyl group.

The cyclic structures contained in $R_5$ include a monocyclic hydrocarbon group and a polycyclic hydrocarbon group. As the monocyclic hydrocarbon group, a cycloalkyl group having 3 to 12 carbon atoms and a cycloalkenyl group having 3 to 12 carbon atoms can be exemplified. Preferably, the monocyclic hydrocarbon group is a monocyclic hydrocarbon group having 3 to 7 carbon atoms.

The polycyclic hydrocarbon groups include ring-assembly hydrocarbon groups and crosslinked-ring hydrocarbon groups. As crosslinked-ring hydrocarbon rings, bicyclic hydrocarbon rings, tricyclic hydrocarbon rings, and tetracyclic hydrocarbon rings can be exemplified. Further, the crosslinked-ring hydrocarbon rings include condensed-ring hydrocarbon rings (for example, condensed rings resulting from condensation of multiple 5- to 8-membered cycloalkanes). As preferred crosslinked-ring hydrocarbon rings, a norbornyl group and an adamantyl group can be exemplified.

These alicyclic hydrocarbon groups may have substituents. As preferred substituents, a halogen atom, an alkyl group, a hydroxyl group protected by a protective group, and an amino group protected by a protective group can be exemplified. The halogen atom is preferably a bromine, chlorine or fluorine atom, and the alkyl group is preferably a methyl, ethyl, butyl or t-butyl group. The alkyl group may further have a substituent. As the optional substituent, a halogen atom, an alkyl group, a hydroxyl group protected by a protective group, and an amino group protected by a protective group can be exemplified.

As the protective group, an alkyl group, a cycloalkyl group, an aralkyl group, a substituted methyl group, a substituted ethyl group, an alkoxycarbonyl group and an aralkyloxycarbonyl group can be exemplified. Preferred alkyl groups include alkyl groups having 1 to 4 carbon atoms. Preferred substituted methyl groups include methoxymethyl, methoxythiomethyl, benzyloxymethyl, t-butoxymethyl and 2-methoxyethoxymethyl groups. Preferred substituted ethyl groups include 1-ethoxyethyl and 1-methyl-1-methoxyethyl groups. Preferred acyl groups include aliphatic acyl groups having 1 to 6 carbon atoms, such as formyl, acetyl, propionyl, butyryl, isobutyryl, valeryl and pivaloyl groups. Preferred alkoxycarbonyl groups include alkoxycarbonyl groups having 1 to 4 carbon atoms and the like.

The content of repeating unit that has an alicyclic hydrocarbon structure having no polar group and does not exhibit any acid decomposability, based on all the repeating units of the resin (A), is preferably in the range of 0 to 40 mol %, more preferably 0 to 20 mol %.

Specific examples of the repeating units that have an alicyclic hydrocarbon structure having no polar group and do not exhibit any acid decomposability will be shown, which however in no way limit the scope of the present invention. In the formulae, Ra represents H, $CH_3$, $CH_2OH$ or $CF_3$.

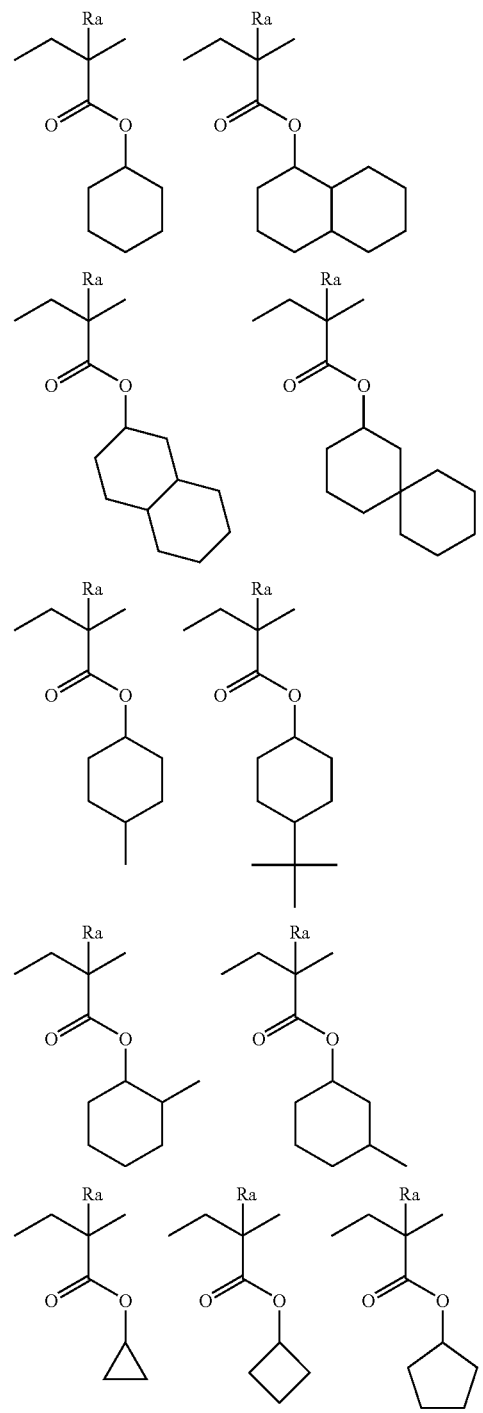

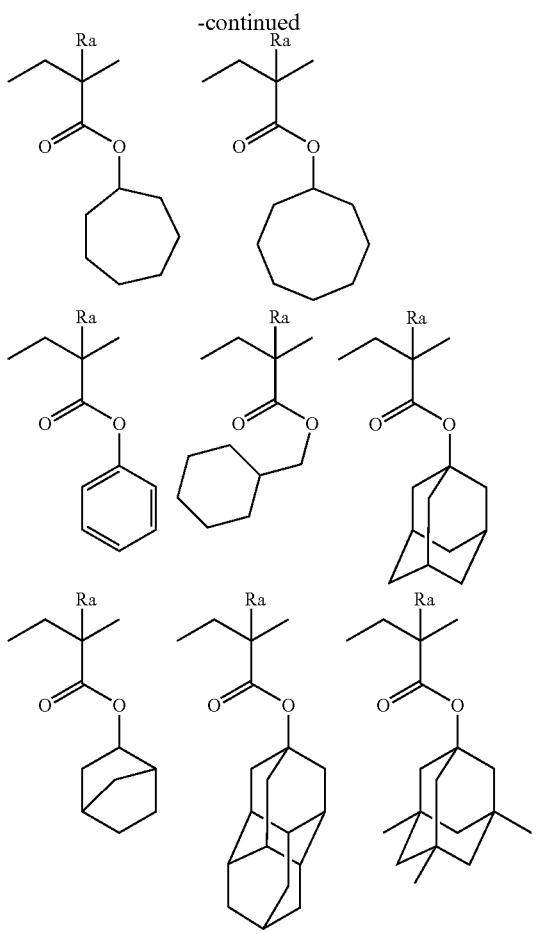

The resin for use in the actinic ray-sensitive or radiation-sensitive resin composition of the present invention may have various repeating structural units other than the foregoing repeating structural units for the purpose of regulating the dry etching resistance, standard developer adaptability, substrate adhesion, resist profile and generally required properties of resists such as resolving power, heat resistance and sensitivity.

As such other repeating structural units, those corresponding to the following monomers can be exemplified, which however are nonlimiting.

Such other repeating structural units would permit fine regulation of the properties required to have by the resin for use in the composition of the present invention, especially, (1) solubility in applied solvents, (2) film forming easiness (glass transition temperature), (3) alkali developability, (4) film thinning (selection of hydrophilicity/hydrophobicity and alkali-soluble group), (5) adhesion of unexposed areas to substrate, (6) dry etching resistance, etc.

As the above-mentioned monomers, compounds having an unsaturated bond capable of addition polymerization, selected from among acrylic esters, methacrylic esters, acrylamides, methacrylamides, allyl compounds, vinyl ethers, vinyl esters and the like can be exemplified.

In addition, any unsaturated compound capable of addition polymerization that is copolymerizable with any of the monomers corresponding to the above various repeating structural units may be copolymerized therewith.

The molar ratios of individual repeating structural units contained in the resin (A) for use in the composition of the present invention are appropriately determined from the viewpoint of regulation of not only the resist dry etching resistance but also the standard developer adaptability, substrate adhesion, resist profile and generally required properties of resists such as resolving power, heat resistance and sensitivity.

When the composition of the present invention is one for ArF exposure, it is preferred for the resin (A) for use in the composition of the present invention to have no aromatic group from the viewpoint of transparency in ArF beams.

Further, it is preferred for the resin (A) not to contain a fluorine atom and a silicon atom from the viewpoint of compatibility with a hydrophobic resin (HR) to be described hereinbelow.

The resin (A) can be synthesized by conventional techniques (for example, by radical polymerization). As general synthetic methods, a batch polymerization method in which a monomer species and an initiator are dissolved in a solvent and heated so as to accomplish polymerization, and a dropping polymerization method in which a solution of monomer species and initiator is added by dropping to a heated solvent over a period of 1 to 10 hours can be exemplified and preferred is the dropping polymerization method. As a reaction solvent, an ether, such as tetrahydrofuran, 1,4-dioxane or diisopropyl ether; a ketone, such as methyl ethyl ketone or methyl isobutyl ketone; an ester solvent, such as ethyl acetate; an amide solvent, such as dimethylformamide or dimethylacetamide; and the later described solvent capable of dissolving the composition of the present invention, such as propylene glycol monomethyl ether acetate, propylene glycol monomethyl ether or cyclohexanone can be exemplified. It is preferred to perform the polymerization with the use of the same solvent as employed in the actinic ray-sensitive or radiation-sensitive resin composition according to the present invention. This would inhibit particle generation during storage.

The polymerization reaction is preferably carried out in an atmosphere of inert gas, such as nitrogen or argon. The polymerization is initiated by the use of a commercially available radical initiator (azo initiator, peroxide, etc.) as a polymerization initiator. Among the radical initiators, an azo initiator is preferred. An azo initiator having an ester group, a cyano group or a carboxy group is especially preferred. As preferred initiators, azobisisobutyronitrile, azobisdimethylvaleronitrile, and dimethyl 2,2'-azobis(2-methylpropionate) can be exemplified. According to necessity, a supplementation of initiator or divided addition thereof may be effected. After the completion of the reaction, the reaction mixture is poured into a solvent. The desired polymer is recovered by a method for powder or solid recovery, etc. The concentration during the reaction is in the range of 5 to 50 mass %, preferably 10 to 30 mass %. The reaction temperature is generally in the range of 10° C. to 150° C., preferably 30° C. to 120° C., and more preferably 60° C. to 100° C.

The weight average molecular weight of the resin (A) in terms of polystyrene molecular weight as measured by GPC is preferably in the range of 1,000 to 200,000, more preferably 2,000 to 20,000, still more preferably 3,000 to 15,000, and further preferably 3,000 to 10,000. The regulation of the weight average molecular weight to 1,000 to 200,000 would prevent deteriorations of heat resistance and dry etching resistance and also prevent deterioration of developability and increase of viscosity leading to poor film forming property.

Use is made of the resin whose degree of dispersal (molecular weight distribution) is generally in the range of 1 to 3, preferably 1 to 2.6, more preferably 1 to 2, and most preferably 1.4 to 1.7. The lower the molecular weight distribution, the more excellent the resolving power and resist profile and the smoother the side wall of the resist pattern leading to an excellence in roughness.

The content of the resin (A) in the actinic ray-sensitive or radiation-sensitive resin composition according to the present invention based on the total solids thereof is preferably in the range of 50 to 99 mass %, more preferably 60 to 95 mass %.

In the present invention, either solely one of the resins or a combination of two or more thereof may be used as the component (A).

[2] Compound (B) that generates an acid when exposed to actinic rays or radiation:

The actinic ray-sensitive or radiation-sensitive resin composition according to the present invention contains a compound that generates an acid when exposed to actinic rays or radiation (hereinafter also referred to as "acid generator").

As the acid generator, use can be made of a member appropriately selected from among a photoinitiator for photocationic polymerization, a photoinitiator for photoradical polymerization, a photo-achromatic agent and photo-discoloring agent for dyes, any of publicly known compounds that generate an acid when exposed to actinic rays or radiation employed in microresists, etc., and mixtures thereof.

As the acid generator, a diazonium salt, a phosphonium salt, a sulfonium salt, an iodonium salt, an imide sulfonate, an oxime sulfonate, diazosulfone, disulfone and o-nitrobenzyl sulfonate can be exemplified.

Further, use can be made of compounds obtained by introducing any of the above groups or compounds that generate an acid when exposed to actinic rays or radiation in a polymer principal chain or side chain, for example, compounds described in U.S. Pat. No. 3,849,137, DE 3914407, JP-A's-63-26653, 55-164824, 62-69263, 63-146038, 63-163452, 62-153853, 63-146029, etc.

Furthermore, use can be made of compounds that generate an acid when exposed to light described in U.S. Pat. No. 3,779,778, EP 126,712, etc.

As preferred compounds among the acid generators, those represented by the following general formulae ZI, ZII and ZIII can be exemplified.

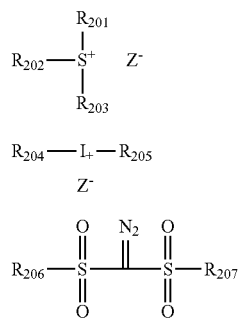

In the above general formula ZI, each of $R_{201}$, $R_{202}$ and $R_{203}$ independently represents an organic group.

The number of carbon atoms in the organic group represented by $R_{201}$, $R_{202}$ and $R_{203}$ is generally in the range of 1 to 30, preferably 1 to 20.

Two of $R_{201}$ to $R_{203}$ may be bonded to each other to form a ring, and the ring within the same may contain an oxygen atom, a sulfur atom, an ester bond, an amido bond or a carbonyl group. As the group formed by bonding of two of $R_{201}$ to $R_{203}$, an alkylene group (for example, a butylene group or a pentylene group) can be exemplified.

$Z^-$ represents a nonnucleophilic anion.

As the nonnucleophilic anion represented by $Z^-$, a sulfonate anion, a carboxylate anion, a sulfonylimido anion, a bis(alkylsulfonyl)imido anion, and a tris(alkylsulfonyl)methyl anion can be exemplified.

The nonnucleophilic anion means an anion whose capability of inducing a nucleophilic reaction is extremely low and is an anion capable of inhibiting any temporal decomposition by intramolecular nucleophilic reaction. This would realize an enhancement of the temporal stability of the resist.

As the sulfonate anion, an aliphatic sulfonate anion, an aromatic sulfonate anion, and a camphor sulfonate anion can be exemplified.

As the carboxylate anion, an aliphatic carboxylate anion, an aromatic carboxylate anion, and an aralkyl carboxylate anion can be exemplified.

The aliphatic moiety of the aliphatic sulfonate anion may be an alkyl group or a cycloalkyl group, being preferably an alkyl group having 1 to 30 carbon atoms or a cycloalkyl group having 3 to 30 carbon atoms. As such, a methyl group, an ethyl group, a propyl group, an isopropyl group, an n-butyl group, an isobutyl group, a sec-butyl group, a pentyl group, a neopentyl group, a hexyl group, a heptyl group, an octyl group, a nonyl group, a decyl group, an undecyl group, a dodecyl group, a tridecyl group, a tetradecyl group, a pentadecyl group, a hexadecyl group, a heptadecyl group, an octadecyl group, a nonadecyl group, an eicosyl group, a cyclopropyl group, a cyclopentyl group, a cyclohexyl group, an adamantyl group, a norbornyl group and a boronyl group can be exemplified.

As a preferred aromatic group of the aromatic sulfonate anion, an aryl group having 6 to 14 carbon atoms, such as a phenyl group, a tolyl group and a naphthyl group can be exemplified. The alkyl group, cycloalkyl group and aryl group of the aliphatic sulfonate anion and aromatic sulfonate anion may have a substituent. As the substituent of the alkyl group, cycloalkyl group and aryl group of the aliphatic sulfonate anion and aromatic sulfonate anion, a nitro group, a halogen atom (fluorine atom, chlorine atom, bromine atom or iodine atom), a carboxy group, a hydroxy group, an amino group, a cyano group, an alkoxy group (preferably having 1 to 15 carbon atoms), a cycloalkyl group (preferably having 3 to 15 carbon atoms), an aryl group (preferably having 6 to 14 carbon atoms), an alkoxycarbonyl group (preferably having 2 to 7 carbon atoms), an acyl group (preferably having 2 to 12 carbon atoms), an alkoxycarbonyloxy group (preferably having 2 to 7 carbon atoms), an alkylthio group (preferably having 1 to 15 carbon atoms), an alkylsulfonyl group (preferably having 1 to 15 carbon atoms), an alkyliminosulfonyl group (preferably having 2 to 15 carbon atoms), an aryloxysulfonyl group (preferably having 6 to 20 carbon atoms), an alkylaryloxysulfonyl group (preferably having 7 to 20 carbon atoms), a cycloalkylaryloxysulfonyl group (preferably having 10 to 20 carbon atoms), an alkyloxyalkyloxy group (preferably having 5 to 20 carbon atoms), and a cycloalkylalkyloxyalkyloxy group (preferably having 8 to 20 carbon atoms) can be exemplified. The aryl group or ring structure of these groups may further have an alkyl group (preferably having 1 to 15 carbon atoms) as its substituent.

As the aliphatic moiety of the aliphatic carboxylate anion, the same alkyl groups and cycloalkyl groups as mentioned with respect to the aliphatic sulfonate anion can be exemplified.

As the aromatic group of the aromatic carboxylate anion, the same aryl groups as mentioned with respect to the aromatic sulfonate anion can be exemplified.

As a preferred aralkyl group of the aralkyl carboxylate anion, an aralkyl group having 6 to 12 carbon atoms, such as a benzyl group, a phenethyl group, a naphthylmethyl group, a naphthylethyl group, and a naphthylbutyl group can be exemplified.

The alkyl group, cycloalkyl group, aryl group and aralkyl group of the aliphatic carboxylate anion, aromatic carboxylate anion and aralkyl carboxylate anion may have a substituent. As the substituent of the alkyl group, cycloalkyl group, aryl group and aralkyl group of the aliphatic carboxylate anion, aromatic carboxylate anion and aralkyl carboxylate anion, the same halogen atom, alkyl group, cycloalkyl group, alkoxy group, and alkylthio group, etc. as mentioned with respect to the aromatic sulfonate anion can be exemplified.

As the sulfonylimido anion, a saccharin anion can be exemplified.

The alkyl group of the bis(alkylsulfonyl)imido anion and tris(alkylsulfonyl)methyl anion is preferably an alkyl group having 1 to 5 carbon atoms. As such, a methyl group, an ethyl group, a propyl group, an isopropyl group, an n-butyl group, an isobutyl group, a sec-butyl group, a pentyl group, and a neopentyl group can be exemplified. As a substituent of these alkyl groups, a halogen atom, an alkyl group substituted with a halogen atom, an alkoxy group, an alkylthio group, an alkyloxysulfonyl group, an aryloxysulfonyl group, and a cycloalkylaryloxysulfonyl group can be exemplified. An alkyl group substituted with a fluorine atom is preferred.

As the other nonnucleophilic anions, phosphorus fluoride, boron fluoride and antimony fluoride can be exemplified.

The nonnucleophilic anion represented by $Z^-$ is preferably selected from among an aliphatic sulfonate anion substituted at its α-position of sulfonic acid with a fluorine atom, an aromatic sulfonate anion substituted with a fluorine atom or a group having a fluorine atom, a bis(alkylsulfonyl)imido anion whose alkyl group is substituted with a fluorine atom and a tris(alkylsulfonyl)methide anion whose alkyl group is substituted with a fluorine atom. More preferably, the nonnucleophilic anion is a perfluorinated aliphatic sulfonate anion having 4 to 8 carbon atoms or a benzene sulfonate anion having a fluorine atom. Still more preferably, the nonnucleophilic anion is a nonafluorobutane sulfonate anion, a perfluorooctane sulfonate anion, a pentafluorobenzene sulfonate anion or a 3,5-bis(trifluoromethyl)benzene sulfonate anion.

As the organic groups represented by $R_{201}$, $R_{202}$ and $R_{203}$, corresponding groups in the following compounds (ZI-1), (ZI-2), (ZI-3) and (ZI-4) can be exemplified.

Appropriate use may be made of compounds with two or more of the structures of the general formula (ZI). For example, use may be made of compounds having a structure wherein at least one of $R_{201}$ to $R_{203}$ of a compound represented by the general formula (ZI) is bonded with at least one of $R_{201}$ to $R_{203}$ of another compound represented by the general formula (ZI).

As preferred (ZI) components, the following compounds (ZI-1), (ZI-2), (ZI-3) and (ZI-4) can be exemplified.

The compounds (ZI-1) are arylsulfonium compounds represented by the general formula (ZI) wherein at least one of $R_{201}$ to $R_{203}$ is an aryl group, namely, compounds containing an arylsulfonium as a cation.

In the arylsulfonium compounds, all of the $R_{201}$ to $R_{203}$ may be aryl groups. It is also appropriate that the $R_{201}$ to $R_{203}$ are partially an aryl group and the remainder is an alkyl group or a cycloalkyl group.

As the arylsulfonium compounds, a triarylsulfonium compound, a diarylalkylsulfonium compound, an aryldialkylsulfonium compound, a diarylcycloalkylsulfonium compound and an aryldicycloalkylsulfonium compound can be exemplified.

The aryl group of the arylsulfonium compounds is preferably a phenyl group or a naphthyl group, more preferably a phenyl group. The aryl group may be one having a heterocyclic structure containing an oxygen atom, nitrogen atom, sulfur atom or the like. As the aryl group having a heterocyclic structure, a pyrrole residue (group formed by loss of one hydrogen atom from pyrrole), a furan residue (group formed by loss of one hydrogen atom from furan), a thiophene residue (group formed by loss of one hydrogen atom from thiophene), an indole residue (group formed by loss of one hydrogen atom from indole), a benzofuran residue (group formed by loss of one hydrogen atom from benzofuran), and a benzothiophene residue (group formed by loss of one hydrogen atom from benzothiophene) can be exemplified. When the arylsulfonium compound has two or more aryl groups, the two or more aryl groups may be identical to or different from each other.

The alkyl group or cycloalkyl group contained in the arylsulfonium compound according to necessity is preferably a linear or branched alkyl group having 1 to 15 carbon atoms or a cycloalkyl group having 3 to 15 carbon atoms. As such, a methyl group, an ethyl group, a propyl group, an n-butyl group, a sec-butyl group, a t-butyl group, a cyclopropyl group, a cyclobutyl group, and a cyclohexyl group can be exemplified.

The aryl group, alkyl group or cycloalkyl group represented by $R_{201}$ to $R_{203}$ may have as its substituent an alkyl group (having, for example, 1 to 15 carbon atoms), a cycloalkyl group (having, for example, 3 to 15 carbon atoms), an aryl group (having, for example, 6 to 14 carbon atoms), an alkoxy group (having, for example, 1 to 15 carbon atoms), a halogen atom, a hydroxy group or a phenylthio group. Preferred substituents include a linear or branched alkyl group having 1 to 12 carbon atoms, a cycloalkyl group having 3 to 12 carbon atoms, and a linear, branched or cyclic alkoxy group having 1 to 12 carbon atoms. More preferred substituents include an alkyl group having 1 to 4 carbon atoms and an alkoxy group having 1 to 4 carbon atoms. The substituents may be contained in any one of the three $R_{201}$ to $R_{203}$, or alternatively may be contained in all three of $R_{201}$ to $R_{203}$. When $R_{201}$ to $R_{203}$ represent an aryl group, the substituent preferably lies at the p-position of the aryl group.

Now, the compounds (ZI-2) will be described.

The compounds (ZI-2) are compounds represented by the formula (ZI) wherein each of $R_{201}$ to $R_{203}$ independently represents an organic group having no aromatic ring. The aromatic rings include an aromatic ring having a heteroatom.

The organic group having no aromatic ring represented by $R_{201}$ to $R_{203}$ generally has 1 to 30 carbon atoms, preferably 1 to 20 carbon atoms.

Preferably, each of $R_{201}$ to $R_{203}$ independently represents an alkyl group, a cycloalkyl group, an allyl group or a vinyl group. More preferred groups include a linear or branched 2-oxoalkyl group, a 2-oxocycloalkyl group and an alkoxycarbonylmethyl group. Especially preferred is a linear or branched 2-oxoalkyl group.

As preferred alkyl groups and cycloalkyl groups represented by $R_{201}$ to $R_{203}$, a linear or branched alkyl group having 1 to 10 carbon atoms (for example, a methyl group, an ethyl group, a propyl group, a butyl group or a pentyl group) and a cycloalkyl group having 3 to 10 carbon atoms (for example, a cyclopentyl group, a cyclohexyl group or a norbornyl group) can be exemplified. As more preferred alkyl groups, a 2-oxoalkyl group and an alkoxycarbonylmethyl group can be exemplified. As more preferred cycloalkyl group, a 2-oxocycloalkyl group can be exemplified.

The 2-oxoalkyl group may be linear or branched. A group having >C=O at the 2-position of the alkyl group can be preferably exemplified.

The 2-oxocycloalkyl group is preferably a group having >C=O at the 2-position of the cycloalkyl group.

As preferred alkoxy groups of the alkoxycarbonylmethyl group, alkoxy groups having 1 to 5 carbon atoms (a methoxy group, an ethoxy group, a propoxy group, a butoxy group and a pentoxy group) can be exemplified.

The $R_{201}$ to $R_{203}$ may be further substituted with a halogen atom, an alkoxy group (having, for example, 1 to 5 carbon atoms), a hydroxy group, a cyano group or a nitro group.

The compounds (ZI-3) are those represented by the following general formula (ZI-3) which have a phenacylsulfonium salt structure.

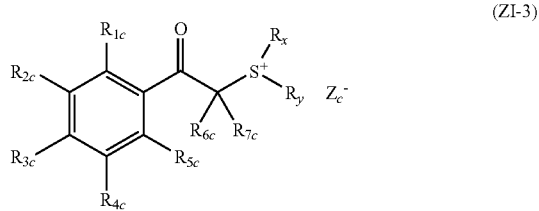

(ZI-3)

In the general formula (ZI-3), each of $R_{1c}$ to $R_{5c}$ independently represents a hydrogen atom, an alkyl group, a cycloalkyl group, an alkoxy group or a halogen atom.

Each of $R_{6c}$ and $R_{7c}$ independently represents a hydrogen atom, an alkyl group or a cycloalkyl group.

Each of $R_x$ and $R_y$ independently represents an alkyl group, a cycloalkyl group, an allyl group or a vinyl group.

Any two or more of $R_{1c}$ to $R_{5c}$; $R_{6c}$ and $R_{7c}$; and $R_x$ and $R_y$ may be bonded to each other to form a ring. This ring may contain an oxygen atom, a sulfur atom, an ester bond or an amido bond. As the group formed by bonding of any two or more of $R_{1c}$ to $R_{5c}$; $R_{6c}$ and $R_{7c}$; and $R_x$ and $R_y$, a butylene group and a pentylene group can be exemplified.

$Z_C^-$ represents a nonnucleophilic anion. The same nonnucleophilic anions as mentioned with respect to the $Z^-$ in the general formula (ZI) can be exemplified.

The alkyl group represented by $R_{1c}$ to $R_{7c}$ may be linear or branched. As such, an alkyl group having 1 to 20 carbon atoms, preferably a linear or branched alkyl group having 1 to 12 carbon atoms (for example, a methyl group, an ethyl group, a linear or branched propyl group, a linear or branched butyl group or a linear or branched pentyl group) can be exemplified. As the cycloalkyl group, a cycloalkyl group having 3 to 8 carbon atoms (for example, a cyclopentyl group or a cyclohexyl group) can be exemplified.

The alkoxy group represented by $R_{1c}$ to $R_{5c}$ may be linear, branched, or cyclic. As such, an alkoxy group having 1 to 10 carbon atoms, preferably a linear or branched alkoxy group having 1 to 5 carbon atoms (for example, a methoxy group, an ethoxy group, a linear or branched propoxy group, a linear or branched butoxy group or a linear or branched pentoxy group) and a cycloalkoxy group having 3 to 8 carbon atoms (for example, a cyclopentyloxy group or a cyclohexyloxy group) can be exemplified.

Preferably, any one of $R_{1c}$ to $R_{5c}$ is a linear or branched alkyl group, a cycloalkyl group or a linear, branched or cyclic alkoxy group. More preferably, the sum of the number of carbon atoms in $R_{1c}$ to $R_{5c}$ is in the range of 2 to 15. Accordingly, there can be attained an enhancement of solvent solubility and inhibition of particle generation during storage.

As the alkyl groups and cycloalkyl groups represented by $R_x$ and $R_y$, the same alkyl groups and cycloalkyl groups as mentioned with respect to $R_{1c}$ to $R_{7c}$ can be exemplified. Among them, a 2-oxoalkyl group, a 2-oxocycloalkyl group and an alkoxycarbonylmethyl group are more preferred.

As the 2-oxoalkyl group and 2-oxocycloalkyl group, groups having >C=O at the 2-position of the alkyl group and cycloalkyl group represented by $R_{1c}$ to $R_{7c}$ can be exemplified.

Regarding the alkoxy group of the alkoxycarbonylmethyl group, the same alkoxy groups as mentioned with respect to $R_{1c}$ to $R_{5c}$ can be exemplified.

Each of $R_x$ and $R_y$ is preferably an alkyl group or cycloalkyl group having 4 or more carbon atoms. The alkyl group or cycloalkyl group has more preferably 6 or more carbon atoms, and still more preferably 8 or more carbon atoms.

The compounds (ZI-4) are those represented by general formula (ZI-4) below.

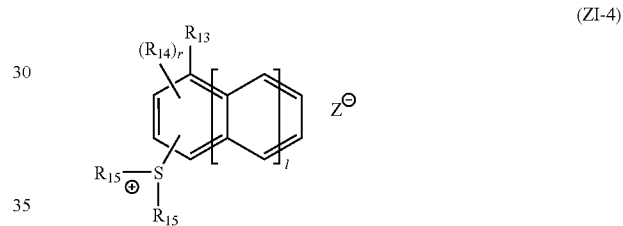

(ZI-4)

In the general formula (ZI-4), $R_{13}$ represents a hydrogen atom, a fluorine atom, a hydroxyl group, an alkyl group, a cycloalkyl group, an alkoxy group or an alkoxycarbonyl group.

$R_{14}$, each independently in the presence of two or more groups, represents an alkyl group, a cycloalkyl group, an alkoxy group, an alkylsulfonyl group or a cycloalkylsulfonyl group.

Each of $R_{15}$s independently represents an alkyl group or a cycloalkyl group, provided that the two $R_{15}$s may be bonded to each other to thereby form a ring.

In the formula, l is an integer of 0 to 2, and r is an integer of 0 to 10.

$Z^-$ represents a nonnucleophilic anion. As such, any of the same nonnucleophilic anions as mentioned with respect to the $Z^-$ of the general formula (ZI) can be exemplified.

In the general formula (ZI-4), the alkyl groups represented by $R_{13}$, $R_{14}$ and $R_{15}$ may be linear or branched and preferably each have 1 to 10 carbon atoms. As such, a methyl group, an ethyl group, an n-propyl group, an i-propyl group, an n-butyl group, a 2-methylpropyl group, a 1-methylpropyl group, a t-butyl group, an n-pentyl group, a neopentyl group, an n-hexyl group, an n-heptyl group, an n-octyl group, a 2-ethylhexyl group, an n-nonyl group, and an n-decyl group can be exemplified. Preferred alkyl groups include a methyl group, an ethyl group, an n-butyl group, and a t-butyl group.

As the cycloalkyl groups represented by $R_{13}$, $R_{14}$ and $R_{15}$, a cyclopropyl, a cyclobutyl, a cyclopentyl, a cyclohexyl, a cycloheptyl, a cyclooctyl, a cyclododecanyl, a cyclopentenyl, a cyclohexenyl, and a cyclooctadienyl group can be exemplified. Cyclopropyl, cyclopentyl, cyclohexyl and cyclooctyl groups are especially preferred.

The alkoxy groups represented by $R_{13}$ and $R_{14}$ may be linear or branched and preferably each have 1 to 10 carbon atoms. As such, a methoxy group, an ethoxy group, an n-propoxy group, an i-propoxy group, an n-butoxy group, a 2-methylpropoxy group, a 1-methylpropoxy group, a t-butoxy group, an n-pentyloxy group, a neopentyloxy group, an n-hexyloxy group, an n-heptyloxy group, an n-octyloxy group, a 2-ethylhexyloxy group, an n-nonyloxy group, and an n-decyloxy group can be exemplified. Preferred alkoxy groups include a methoxy group, an ethoxy group, an n-propoxy group, and an n-butoxy group.

The alkoxycarbonyl group represented by $R_{13}$ may be linear or branched and preferably has 2 to 11 carbon atoms. As such, a methoxycarbonyl group, an ethoxycarbonyl group, an n-propoxycarbonyl group, an i-propoxycarbonyl group, an n-butoxycarbonyl group, a 2-methylpropoxycarbonyl group, a 1-methylpropoxycarbonyl group, a t-butoxycarbonyl group, an n-pentyloxycarbonyl group, a neopentyloxycarbonyl group, an n-hexyloxycarbonyl group, an n-heptyloxycarbonyl group, an n-octyloxycarbonyl group, a 2-ethylhexyloxycarbonyl group, an n-nonyloxycarbonyl group, and an n-decyloxycarbonyl group can be exemplified. Preferred alkoxycarbonyl groups include a methoxycarbonyl group, an ethoxycarbonyl group, and an n-butoxycarbonyl group.

The alkylsulfonyl and cycloalkylsulfonyl groups represented by $R_{14}$ may be linear, branched or cyclic and preferably each have 1 to 10 carbon atoms. As such, a methanesulfonyl group, an ethanesulfonyl group, an n-propanesulfonyl group, an n-butanesulfonyl group, a tert-butanesulfonyl group, an n-pentanesulfonyl group, a neopentanesulfonyl group, an n-hexanesulfonyl group, an n-heptanesulfonyl group, an n-octanesulfonyl group, a 2-ethylhexanesulfonyl group, an n-nonanesulfonyl group, an n-decanesulfonyl group, a cyclopentanesulfonyl group, and a cyclohexanesulfonyl group can be exemplified. Preferred alkylsulfonyl and cycloalkylsulfonyl groups include a methanesulfonyl group, an ethanesulfonyl group, an n-propanesulfonyl group, an n-butanesulfonyl group, a cyclopentanesulfonyl group, and a cyclohexanesulfonyl group.

In the formula, l is preferably 0 or 1, more preferably 1, and r is preferably 0 to 2.

Each of the $R_{13}$, $R_{14}$ and $R_{15}$ groups may have a substituent. As such a substituent, a halogen atom (e.g., a fluorine atom), a hydroxyl group, a carboxyl group, a cyano group, a nitro group, an alkoxy group, an alkoxyalkyl group, an alkoxycarbonyl group, and an alkoxycarbonyloxy group can be exemplified.

As the alkoxy group, a linear, branched or cyclic alkoxy group having 1 to 20 carbon atoms, such as a methoxy group, an ethoxy group, an n-propoxy group, an i-propoxy group, an n-butoxy group, a 2-methylpropoxy group, a 1-methylpropoxy group, a t-butoxy group, a cyclopentyloxy group and a cyclohexyloxy group can be exemplified.

As the alkoxyalkyl group, a linear, branched or cyclic alkoxyalkyl group having 2 to 21 carbon atoms, such as a methoxymethyl group, an ethoxymethyl group, a 1-methoxyethyl group, a 2-methoxyethyl group, a 1-ethoxyethyl group and a 2-ethoxyethyl group can be exemplified.

As the alkoxycarbonyl group, a linear, branched or cyclic alkoxycarbonyl group having 2 to 21 carbon atoms, such as a methoxycarbonyl group, an ethoxycarbonyl group, an n-propoxycarbonyl group, an i-propoxycarbonyl group, an n-butoxycarbonyl group, a 2-methylpropoxycarbonyl group, a 1-methylpropoxycarbonyl group, a t-butoxycarbonyl group, a cyclopentyloxycarbonyl group and a cyclohexyloxycarbonyl group can be exemplified.

As the alkoxycarbonyloxy group, a linear, branched or cyclic alkoxycarbonyloxy group having 2 to 21 carbon atoms, such as a methoxycarbonyloxy group, an ethoxycarbonyloxy group, an n-propoxycarbonyloxy group, an i-propoxycarbonyloxy group, an n-butoxycarbonyloxy group, a t-butoxycarbonyloxy group, a cyclopentyloxycarbonyloxy group and a cyclohexyloxycarbonyloxy group can be exemplified.

The cyclic structure that may be formed by the bonding of the two $R_{15}$s to each other is preferably a 5- or 6-membered ring, especially a 5-membered ring (namely, a tetrahydrothiophene ring) formed by two bivalent $R_{15}$s in cooperation with the sulfur atom of the general formula (ZI-4). The bivalent $R_{15}$s may have substituents. As such substituents, a hydroxyl group, a carboxyl group, a cyano group, a nitro group, an alkoxy group, an alkoxyalkyl group, an alkoxycarbonyl group, and an alkoxycarbonyloxy group as mentioned above can be exemplified. It is especially preferred for the $R_{15}$ of the general formula (ZI-4) to be a methyl group, an ethyl group, the above-mentioned bivalent group allowing two $R_{15}$s to be bonded to each other so as to form a tetrahydrothiophene ring structure in cooperation with the sulfur atom of the general formula (ZI-4), or the like.

As mentioned above, the alkyl group, cycloalkyl group, alkoxy group and alkoxycarbonyl group represented by $R_{13}$ as well as the alkyl group, cycloalkyl group, alkoxy group, alkylsulfonyl group and cycloalkylsulfonyl group represented by $R_{14}$ may have substituents. Preferred substituents are a hydroxyl group, an alkoxy group, an alkoxycarbonyl group and a halogen atom (especially, a fluorine atom).

Preferred specific examples of the cations of the compounds of the general formula (ZI-4) will be shown below.

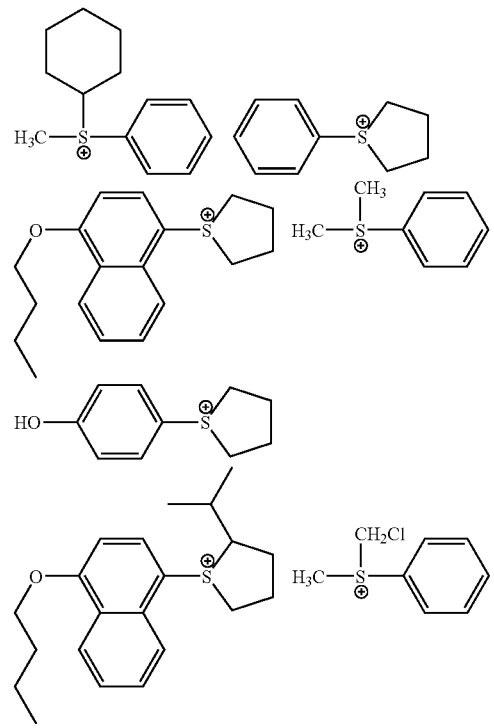

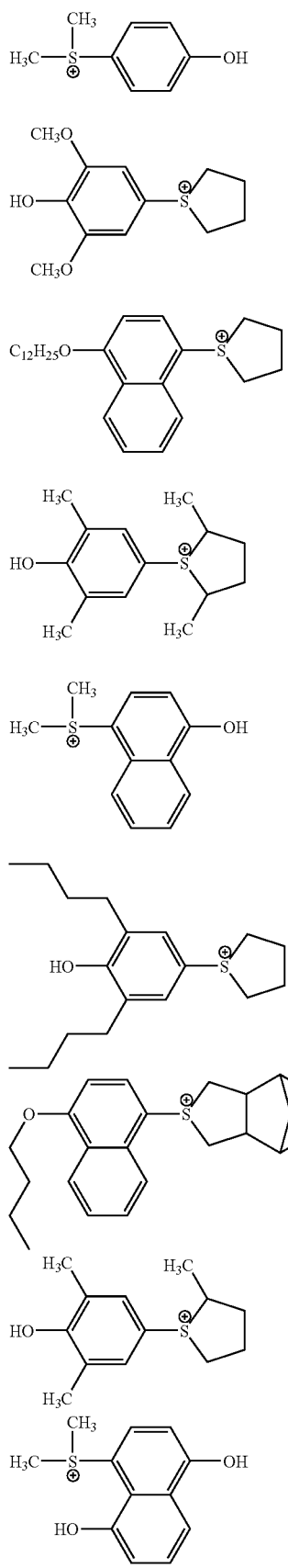
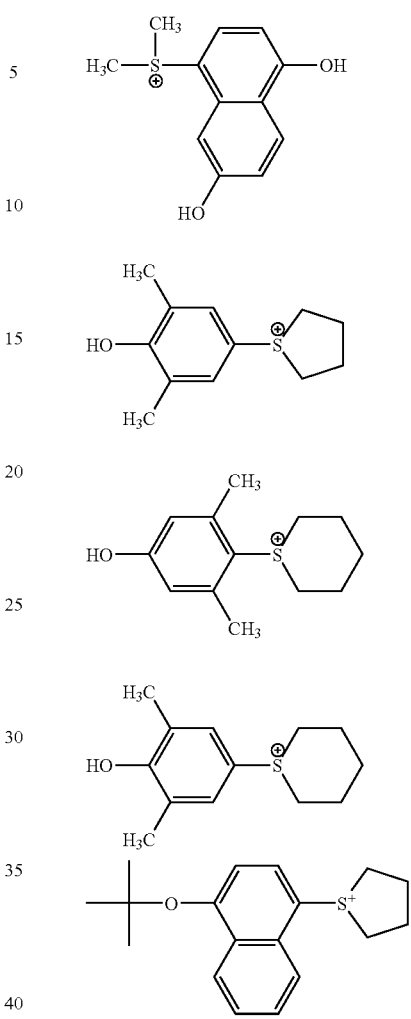
Specific examples of the cations contained in compounds represented by the general formula (ZI) will further be shown below.
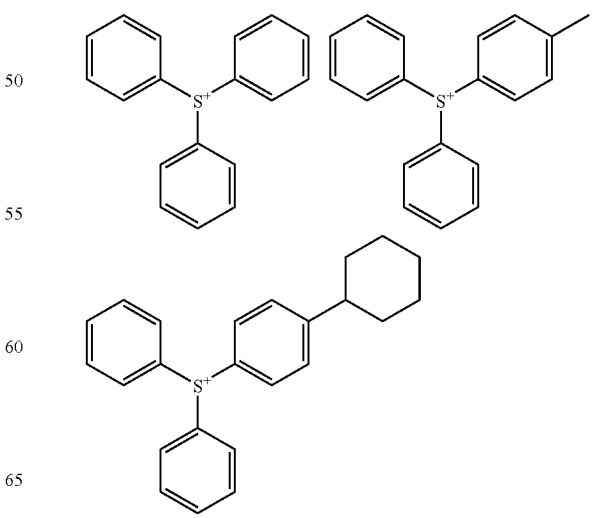

-continued

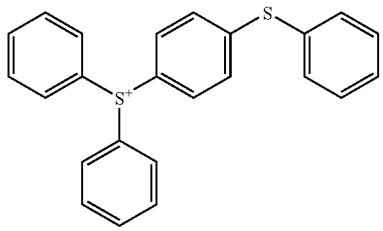
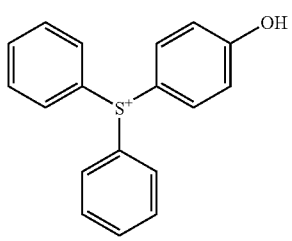
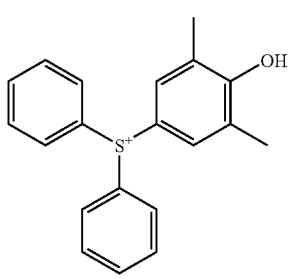
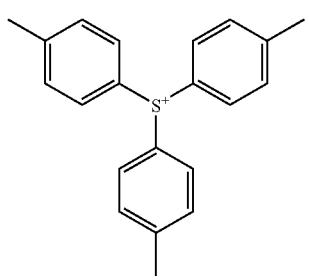
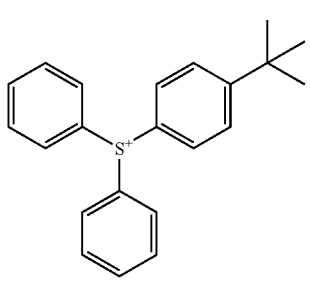
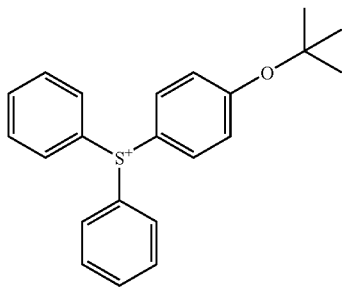

-continued

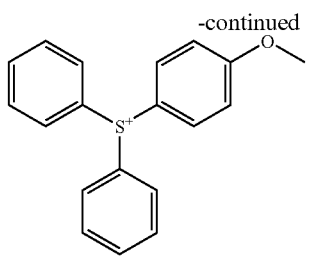
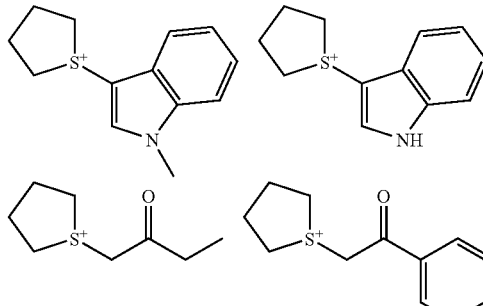
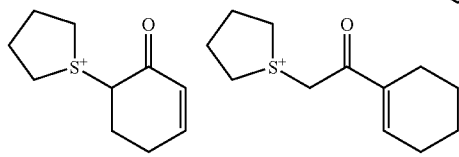
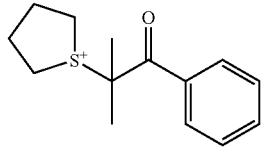
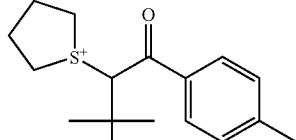
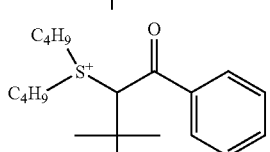
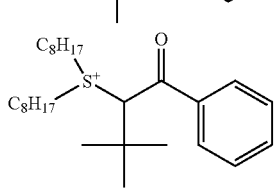

In the general formulae (ZII) and (ZIII), each of $R_{204}$ to $R_{207}$ independently represents an aryl group, an alkyl group or a cycloalkyl group.

The aryl group represented by $R_{204}$ to $R_{207}$ is preferably a phenyl group or a naphthyl group, more preferably a phenyl group. The aryl group represented by $R_{204}$ to $R_{207}$ may be one having a heterocyclic structure containing an oxygen atom, nitrogen atom, sulfur atom, etc. As the aryl group having a heterocyclic structure, a pyrrole residue (group formed by loss of one hydrogen atom from pyrrole), a furan residue (group formed by loss of one hydrogen atom from furan), a thiophene residue (group formed by loss of one hydrogen atom from thiophene), an indole residue (group formed by loss of one hydrogen atom from indole), a benzofuran residue (group formed by loss of one hydrogen atom from benzofuran), and a benzothiophene residue (group formed by loss of one hydrogen atom from benzothiophene) can be exemplified.

As preferred alkyl groups and cycloalkyl groups represented by $R_{204}$ to $R_{207}$, a linear or branched alkyl group having 1 to 10 carbon atoms (for example, a methyl group, an ethyl group, a propyl group, a butyl group or a pentyl group) and a cycloalkyl group having 3 to 10 carbon atoms (for example, a cyclopentyl group, a cyclohexyl group or a norbornyl group) can be exemplified.

The aryl group, alkyl group and cycloalkyl group represented by $R_{204}$ to $R_{207}$ may have a substituent. As a possible substituent on the aryl group, alkyl group and cycloalkyl group represented by $R_{204}$ to $R_{207}$, an alkyl group (having, for example, 1 to 15 carbon atoms), a cycloalkyl group (having, for example, 3 to 15 carbon atoms), an aryl group (having, for example, 6 to 15 carbon atoms), an alkoxy group (having, for example, 1 to 15 carbon atoms), a halogen atom, a hydroxy group, and a phenylthio group can be exemplified.

$Z^-$ represents a nonnucleophilic anion. As such, the same nonnucleophilic anions as mentioned with respect to the $Z^-$ in the general formula (ZI) can be exemplified.

Specific examples of the cations contained in compounds represented by the general formula (ZII) will be shown below.

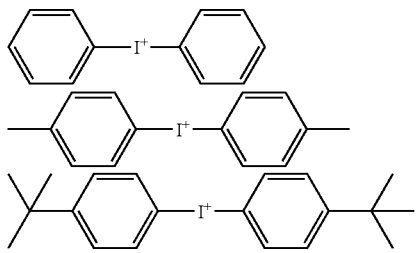

As the acid generators, the compounds represented by the following general formulae (ZIV), (ZV) and (ZVI) can further be exemplified.

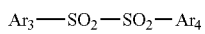
ZIV

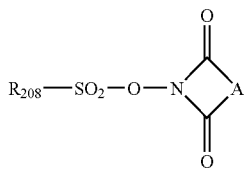
ZV

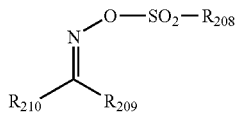
ZVI

In the general formulae (ZIV) to (ZVI),
each of $Ar_3$ and $Ar_4$ independently represents an aryl group.
Each of $R_{208}$, $R_{209}$ and $R_{210}$ independently represents an alkyl group, a cycloalkyl group or an aryl group.

A represents an alkylene group, an alkenylene group or an arylene group.

Among the acid generators, the compounds represented by the general formulae (ZI) to (ZIII) are more preferred.

As a preferred acid generator, a compound that generates an acid having one sulfonate group or imido group. As a more preferred acid generator, a compound that generates a monovalent perfluoroalkanesulfonic acid, a compound that generates a monovalent aromatic sulfonic acid substituted with a fluorine atom or fluorine-atom-containing group, and a compound that generates a monovalent imidic acid substituted with a fluorine atom or fluorine-atom-containing group can be exemplified. As a still more preferred acid generator, any of sulfonium salts of fluorinated alkanesulfonic acid, fluorinated benzenesulfonic acid, fluorinated imidic acid and fluorinated methide acid can be exemplified. With respect to practicable acid generators, it is especially preferred for the generated acid to be a fluorinated alkanesulfonic acid, fluorinated benzenesulfonic acid or fluorinated imidic acid, each of which having pKa's of –1 or below. By the use thereof, an enhancement of sensitivity can be attained.

Furthermore, as the acid generator, compounds that generate any of the acids of general formula (IV) below when exposed to actinic rays or radiation can be exemplified.

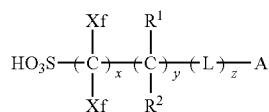
(IV)

In the formula,
each of Xfs independently represents a fluorine atom or an alkyl group substituted with at least one fluorine atom.

Each of $R^1$ and $R^2$ independently represents a member selected from among a hydrogen atom, a fluorine atom, an alkyl group and an alkyl group substituted with at least one fluorine atom. When two or more $R^1$s or $R^2$s are contained, the two or more may be identical to or different from each other.

L represents a single bond or a bivalent connecting group. When two or more Ls are contained, they may be identical to or different from each other.

A represents a group with a cyclic structure.

In the formula, x is an integer of 1 to 20, y an integer of 0 to 10 and z an integer of 0 to 10.

The general formula (IV) will be described in detail below.
The alkyl group of the alkyl group substituted with at least one fluorine atom, represented by Xf has preferably 1 to 10 carbon atoms, more preferably 1 to 4 carbon atoms. The alkyl group substituted with at least one fluorine atom, represented by Xf is preferably a perfluoroalkyl group.

Xf is preferably a fluorine atom or a perfluoroalkyl group having 1 to 4 carbon atoms. In particular, a fluorine atom, $CF_3$, $C_2F_5$, $C_3F_7$, $C_4F_9$, $C_5F_{11}$, $C_6F_{13}$, $C_7F_{15}$, $C_8F_{17}$, $CH_2CF_3$, $CH_2CH_2CF_3$, $CH_2C_2F_5$, $CH_2CH_2C_2F_5$, $CH_2C_3F_7$, $CH_2CH_2C_3F_7$, $CH_2C_4F_9$ and $CH_2CH_2C_4F_9$ can be exemplified. Of these, a fluorine atom and $CF_3$ are preferred. Further preferably, both of the Xfs are fluorine atoms.

Each of the alkyl group and the alkyl group of the alkyl group substituted with at least one fluorine atom, represented by each of $R^1$ and $R^2$ has preferably 1 to 4 carbon atoms. Further preferably, each of the alkyl groups is a perfluoroalkyl group having 1 to 4 carbon atoms. In particular, $CF_3$, $C_2F_5$, $C_3F_7$, $C_4F_9$, $C_5F_{11}$, $C_6F_{13}$, $C_7F_{15}$, $C_8F_{17}$, $CH_2CF_3$, $CH_2CH_2CF_3$, $CH_2C_2F_5$, $CH_2CH_2C_2F_5$, $CH_2C_3F_7$, $CH_2CH_2C_3F_7$, $CH_2C_4F_9$ and $CH_2CH_2C_4F_9$ can be exemplified. Of these, $CF_3$ is preferred.

In the formula, y is preferably 0 to 4, more preferably 0; x is preferably 1 to 8, more preferably 1 to 4 and most preferably 1; and z is preferably 0 to 8, more preferably 0 to 4.

The bivalent connecting group represented by L is not particularly limited. As the same, —COO—, —OCO—, —CO—, —O—, —S—, —SO—, —SO$_2$—, an alkylene group, a cycloalkylene group, and an alkenylene group can be exemplified. Of these, —COO—, —OCO—, —CO— and —O— are preferred. —COO— and —OCO— are more preferred.

The group with a cyclic structure represented by A is not particularly limited as long as a cyclic structure is contained. As the group, an alicyclic group, an aryl group, and a group with any of heterocyclic structures (including not only those exhibiting aromaticity but also those exhibiting no aromaticity) can be exemplified.

The alicyclic group may be monocyclic or polycyclic. Preferably, the alicyclic group is a cycloalkyl group of a single ring, such as a cyclopentyl group, a cyclohexyl group or a cyclooctyl group, or a cycloalkyl group of multiple rings, such as a norbornyl group, a tricyclodecanyl group, a tetracyclodecanyl group, a tetracyclododecanyl group or an adamantyl group. Of the mentioned groups, alicyclic groups with a bulky structure having at least 7 carbon atoms, namely, a norbornyl group, a tricyclodecanyl group, a tetracyclodecanyl group, a tetracyclododecanyl group and an adamantyl group are preferred from the viewpoint of inhibition of in-film diffusion in the PEB (post-exposure bake) stage that would enhance MEEF.

As the aryl group, a benzene ring, a naphthalene ring, a phenanthrene ring and an anthracene ring can be exemplified. Of these, naphthalene of low absorbance is preferred from the viewpoint of absorbance at 193 nm.

As the group with a heterocyclic structure, a furan ring, a thiophene ring, a benzofuran ring, a benzothiophene ring, a dibenzofuran ring, a dibenzothiophene ring and a pyridine ring can be exemplified. Of these, a furan ring, a thiophene ring and a pyridine ring are preferred.

The above group with a cyclic structure may have a substituent. As the substituent, an alkyl group (may be linear, branched or cyclic, preferably having 1 to 12 carbon atoms), an aryl group (preferably having 6 to 14 carbon atoms), a hydroxyl group, an alkoxy group, an ester group, an amido group, a urethane group, a ureido group, a thioether group, a sulfonamido group, and a sulfonic ester group can be exemplified.

The general formulae (IVa) and (IVb) below are preferred forms of the general formula (IV) above. In the general formulae (IVa) and (IVb), Xf, $R^1$, $R^2$, L, A, y and z are as defined in the general formula (IV) above.

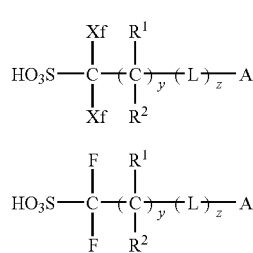

As preferred compounds capable of generating any of the acids represented by the general formula (IV) upon exposure to actinic rays or radiation, a compound with an ionic structure, such as a sulfonium salt or an iodonium salt, and a compound with a nonionic structure, such as an oxime ester or an imide ester can be exemplified. As the compound with an ionic structure, any of those represented by the general formulae (ZI) and (ZII) above can be exemplified. In the general formulae (ZI) and (ZII), Z⁻ represents the anion structure of the acids of the general formula (IV).

Further, as compounds capable of generating any of the acids of the general formula (IV) upon exposure to actinic rays or radiation, the compounds represented by general formulae (ZV') and (ZVI') below can be exemplified.

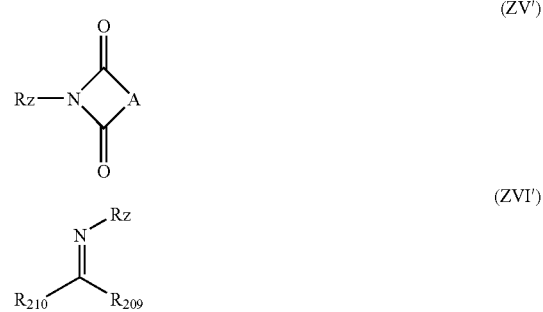

In the general formulas (ZV') and (ZVI'), each of $R_{209}$ and $R_{210}$ independently represents an alkyl group, a cycloalkyl group or an aryl group.

A represents an alkylene group, an alkenylene group or an arylene group.

Rz represents a structure resulting from dissociation of H from any of the acids of the general formula (IV) and is expressed by the general formula (I-s) below.

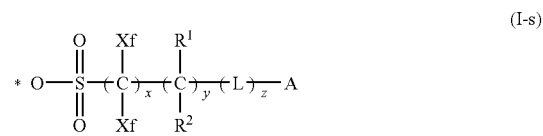

In the formula, $R_1$, $R_2$, L, A, Xf, x, y and z are as defined in the general formula (IV) above, and * represents the site of bonding with any of the residues of the compounds of the general formulae (ZV') and (ZVI').

Specific examples of the residues of the compounds represented by the general formulae (ZV') and (ZVI') will be shown below.

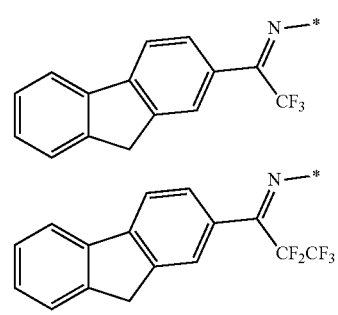

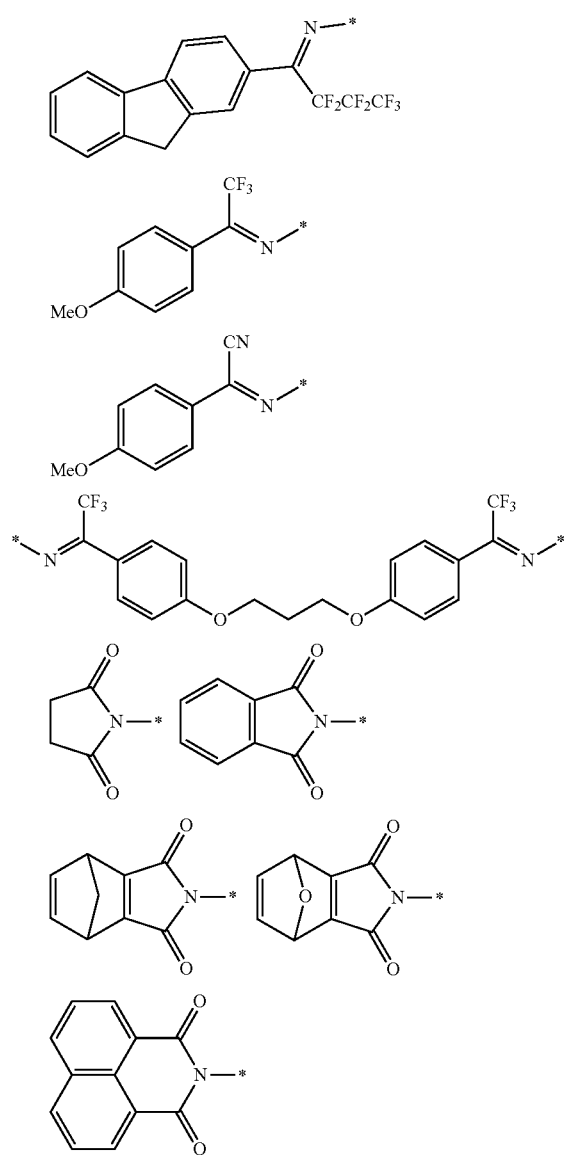
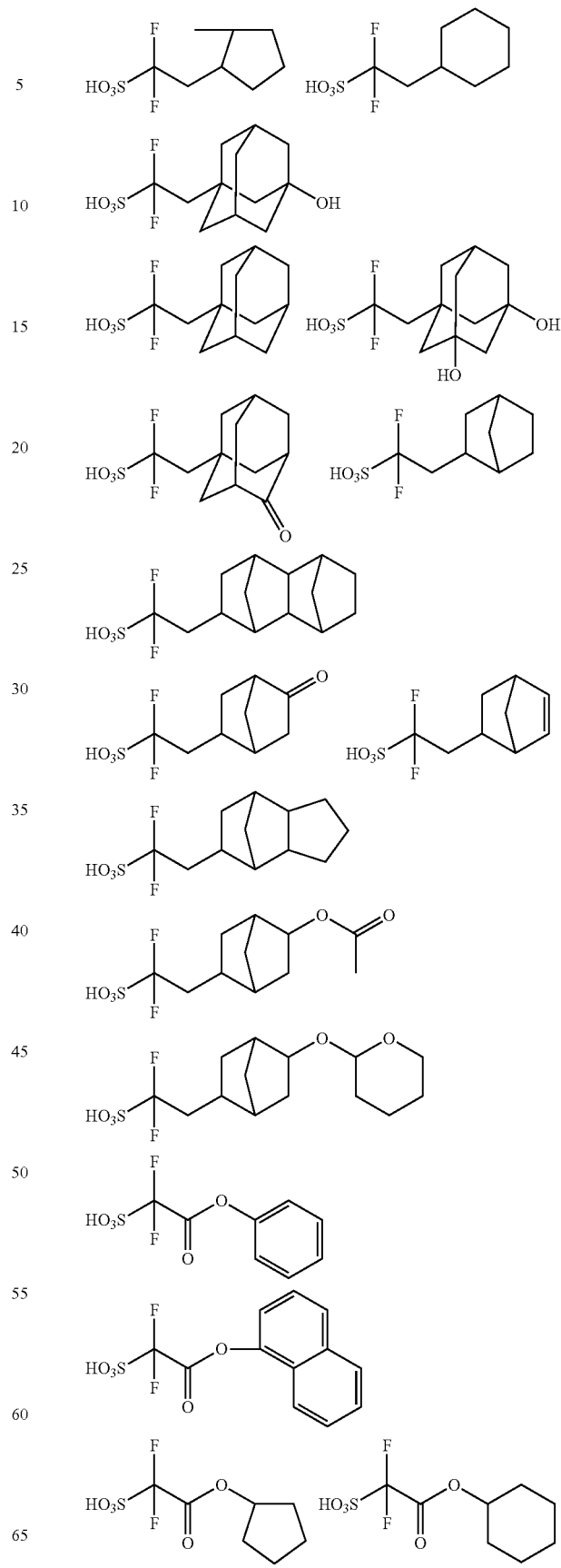
Specific examples of acids represented by general formula (I) will be shown below.
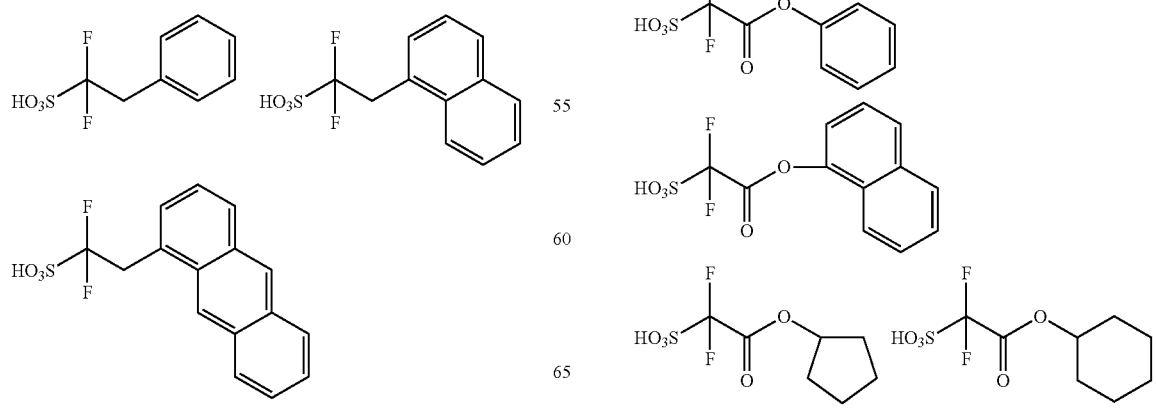

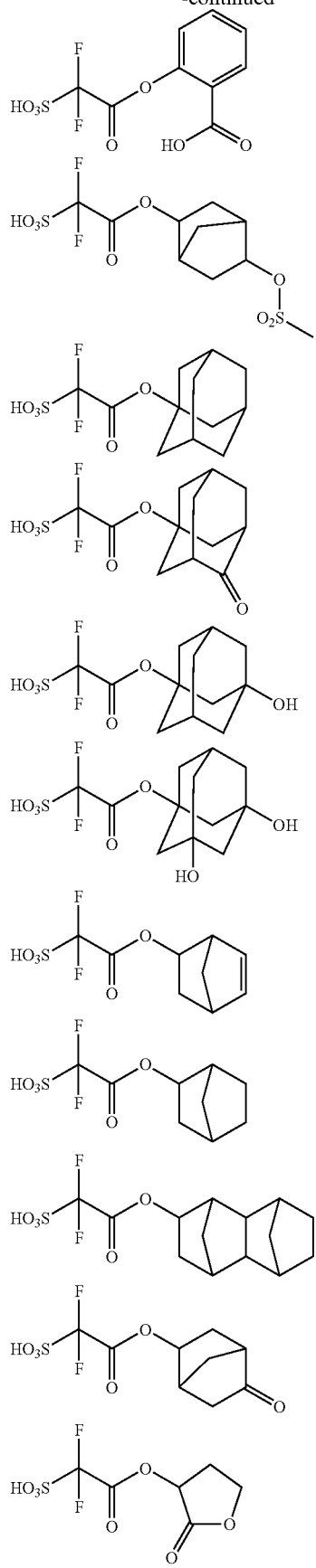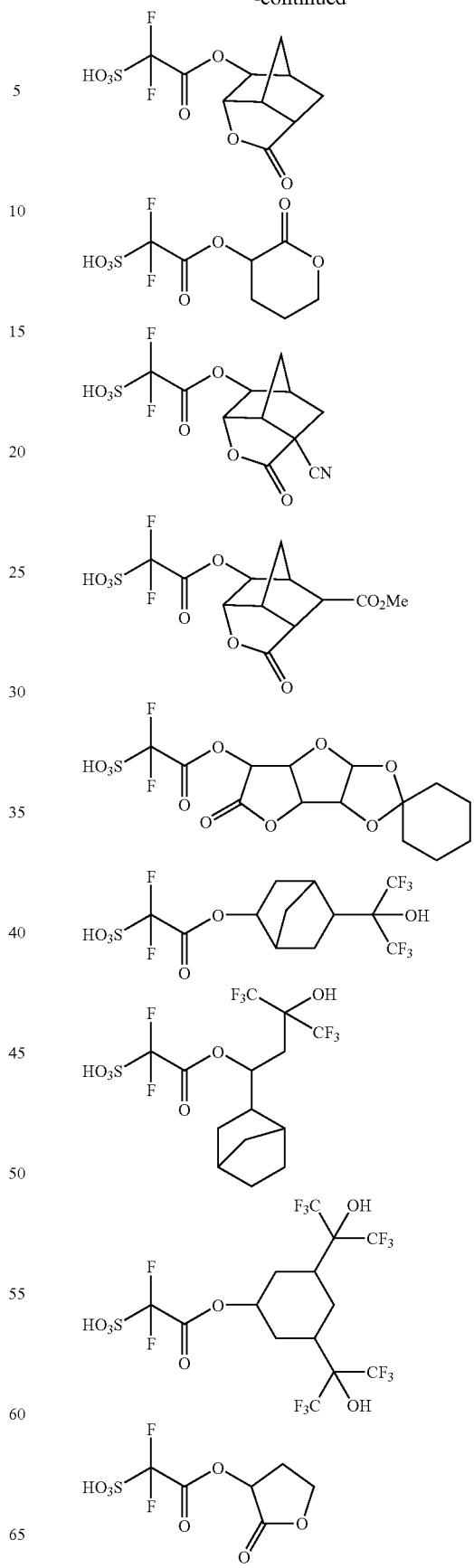

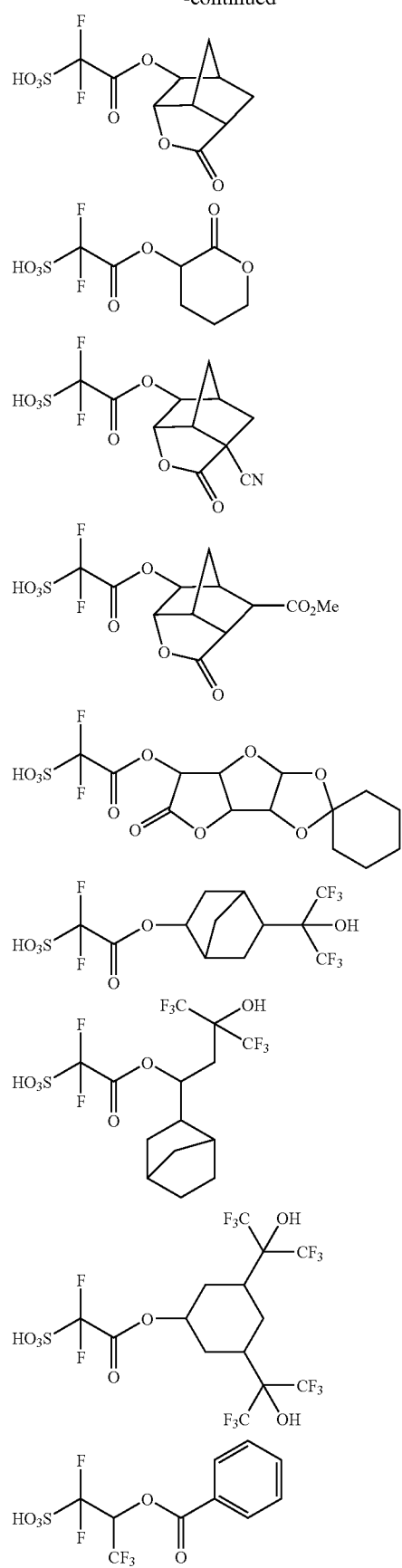
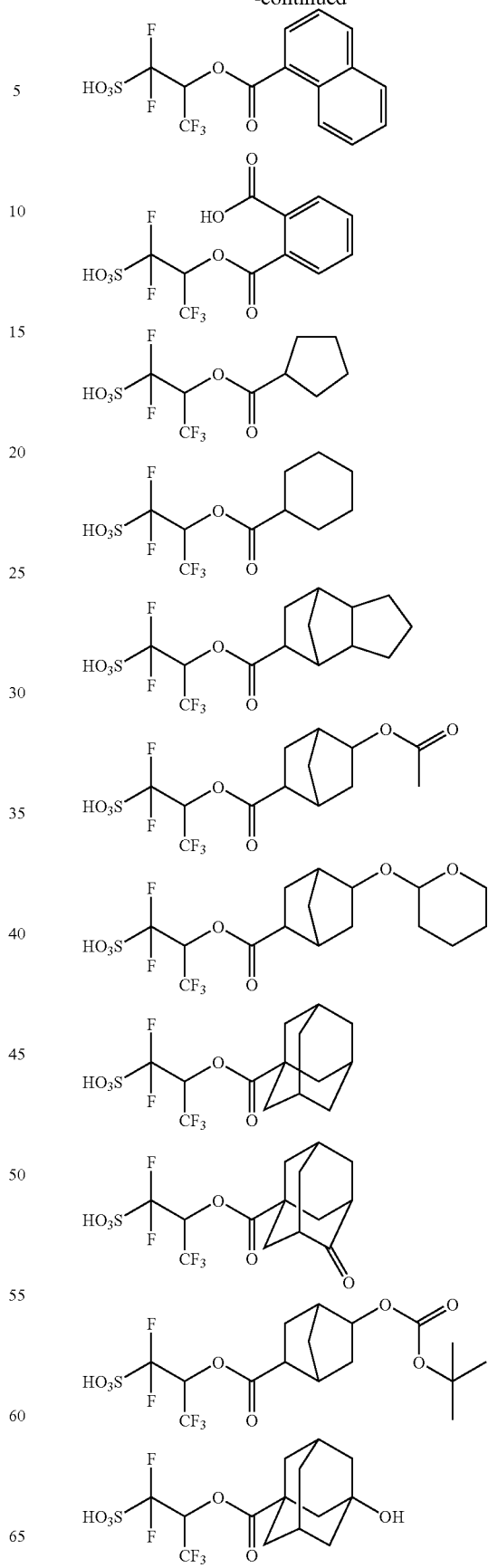

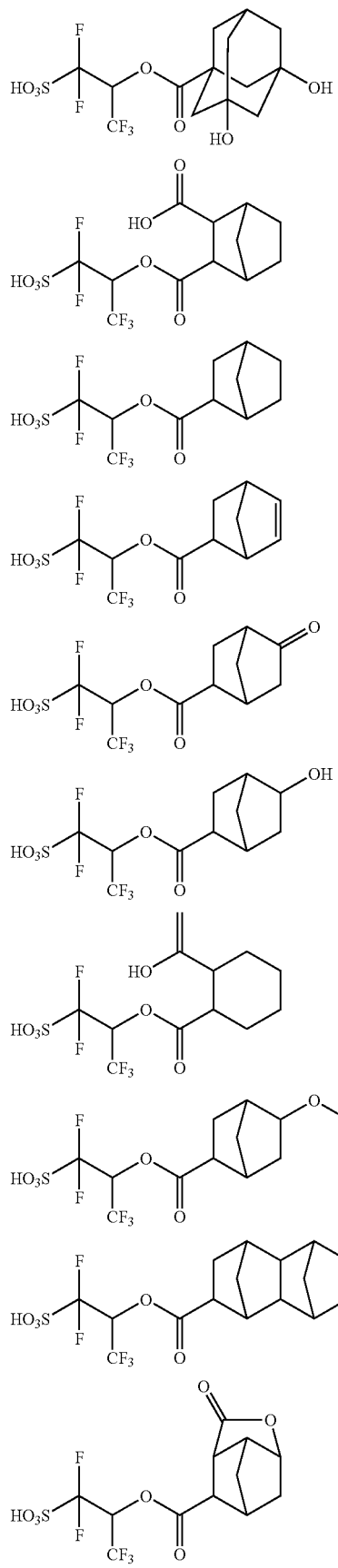
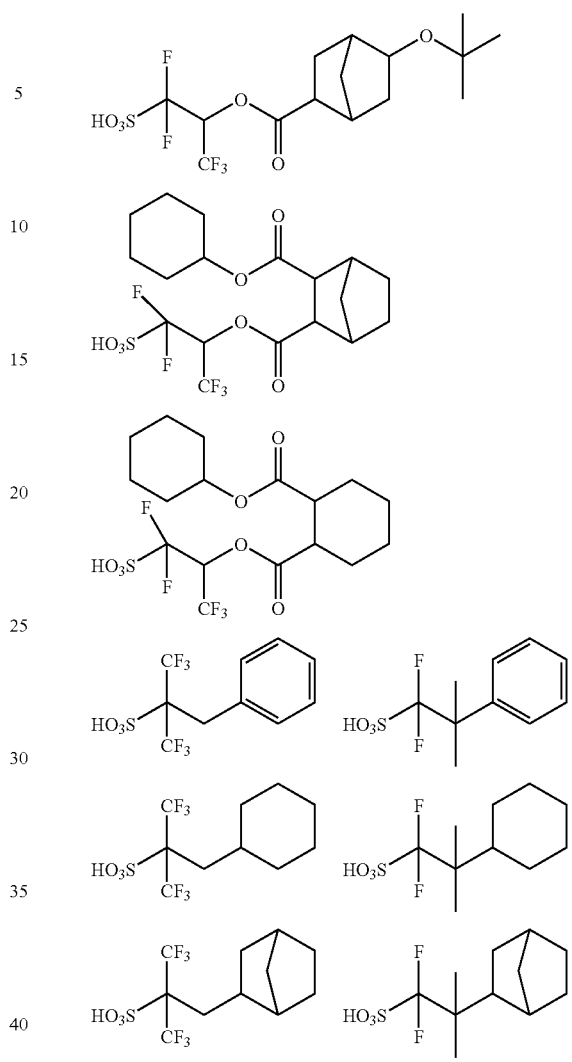
Of the specific examples above, particularly preferred acids will be shown below.

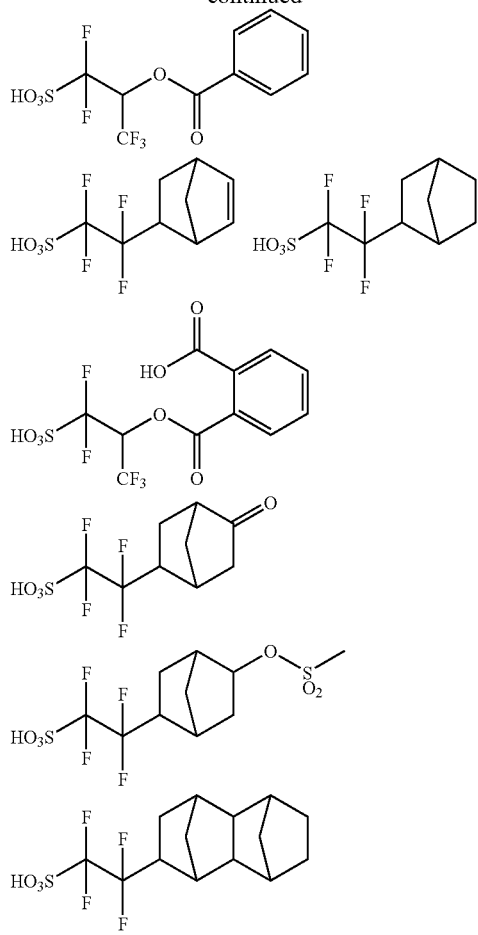
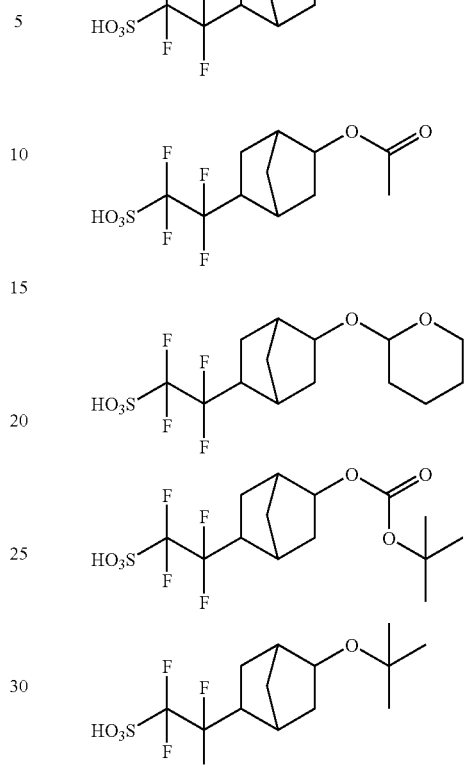
Particularly preferred examples of the acid generators are as follows.
(z1) 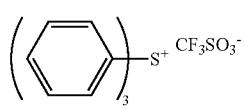
(z2) 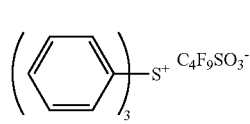
(z3) 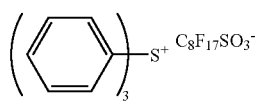
(z4) 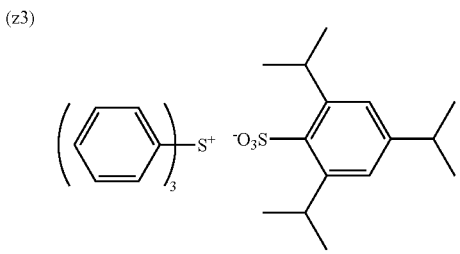
(z5) 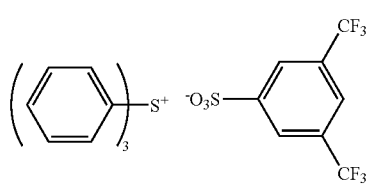
(z6) 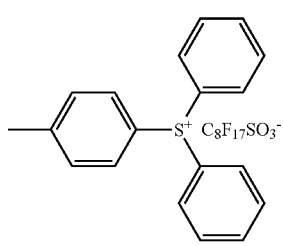

-continued
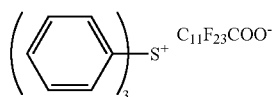 (z7)
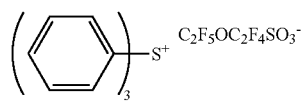 (z8)
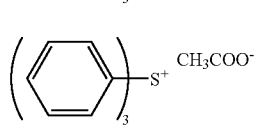 (z9)
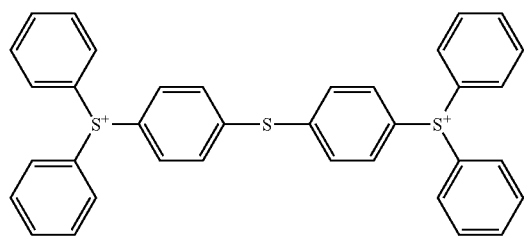 (z10) 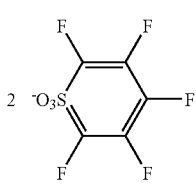
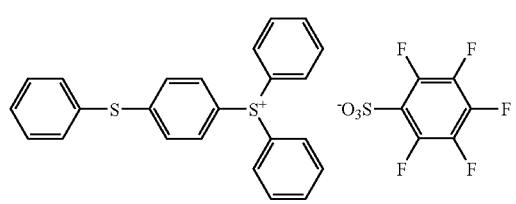 (z11) 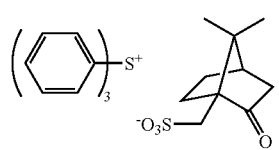 (z12)
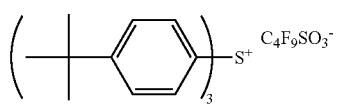 (z13)
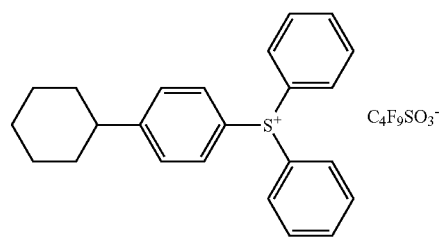 (z14)
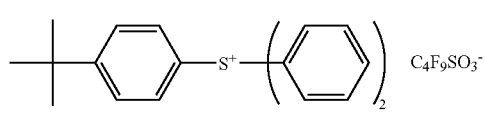 (z15)
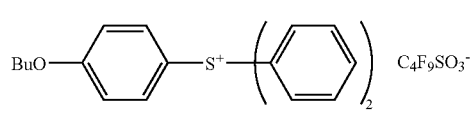 (z16)
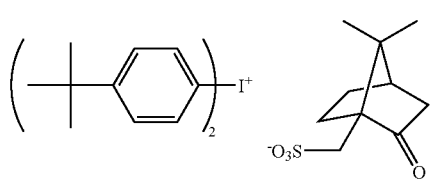 (z17)
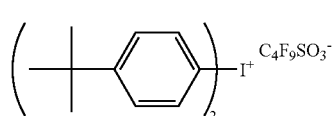 (z18)
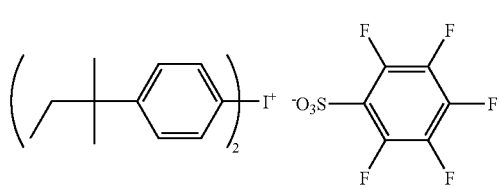 (z19)
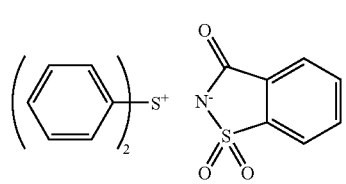 (z20)
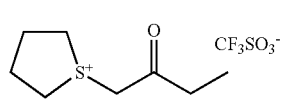 (z21)
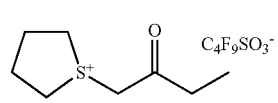 (z22)
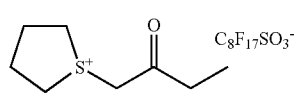 (z23)
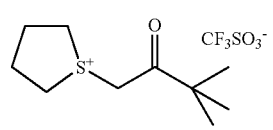 (z24)

-continued
(z25) 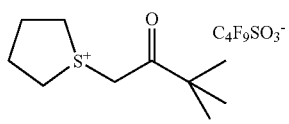
(z26) 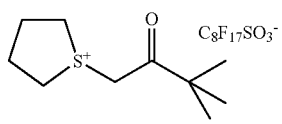
(z27) 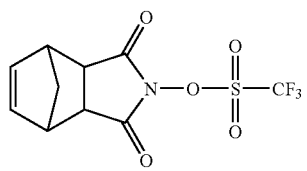
(z28) 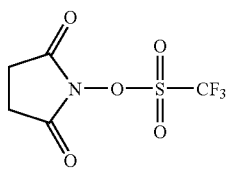
(z29) 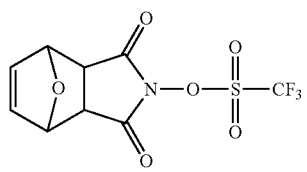
(z30) 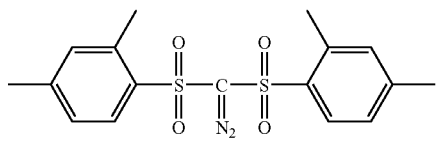
(z31) 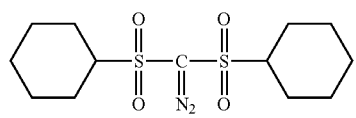
(z32) 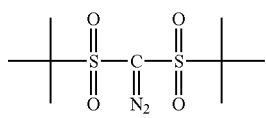
(z33) 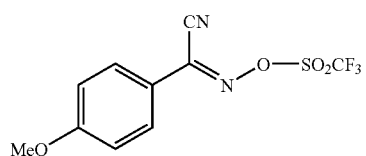
(z34) 
(z35) 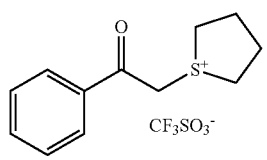
(z36) 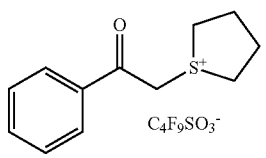
(z37) 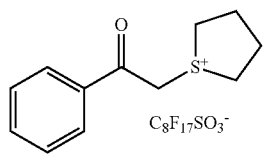
(z38) 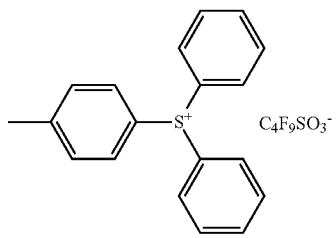
(z39) 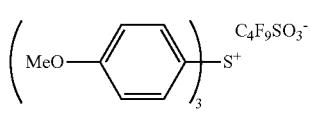
(z40) 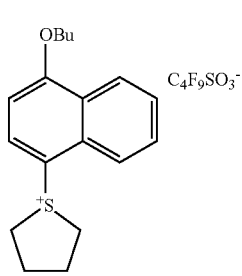

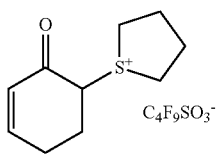 (z41)
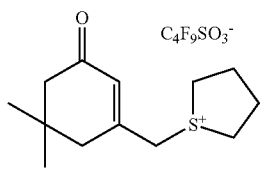 (z43)
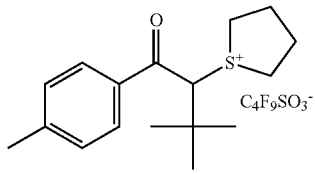 (z45)
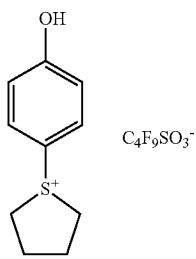 (z47)
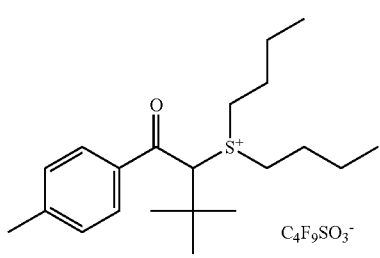 (z49)
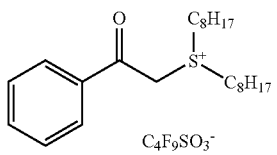 (z51)
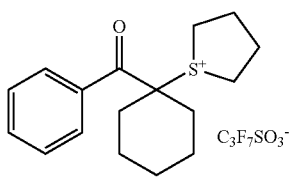 (z53)
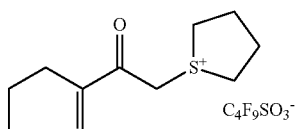 (z42)
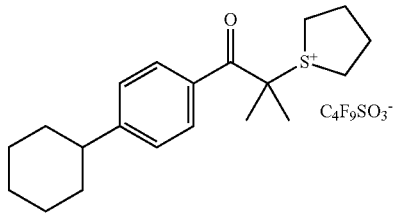 (z44)
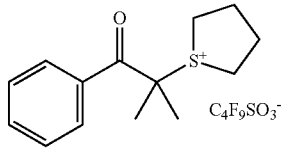 (z46)
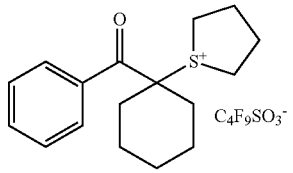 (z48)
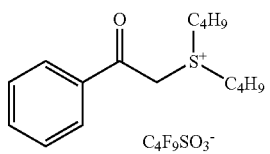 (z50)
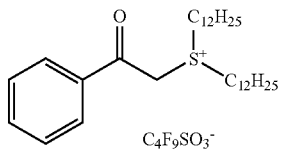 (z52)
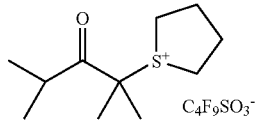 (z54)

-continued
(z55)
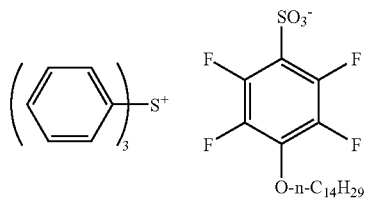
(z56)
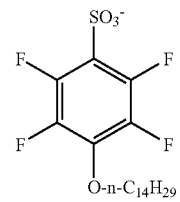
(z57)
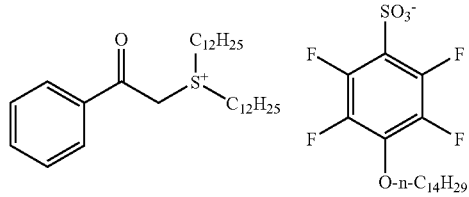
(z58)
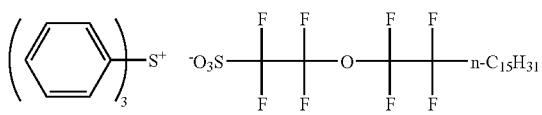
(z59)
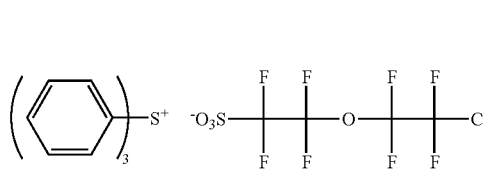
(z60)
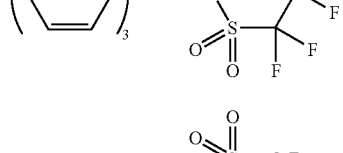
(z61)
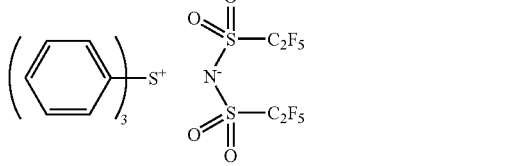
(z62)
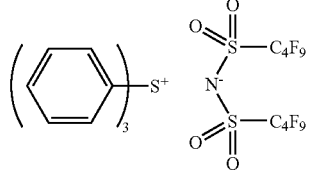
(z63)
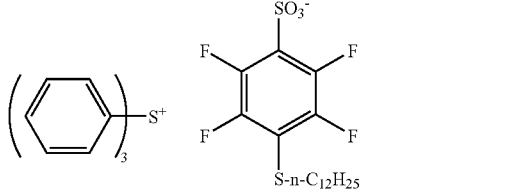
(z64)
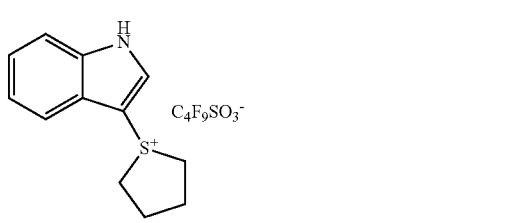
(z65)
(z66)
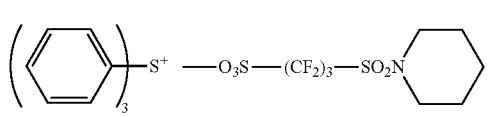
(z67)
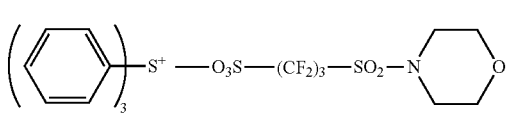
(z68)
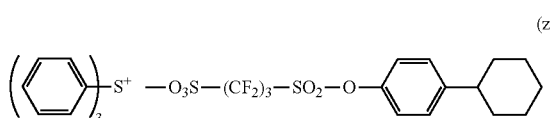
(z69)
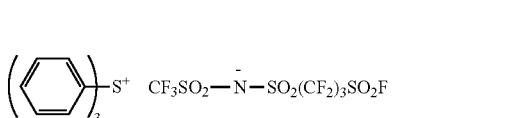
(z70)
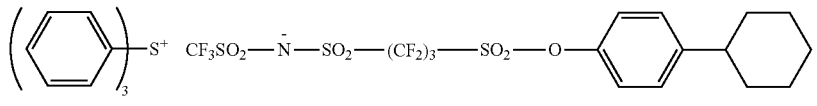

-continued
(z71)
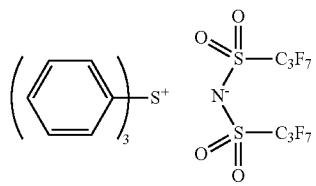
(z72)
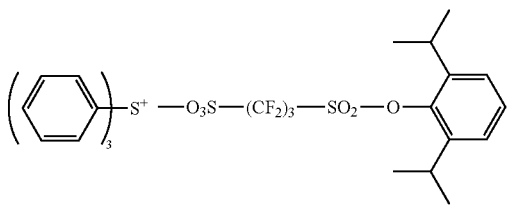
(z73)
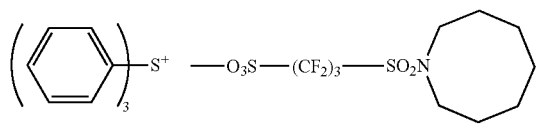
(z74)
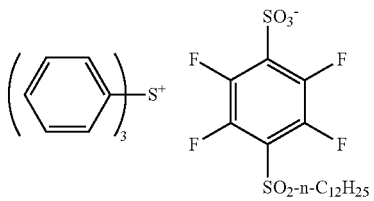
(z75)
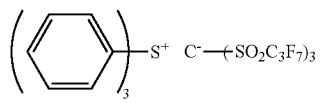
(z76)
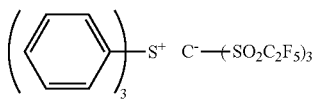
(z77)
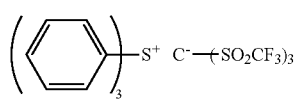
(z78)
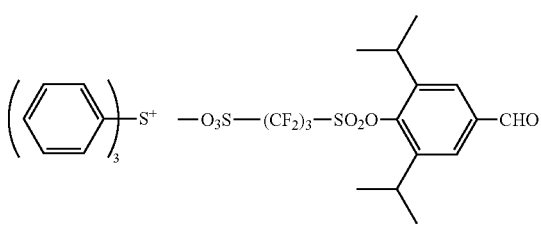
(z79)
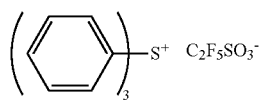
(z80)
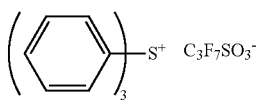
(z81)
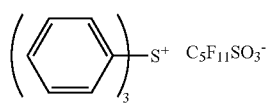
(z82)
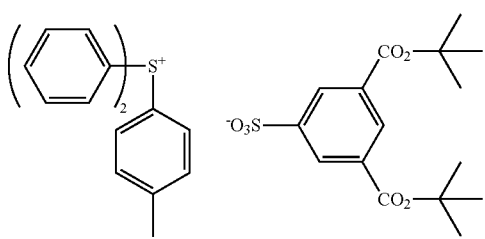
(z83)
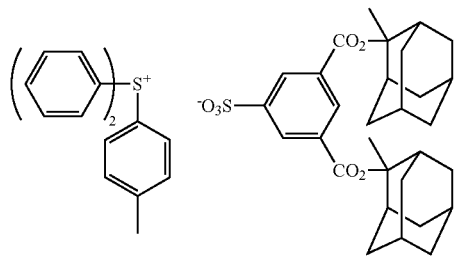
(z84)
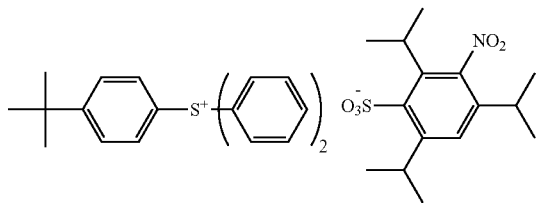

-continued

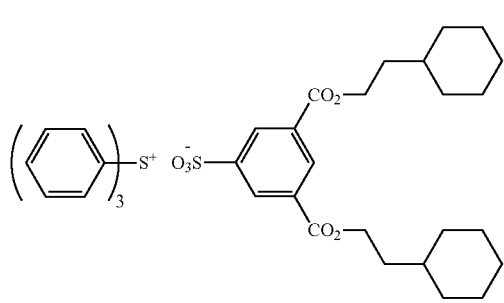
(z85)

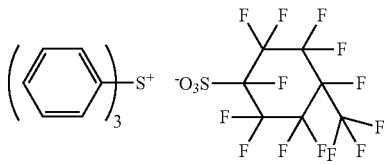
(z86)

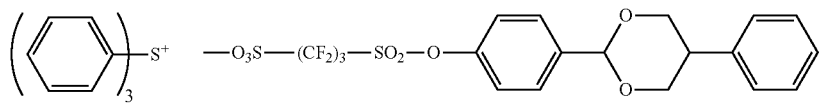
(z87)

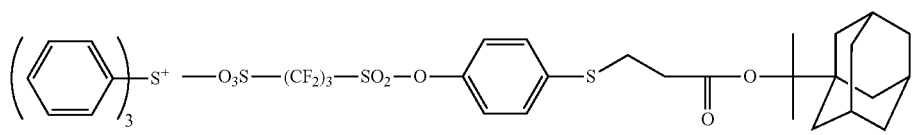
(z88)

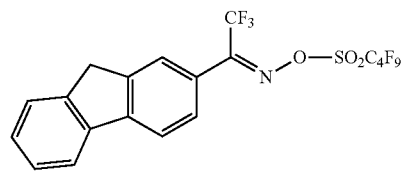
(z89)

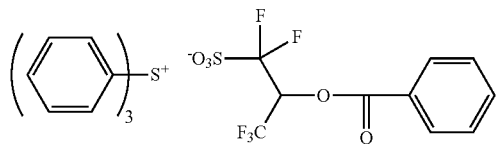
(z90)

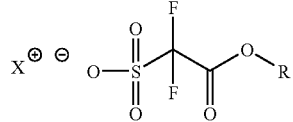
(z91)

As compounds (B) especially preferred for enhancing the effects of the present invention, those represented by general formula (I) below can be exemplified.

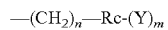
(I)

In the general formula (I), $X^+$ represents an organic counter ion, and R represents a hydrogen atom or a substituent having 1 or more carbon atoms.

R is preferably an organic group having 1 to 40 carbon atoms, more preferably an organic group having 3 to 40 carbon atoms, and most preferably any of the organic groups represented by the following formula (II).

—$(CH_2)_n$—Rc-$(Y)_m$  (II)

In the formula (II),

Rc represents a monocyclic or polycyclic organic group having 3 to 30 carbon atoms that may contain a cyclic ether, cyclic thioether, cyclic ketone, cyclic carbonate ester, lactone or lactam structure.

Y represents a hydroxy group, a halogen atom, a cyano group, a carboxy group, a hydrocarbon group having 1 to 10 carbon atoms, a hydroxyalkyl group having 1 to 10 carbon atoms, an alkoxy group having 1 to 10 carbon atoms, an acyl group having 1 to 10 carbon atoms, an alkoxycarbonyl group having 2 to 10 carbon atoms, an acyloxy group having 2 to 10 carbon atoms, an alkoxyalkyl group having 2 to 10 carbon atoms or a halogenated alkyl group having 1 to 8 carbon atoms.

In the formula, m is an integer of 0 to 6. In the event of multiple Ys, they may be identical to or different from each other.

Further, n is an integer of 0 to 10. The number of carbon atoms constructing each of the groups R expressed by the formula (II) is 40 or less.

As preferred forms of the compounds of the general formula (I), those of the general formulae ($Z_{SC1}$) and ($Z_{IC1}$) can be exemplified.

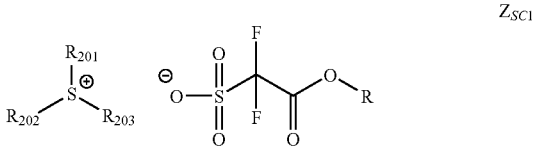
$Z_{SC1}$

-continued $Z_{IC1}$

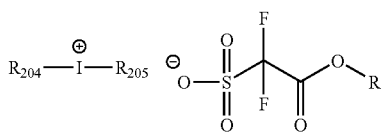

In the general formula ($Z_{SC1}$), the definition of R and preferred scope thereof are the same as in the general formula (I).

Each of $R_{201}$, $R_{202}$ and $R_{203}$ independently represents an organic group.

The number of carbon atoms in each of the organic groups represented by $R_{201}$, $R_{202}$ and $R_{203}$ is generally in the range of 1 to 30, preferably 1 to 20.

Two of $R_{201}$ to $R_{203}$ may be bonded to each other to form a ring, and the ring within the same may contain an oxygen atom, a sulfur atom, an ester bond, an amido bond or a carbonyl group. As the group formed by bonding of two of $R_{201}$ to $R_{203}$, an alkylene group (for example, a butylene group or a pentylene group) can be exemplified.

As organic groups represented by $R_{201}$, $R_{202}$ and $R_{203}$, corresponding groups in the following compounds ($Z_{SC1}$-1), ($Z_{SC1}$-2) and ($Z_{SC1}$-3) can be exemplified.

Appropriate use may be made of compounds with two or more of the structures represented by the general formula ($Z_{SC1}$). For example, use may be made of compounds having a structure wherein at least one of $R_{201}$ to $R_{203}$ of a compound represented by the general formula $Z_{SC1}$ is bonded to at least one of $R_{201}$ to $R_{203}$ of another compound represented by the general formula ($Z_{SC1}$).

As preferred ($Z_{SC1}$) components, the following compounds ($Z_{SC1}$-1), ($Z_{SC1}$-2) and ($Z_{SC1}$-3) can be exemplified.

The compounds ($Z_{SC1}$-1) are arylsulfonium compounds of the general formula ($Z_{SC1}$) wherein at least one of $R_{201}$ to $R_{203}$ is an aryl group, namely, compounds containing an arylsulfonium as a cation. The definition of R and preferred scope thereof are the same as in the general formula (I).

In the arylsulfonium compounds, all of the $R_{201}$ to $R_{203}$ may be aryl groups. It is also appropriate if the $R_{201}$ to $R_{203}$ are partially an aryl group and the remainder is an alkyl group or a cycloalkyl group.

As the arylsulfonium compounds, a triarylsulfonium compound, a diarylalkylsulfonium compound, an aryldialkylsulfonium compound, a diarylcycloalkylsulfonium compound and an aryldicycloalkylsulfonium compound can be exemplified.

The aryl group of the arylsulfonium compounds is preferably a phenyl group or a naphthyl group, more preferably a phenyl group. The aryl group may be one having a heterocyclic structure containing an oxygen atom, a nitrogen atom, a sulfur atom, etc. As the aryl group having a heterocyclic structure, a pyrrole residue (group formed by loss of one hydrogen atom from pyrrole), a furan residue (group formed by loss of one hydrogen atom from furan), a thiophene residue (group formed by loss of one hydrogen atom from thiophene), an indole residue (group formed by loss of one hydrogen atom from indole), a benzofuran residue (group formed by loss of one hydrogen atom from benzofuran), and a benzothiophene residue (group formed by loss of one hydrogen atom from benzothiophene) can be exemplified. When the arylsulfonium compound has two or more aryl groups, the two or more aryl groups may be identical to or different from each other.

The alkyl group or cycloalkyl group contained in the arylsulfonium compound according to necessity is preferably a linear or branched alkyl group having 1 to 15 carbon atoms or a cycloalkyl group having 3 to 15 carbon atoms. As such, a methyl group, an ethyl group, a propyl group, an n-butyl group, a sec-butyl group, a t-butyl group, a cyclopropyl group, a cyclobutyl group, and a cyclohexyl group can be exemplified.

The aryl group, alkyl group or cycloalkyl group represented by $R_{201}$ to $R_{203}$ may have as its substituent an alkyl group (having, for example, 1 to 15 carbon atoms), a cycloalkyl group (having, for example, 3 to 15 carbon atoms), an aryl group (having, for example, 6 to 14 carbon atoms), an alkoxy group (having, for example, 1 to 15 carbon atoms), a halogen atom, a hydroxy group or a phenylthio group. Preferred substituents include a linear or branched alkyl group having 1 to 12 carbon atoms, a cycloalkyl group having 3 to 12 carbon atoms, and a linear, branched or cyclic alkoxy group having 1 to 12 carbon atoms. More preferred substituents include an alkyl group having 1 to 4 carbon atoms and an alkoxy group having 1 to 4 carbon atoms. The substituents may be contained in any one of the three $R_{201}$ to $R_{203}$, or alternatively may be contained in all three of $R_{201}$ to $R_{203}$. When $R_{201}$ to $R_{203}$ represent an aryl group, the substituent preferably lies at the p-position of the aryl group.

Now, the compounds ($Z_{SC1}$-2) will be described.

The compounds ($Z_{SC1}$-2) are compounds of the formula ($Z_{SC1}$) wherein each of $R_{201}$ to $R_{203}$ independently represents an organic group having no aromatic ring. The aromatic rings include an aromatic ring having a heteroatom. The definition of R and preferred scope thereof are the same as in the general formula (I).

The organic group having no aromatic ring represented by $R_{201}$ to $R_{203}$ generally has 1 to 30 carbon atoms, preferably 1 to 20 carbon atoms.

Preferably, each of $R_{201}$ to $R_{203}$ independently represents an alkyl group, a cycloalkyl group, an allyl group or a vinyl group. More preferred groups include a linear or branched 2-oxoalkyl group, a 2-oxocycloalkyl group and an alkoxycarbonylmethyl group. Especially preferred is a linear or branched 2-oxoalkyl group.

As preferred alkyl groups and cycloalkyl groups represented by $R_{201}$ to $R_{203}$, a linear or branched alkyl group having 1 to 10 carbon atoms (for example, a methyl group, an ethyl group, a propyl group, a butyl group or a pentyl group) and a cycloalkyl group having 3 to 10 carbon atoms (for example, a cyclopentyl group, a cyclohexyl group or a norbornyl group) can be exemplified. As more preferred alkyl groups, a 2-oxoalkyl group and an alkoxycarbonylmethyl group can be exemplified. As a more preferred cycloalkyl group, a 2-oxocycloalkyl group can be exemplified.

The 2-oxoalkyl group may be linear or branched. A group having >C=O at the 2-position of the alkyl group is preferred.

The 2-oxocycloalkyl group is preferably a group having >C=O at the 2-position of the cycloalkyl group.

As preferred alkoxy groups of the alkoxycarbonylmethyl group, alkoxy groups having 1 to 5 carbon atoms (a methoxy group, an ethoxy group, a propoxy group, a butoxy group and a pentoxy group) can be exemplified.

The $R_{201}$ to $R_{203}$ may be further substituted with a halogen atom, an alkoxy group (having, for example, 1 to 5 carbon atoms), a hydroxy group, a cyano group or a nitro group.

The compounds ($Z_{SC1}$-3) are those represented by the following general formula ($Z_{SC1}$-3), which have a phenacylsulfonium salt structure.

$Z_{SC1}$-3

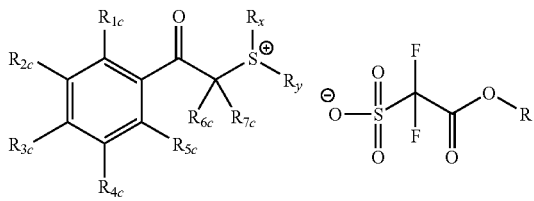

In the general formula ($Z_{SC1}$-3), the definition of R and preferred scope thereof are the same as in the general formula (I).

Each of $R_{1c}$ to $R_{5c}$ independently represents a hydrogen atom, an alkyl group, a cycloalkyl group, an alkoxy group or a halogen atom.

Each of $R_{6c}$ and $R_{7c}$ independently represents a hydrogen atom, an alkyl group or a cycloalkyl group.

Each of $R_x$ and $R_y$ independently represents an alkyl group, a cycloalkyl group, an allyl group or a vinyl group.

Any two or more of $R_{1c}$ to $R_{5c}$; $R_{6c}$ and $R_{7c}$; and $R_x$ and $R_y$ may be bonded to each other to form a ring. This ring may contain an oxygen atom, a sulfur atom, an ester bond or an amido bond. As the group formed by bonding of any two or more of $R_{1c}$ to $R_{5c}$; $R_{6c}$ and $R_{7c}$; and $R_x$ and $R_y$, a butylene group and a pentylene group can be exemplified.

The alkyl group represented by $R_{1c}$ to $R_{7c}$ may be linear or branched. As such, an alkyl group having 1 to 20 carbon atoms, preferably a linear or branched alkyl group having 1 to 12 carbon atoms (for example, a methyl group, an ethyl group, a linear or branched propyl group, a linear or branched butyl group or a linear or branched pentyl group) can be exemplified. As the cycloalkyl group, a cycloalkyl group having 3 to 8 carbon atoms (for example, a cyclopentyl group or a cyclohexyl group) can be exemplified.

The alkoxy group represented by $R_{1c}$ to $R_{5c}$ may be linear, branched, or cyclic. As such, an alkoxy group having 1 to 10 carbon atoms, preferably a linear or branched alkoxy group having 1 to 5 carbon atoms (for example, a methoxy group, an ethoxy group, a linear or branched propoxy group, a linear or branched butoxy group or a linear or branched pentoxy group) and a cycloalkoxy group having 3 to 8 carbon atoms (for example, a cyclopentyloxy group or a cyclohexyloxy group) can be exemplified.

Preferably, any one of $R_{1c}$ to $R_{5c}$ is a linear or branched alkyl group, a cycloalkyl group, or a linear, branched or cyclic alkoxy group. More preferably, the sum of the number of carbon atoms in $R_{1c}$ to $R_{5c}$ is in the range of 2 to 15. Accordingly, there can be attained an enhancement of solvent solubility and inhibition of particle generation during storage.

As the alkyl groups and cycloalkyl groups represented by $R_x$ and $R_y$, the same alkyl groups and cycloalkyl groups as mentioned with respect to $R_{1c}$ to $R_{7c}$ can be exemplified. Among them, a 2-oxoalkyl group, a 2-oxocycloalkyl group and an alkoxycarbonylmethyl group are preferred.

As the 2-oxoalkyl group and 2-oxocycloalkyl group, groups having >C=O at the 2-position of the alkyl group and cycloalkyl group represented by $R_{1c}$ to $R_{7c}$ can be exemplified.

Regarding the alkoxy group of the alkoxycarbonylmethyl group, the same alkoxy groups as mentioned with respect to $R_{1c}$ to $R_{5c}$ can be exemplified.

Each of $R_x$ and $R_y$ is preferably an alkyl group or cycloalkyl group having 4 or more carbon atoms. The alkyl group or cycloalkyl group has more preferably 6 or more carbon atoms and still more preferably 8 or more carbon atoms.

The general formula ($Z_{IC1}$) will be described below.

In the general formula ($Z_{IC1}$), the definition of R and preferred scope thereof are the same as in the general formula (I).

Each of $R_{204}$ and $R_{205}$ independently represents an aryl group, an alkyl group or a cycloalkyl group.

The aryl group represented by $R_{204}$ and $R_{205}$ is preferably a phenyl group or a naphthyl group, more preferably a phenyl group. The aryl group represented by $R_{204}$ and $R_{205}$ may be one having a heterocyclic structure containing an oxygen atom, a nitrogen atom, a sulfur atom, etc. As the aryl group having a heterocyclic structure, a pyrrole residue (group formed by loss of one hydrogen atom from pyrrole), a furan residue (group formed by loss of one hydrogen atom from furan), a thiophene residue (group formed by loss of one hydrogen atom from thiophene), an indole residue (group formed by loss of one hydrogen atom from indole), a benzofuran residue (group formed by loss of one hydrogen atom from benzofuran), and a benzothiophene residue (group formed by loss of one hydrogen atom from benzothiophene) can be exemplified.

The alkyl group and cycloalkyl group represented by $R_{204}$ and $R_{205}$ is preferably a linear or branched alkyl group having 1 to 10 carbon atoms (for example, a methyl group, an ethyl group, a propyl group, a butyl group or a pentyl group) or a cycloalkyl group having 3 to 10 carbon atoms (a cyclopentyl group, a cyclohexyl group or a norbornyl group).

The aryl group, alkyl group or cycloalkyl group represented by $R_{204}$ and $R_{205}$ may have a substituent. As the substituent optionally contained in the aryl group, alkyl group or cycloalkyl group represented by $R_{204}$ and $R_{205}$, an alkyl group (having, for example, 1 to 15 carbon atoms), a cycloalkyl group (having, for example, 3 to 15 carbon atoms), an aryl group (having, for example, 6 to 15 carbon atoms), an alkoxy group (having, for example, 1 to 15 carbon atoms), a halogen atom, a hydroxy group, and a phenylthio group can be exemplified.

Specific examples of the compounds represented by the general formula (I) are shown below.

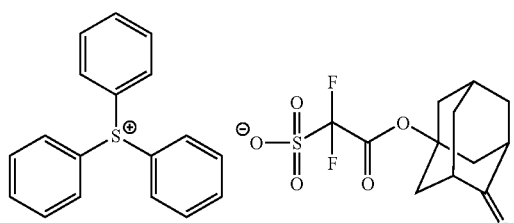

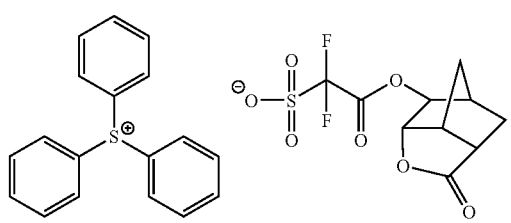

83
-continued
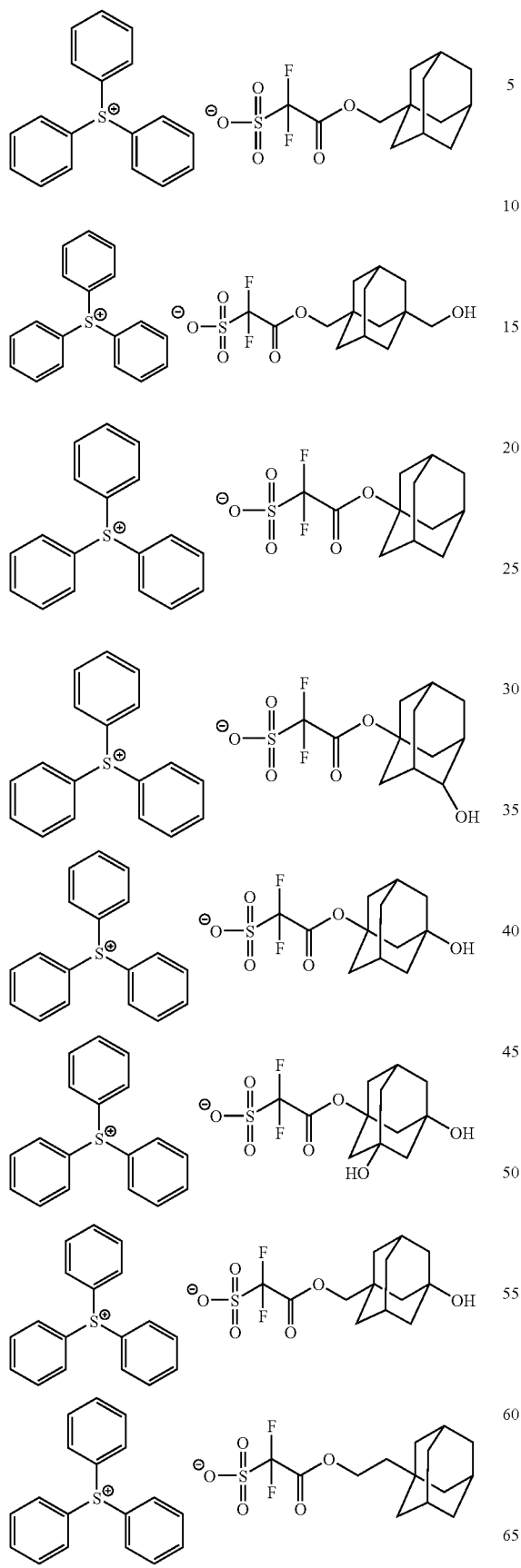
84
-continued
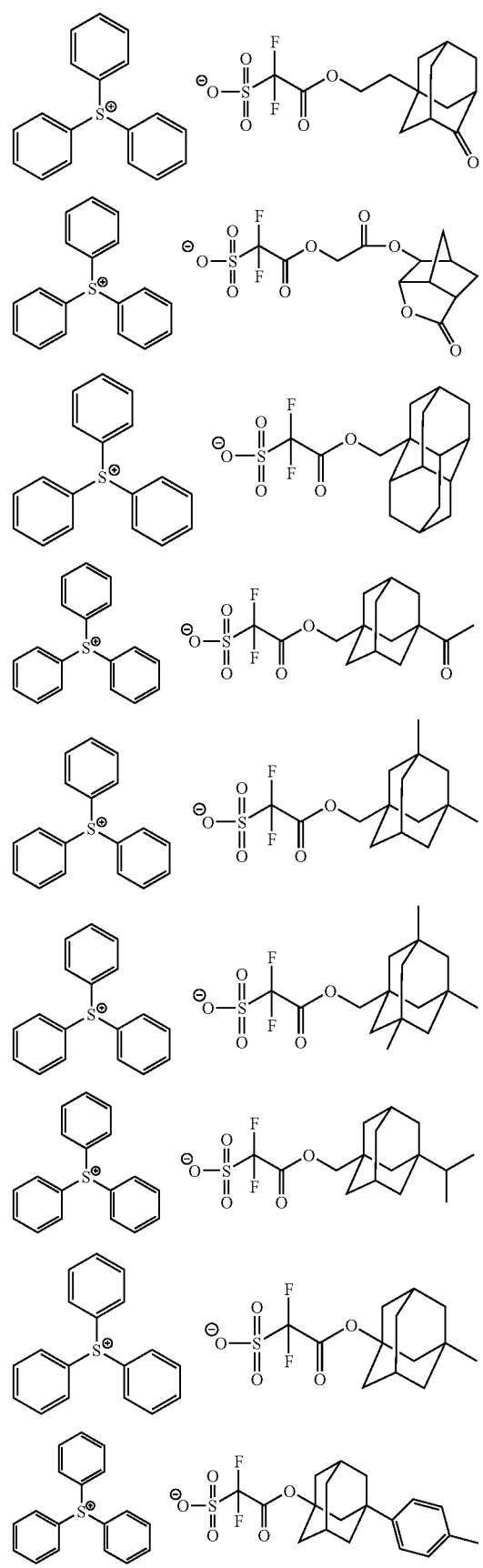

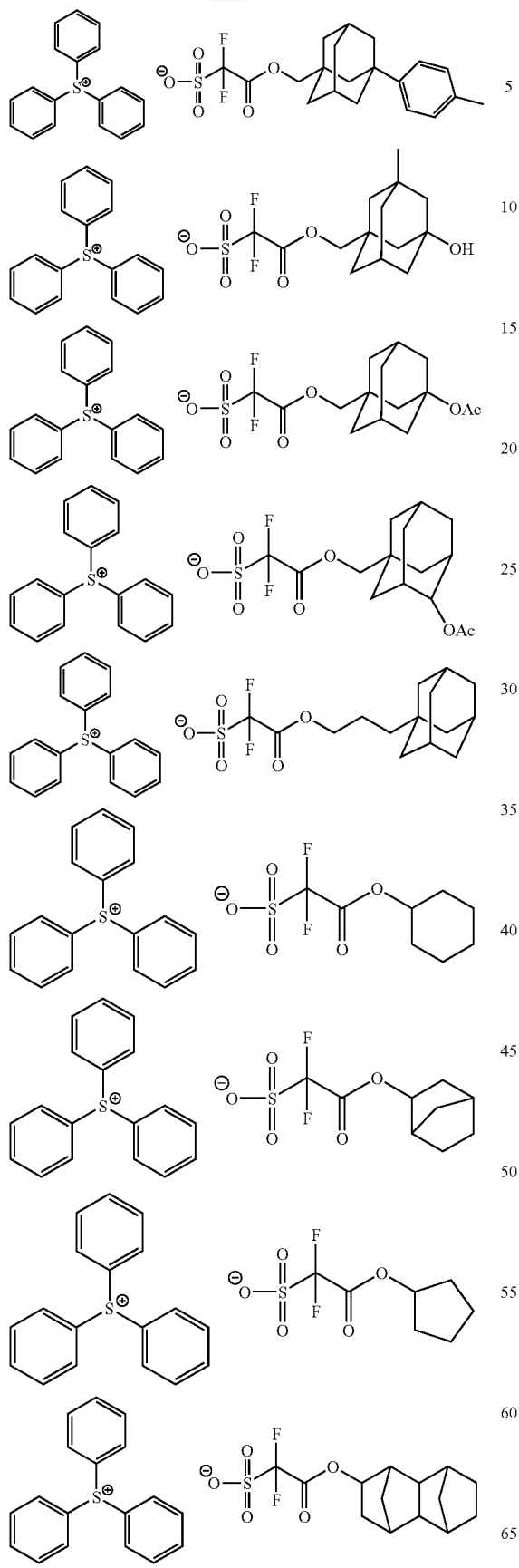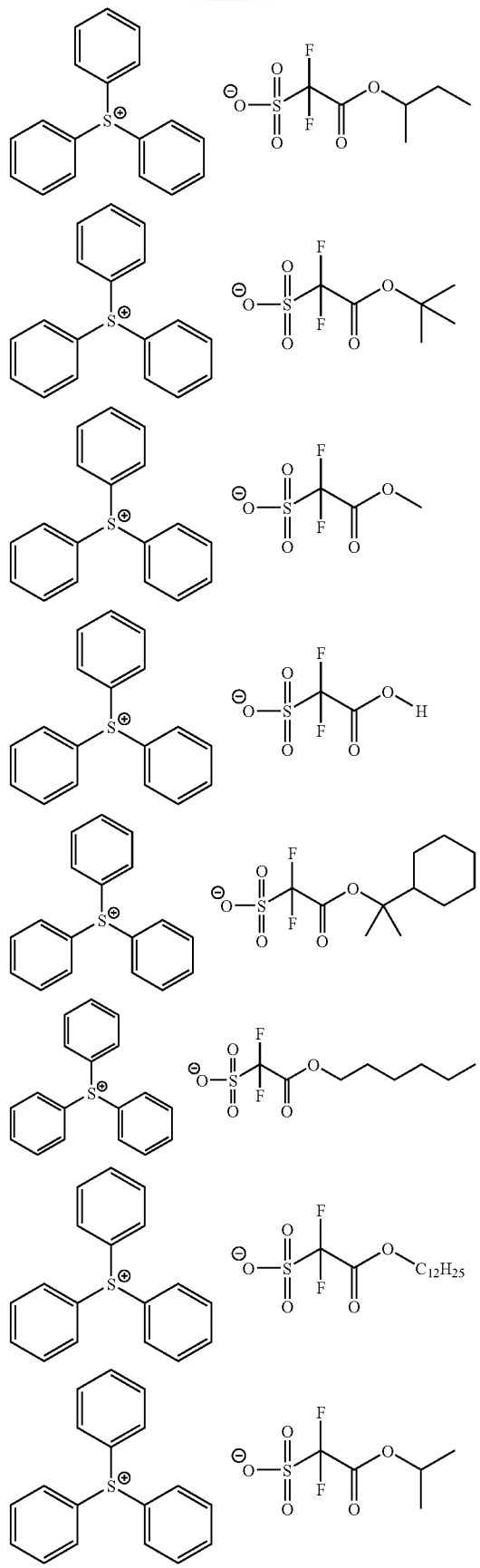

87
-continued
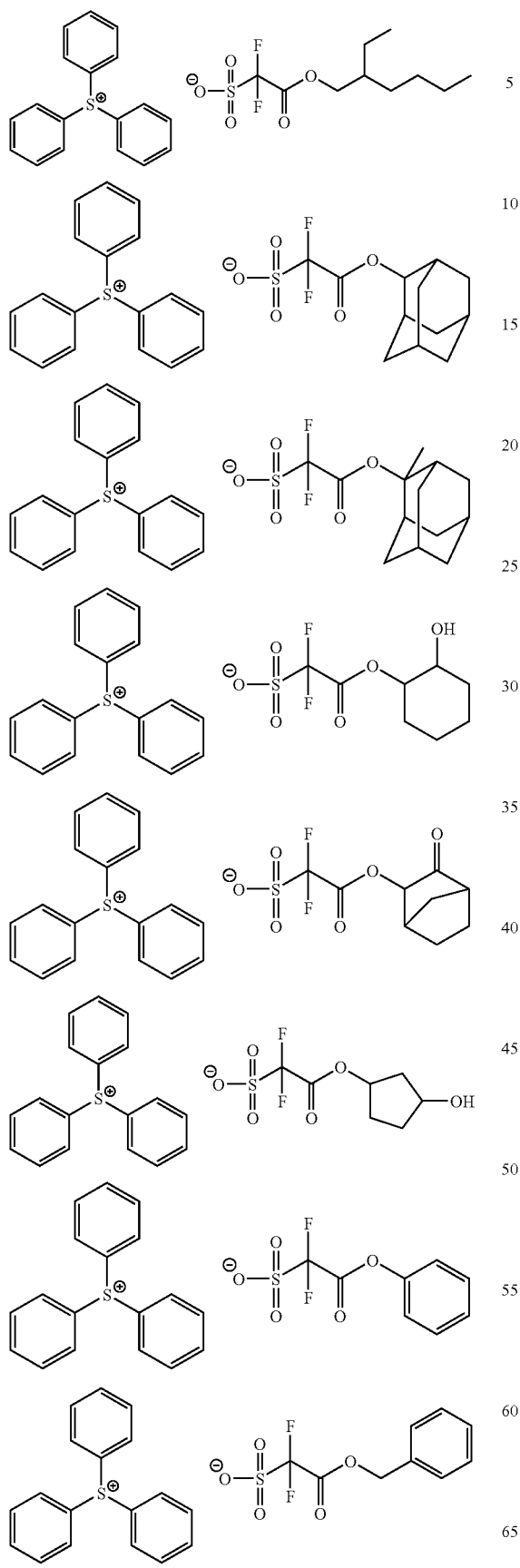
88
-continued
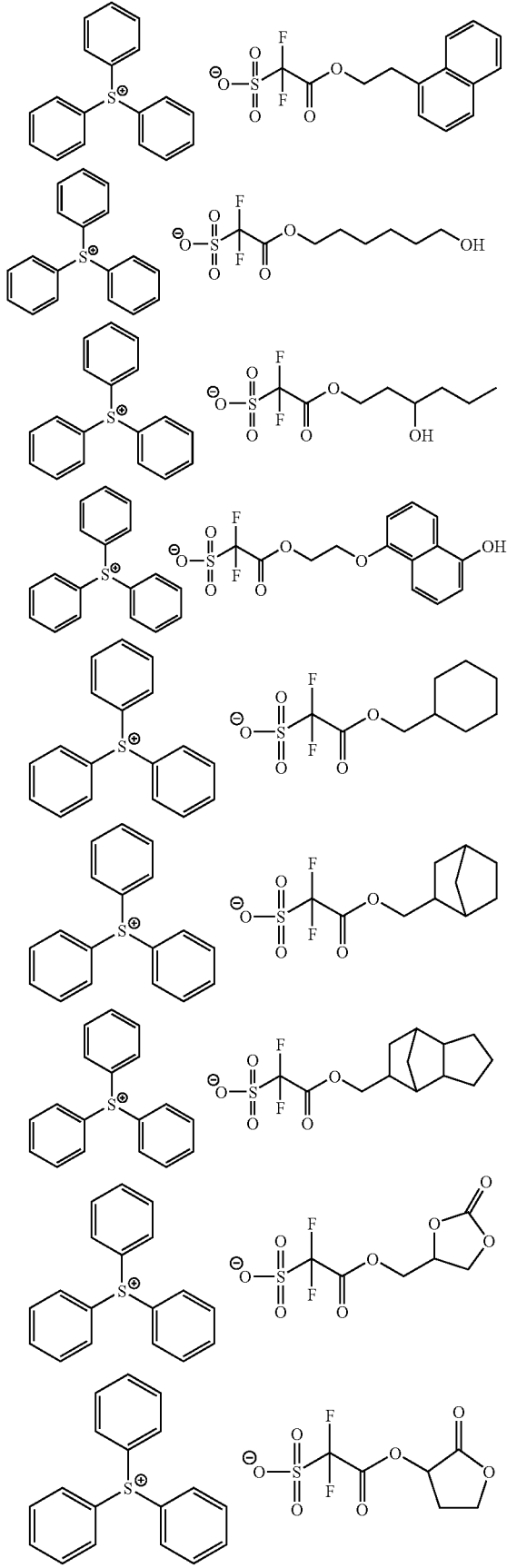

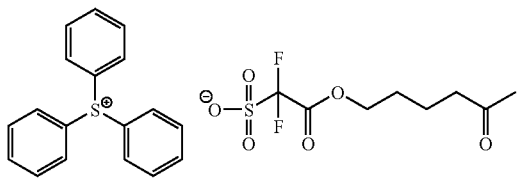

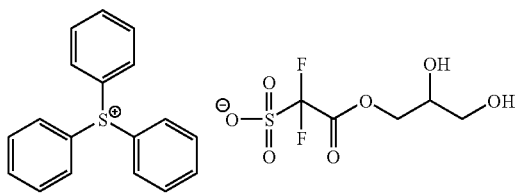

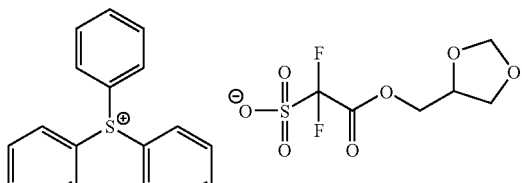

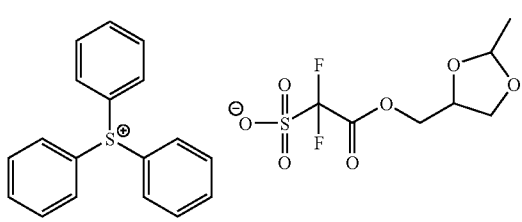

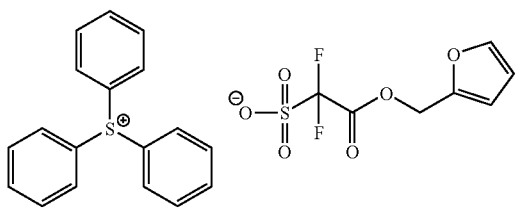

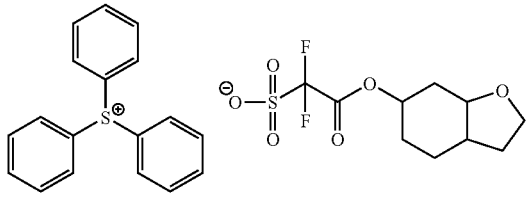

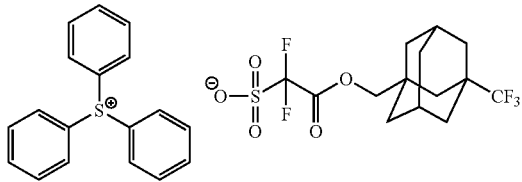

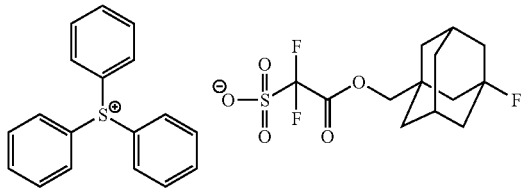

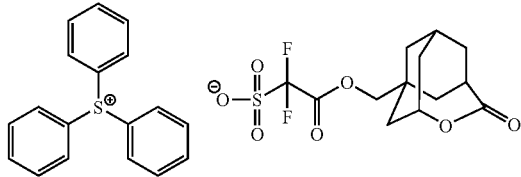

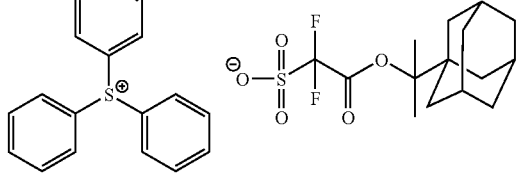

The acid generators can be used either individually or in combination.

The content of the acid generators in the actinic ray-sensitive or radiation-sensitive resin composition based on the total solids of the actinic ray-sensitive or radiation-sensitive resin composition is preferably in the range of 0.1 to 40 mass %, more preferably 0.5 to 30 mass %, and still more preferably 1 to 25 mass %.

[Solvent]

The photosensitive composition according to the present invention may contain a solvent. The solvent is not limited as long as it can be used in the preparation of a positive resist composition through dissolution of the above-mentioned components. As the solvent, an organic solvent such as an alkylene glycol monoalkyl ether carboxylate, an alkylene glycol monoalkyl ether, an alkyl lactate, an alkyl alkoxypropionate, a cyclolactone (preferably having 4 to 10 carbon atoms), an optionally cyclized monoketone compound (preferably having 4 to 10 carbon atoms), an alkylene carbonate, an alkyl alkoxyacetate and an alkyl pyruvate can be exemplified.

As preferred alkylene glycol monoalkyl ether carboxylates, propylene glycol monomethyl ether acetate, propylene glycol monoethyl ether acetate, propylene glycol monopropyl ether acetate, propylene glycol monobutyl ether acetate, propylene glycol monomethyl ether propionate, propylene glycol monoethyl ether propionate, ethylene glycol monomethyl ether acetate, and ethylene glycol monoethyl ether acetate can be exemplified.

As preferred alkylene glycol monoalkyl ethers, propylene glycol monomethyl ether, propylene glycol monoethyl ether, propylene glycol monopropyl ether, propylene glycol monobutyl ether, ethylene glycol monomethyl ether, and ethylene glycol monoethyl ether can be exemplified.

As preferred alkyl lactates, methyl lactate, ethyl lactate, propyl lactate and butyl lactate can be exemplified.

As preferred alkyl alkoxypropionates, ethyl 3-ethoxypropionate, methyl 3-methoxypropionate, methyl 3-ethoxypropionate, and ethyl 3-methoxypropionate can be exemplified.

As preferred cyclolactones, β-propiolactone, β-butyrolactone, γ-butyrolactone, α-methyl-γ-butyrolactone, β-methyl-γ-butyrolactone, γ-valerolactone, γ-caprolactone, γ-octanoic lactone, and α-hydroxy-γ-butyrolactone can be exemplified.

As preferred optionally cyclized monoketone compounds, 2-butanone, 3-methylbutanone, pinacolone, 2-pentanone, 3-pentanone, 3-methyl-2-pentanone, 4-methyl-2-pentanone, 2-methyl-3-pentanone, 4,4-dimethyl-2-pentanone, 2,4-dimethyl-3-pentanone, 2,2,4,4-tetramethyl-3-pentanone, 2-hexanone, 3-hexanone, 5-methyl-3-hexanone, 2-heptanone, 3-heptanone, 4-heptanone, 2-methyl-3-heptanone, 5-methyl- 3-heptanone, 2,6-dimethyl-4-heptanone, 2-octanone, 3-octanone, 2-nonanone, 3-nonanone, 5-nonanone, 2-decanone, 3-decanone, 4-decanone, 5-hexen-2-one, 3-penten-2-one, cyclopentanone, 2-methylcyclopentanone, 3-methylcyclopentanone, 2,2-dimethylcyclopentanone, 2,4,4-trimethylcyclopentanone, cyclohexanone, 3-methylcyclohexanone, 4-methylcyclohexanone, 4-ethylcyclohexanone, 2,2-dimethylcyclohexanone, 2,6-dimethylcyclohexanone, 2,2,6-trimethylcyclohexanone, cycloheptanone, 2-methylcycloheptanone, and 3-methylcycloheptanone can be exemplified.

As preferred alkylene carbonates, propylene carbonate, vinylene carbonate, ethylene carbonate, and butylene carbonate can be exemplified.

As preferred alkyl alkoxyacetates, acetic acid 2-methoxyethyl ester, acetic acid 2-ethoxyethyl ester, acetic acid 2-(2-ethoxyethoxy)ethyl ester, acetic acid 3-methoxy-3-methylbutyl ester, and acetic acid 1-methoxy-2-propyl ester can be exemplified.

As preferred alkyl pyruvates, methyl pyruvate, ethyl pyruvate and propyl pyruvate can be exemplified.

As a preferably employable solvent, a solvent having a boiling point measured at ordinary temperature under ordinary pressure of 130° C. or above can be mentioned. As the solvent, cyclopentanone, γ-butyrolactone, cyclohexanone, ethyl lactate, ethylene glycol monoethyl ether acetate, propylene glycol monomethyl ether acetate, ethyl 3-ethoxypropionate, ethyl pyruvate, acetic acid 2-ethoxyethyl ester, acetic acid 2-(2-ethoxyethoxy)ethyl ester, and propylene carbonate can be exemplified.

In the present invention, these solvents may be used either individually or in combination.

In the present invention, a mixed solvent consisting of a mixture of a solvent having a hydroxy group in its structure and a solvent having no hydroxy group may be used as the organic solvent.

As the solvent having a hydroxy group, ethylene glycol, ethylene glycol monomethyl ether, ethylene glycol monoethyl ether, propylene glycol, propylene glycol monomethyl ether, propylene glycol monoethyl ether, and ethyl lactate can be exemplified. Of these, propylene glycol monomethyl ether, and ethyl lactate are especially preferred.

As the solvent having no hydroxy group, propylene glycol monomethyl ether acetate, ethyl ethoxypropionate, 2-heptanone, γ-butyrolactone, cyclohexanone, butyl acetate, N-methylpyrrolidone, N,N-dimethylacetamide, and dimethyl sulfoxide can be exemplified. Of these, propylene glycol monomethyl ether acetate, ethyl ethoxypropionate, 2-heptanone, γ-butyrolactone, cyclohexanone, and butyl acetate are especially preferred. Among them, propylene glycol monomethyl ether acetate, ethyl ethoxypropionate and 2-heptanone are most preferred.

The mixing ratio (in terms of mass) between a solvent having a hydroxy group and a solvent having no hydroxy group is in the range of 1/99 to 99/1, preferably 10/90 to 90/10, and more preferably 20/80 to 60/40. The mixed solvent containing 50 mass % or more of a solvent having no hydroxy group is especially preferred from the viewpoint of uniform applicability.

It is preferred for the solvent to be a mixed solvent consisting of two or more solvents and to contain propylene glycol monomethyl ether acetate.

[Basic Compound]

The actinic ray-sensitive or radiation-sensitive resin composition according to the present invention preferably contains a basic compound so as to decrease performance alteration over time from exposure to heating.

As preferred basic compounds, the compounds having the structures represented by the following formulae (A) to (E) can be exemplified.

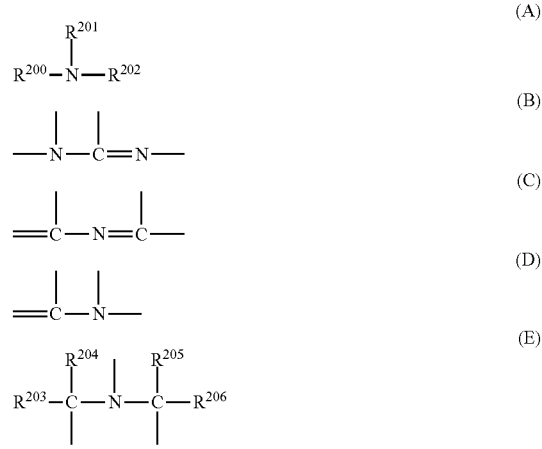

In the general formulae (A) and (E), $R^{200}$, $R^{201}$ and $R^{202}$ may be identical to or different from each other and each represents a hydrogen atom, an alkyl group (preferably having 1 to 20 carbon atoms), a cycloalkyl group (preferably having 3 to 20 carbon atoms) or an aryl group (having 6 to 20 carbon atoms). $R^{201}$ and $R^{202}$ may be bonded to each other to form a ring.

$R^{203}$, $R^{204}$, $R^{205}$ and $R^{206}$ may be identical to or different from each other and each represents an alkyl group having 1 to 20 carbon atoms.

With respect to the above alkyl group, as a preferred substituted alkyl group, an aminoalkyl group having 1 to 20 carbon atoms, a hydroxyalkyl group having 1 to 20 carbon atoms, and a cyanoalkyl group having 1 to 20 carbon atoms can be exemplified.

More preferably, the alkyl groups in the general formulae (A) and (E) are unsubstituted.

As preferred compounds, guanidine, aminopyrrolidine, pyrazole, pyrazoline, piperazine, aminomorpholine, aminoalkylmorpholine and piperidine can be exemplified. As more preferred compounds, those with an imidazole structure, a diazabicyclo structure, an onium hydroxide structure, an onium carboxylate structure, a trialkylamine structure, an aniline structure or a pyridine structure, alkylamine derivatives having a hydroxy group and/or an ether bond, and aniline derivatives having a hydroxy group and/or an ether bond can be exemplified.

As the compounds with an imidazole structure, imidazole, 2,4,5-triphenylimidazole, benzimidazole, and 2-phenylbenzoimidazole can be exemplified. As the compounds with a diazabicyclo structure, 1,4-diazabicyclo[2,2,2]octane, 1,5-diazabicyclo[4,3,0]non-5-ene, and 1,8-diazabicyclo[5,4,0]undec-7-ene can be exemplified. As the compounds with an onium hydroxide structure, tetrabutylammonium hydroxide, triarylsulfonium hydroxide, phenacylsulfonium hydroxide, and sulfonium hydroxides having a 2-oxoalkyl group, such as triphenylsulfonium hydroxide, tris(t-butylphenyl)sulfonium hydroxide, bis(t-butylphenyl)iodonium hydroxide, phenacylthiophenium hydroxide, and 2-oxopropylthiophenium hydroxide can be exemplified. As the compounds with an onium carboxylate structure, those having a carboxylate at the anion moiety of the compounds with an onium hydroxide structure, such as acetate, adamantane-1-carboxylate, and perfluoroalkyl carboxylate can be exemplified. As the compounds with a trialkylamine structure, tri(n-butyl)amine and tri(n-octyl)amine can be exemplified. As the aniline compounds, 2,6-diisopropylaniline, N,N-dimethylaniline, N,N-dibutylaniline, and N,N-dihexylaniline can be exemplified. As the alkylamine derivatives having a hydroxy group and/or an ether bond, ethanolamine, diethanolamine, triethanolamine, N-phenyldiethanolamine, and tris(methoxyethoxyethyl)amine can be exemplified. As the aniline derivatives having a hydroxy group and/or an ether bond, N,N-bis(hydroxyethyl)aniline can be exemplified.

As preferred basic compounds, an amine compound having a phenoxy group, an ammonium salt compound having a phenoxy group, an amine compound having a sulfonic ester group, and an ammonium salt compound having a sulfonic ester group can further be exemplified.

As the amine compound, use can be made of primary, secondary and tertiary amine compounds. An amine compound having its at least one alkyl group bonded to the nitrogen atom thereof is preferred. Among the amine compounds, a tertiary amine compound is more preferred. In the amine compounds, as long as at least one alkyl group (preferably having 1 to 20 carbon atoms) is bonded to the nitrogen atom, a cycloalkyl group (preferably having 3 to 20 carbon atoms) or an aryl group (preferably having 6 to 12 carbon atoms) besides the alkyl group may be bonded to the nitrogen atom. In the amine compounds, it is preferred for the alkyl chain to contain an oxygen atom to form an oxyalkylene group. The number of oxyalkylene groups in each molecule is one or more, preferably 3 to 9, and more preferably 4 to 6. The oxyalkylene group is preferably an oxyethylene group (—$CH_2CH_2O$—) or an oxypropylene group (—$CH(CH_3)CH_2O$— or —$CH_2CH_2CH_2O$—), more preferably an oxyethylene group (—$CH_2CH_2O$—).

As the ammonium salt compound, use can be made of primary, secondary, tertiary and quaternary ammonium salt compounds. An ammonium salt compound having its at least one alkyl group bonded to the nitrogen atom thereof is preferred. Of the ammonium salt compounds, as long as at least one alkyl group (preferably having 1 to 20 carbon atoms) is bonded to the nitrogen atom, a cycloalkyl group (preferably having 3 to 20 carbon atoms) or an aryl group (preferably having 6 to 12 carbon atoms) besides the alkyl group may be bonded to the nitrogen atom. Of the ammonium salt compounds, it is preferred for the alkyl chain to contain an oxygen atom to form an oxyalkylene group. The number of oxyalkylene groups in each molecule is one or more, preferably 3 to 9, and more preferably 4 to 6. The oxyalkylene group is preferably an oxyethylene group (—$CH_2CH_2O$—) or an oxypropylene group (—$CH(CH_3)CH_2O$— or —$CH_2CH_2CH_2O$—), more preferably an oxyethylene group (—$CH_2CH_2O$—).

As the anion of the ammonium salt compounds, a halide, a sulfonate, a borate and a phosphate can be exemplified. Of these, a halide and a sulfonate are preferred. Among halides, a chloride, a bromide and an iodide are especially preferred. Among sulfonates, an organic sulfonate having 1 to 20 carbon atoms is especially preferred. As the organic sulfonate, an aryl sulfonate and an alkyl sulfonate having 1 to 20 carbon atoms can be exemplified. The alkyl group of the alkyl sulfonate may have a substituent. As the substituent, a fluorine atom, a chlorine atom, a bromine atom, an alkoxy group, an acyl group, and an aryl group can be exemplified. As specific examples of the alkyl sulfonates, methane sulfonate, ethane sulfonate, butane sulfonate, hexane sulfonate, octane sulfonate, benzyl sulfonate, trifluoromethane sulfonate, pentafluoroethane sulfonate, and nonafluorobutane sulfonate can be exemplified. As the aryl group of the aryl sulfonate, a benzene ring, a naphthalene ring, and an anthracene ring can be exemplified. The benzene ring, naphthalene ring or anthracene ring may have a substituent. As preferred substituents, a linear or branched alkyl group having 1 to 6 carbon atoms and a cycloalkyl group having 3 to 6 carbon atoms can be exemplified. As specific examples of the linear or branched alkyl groups and cycloalkyl groups, methyl, ethyl, n-propyl, isopropyl, n-butyl, i-butyl, t-butyl, n-hexyl, and cyclohexyl group can be exemplified. As other substituents, an alkoxy group having 1 to 6 carbon atoms, a halogen atom, a cyano group, a nitro group, an acyl group, and an acyloxy group can be exemplified.

The amine compound having a phenoxy group and ammonium salt compound having a phenoxy group are those having a phenoxy group at the opposite end of the alkyl group to the nitrogen atom of the amine compound or ammonium salt compound. The phenoxy group may have a substituent. As the substituent of the phenoxy group, an alkyl group, an alkoxy group, a halogen atom, a cyano group, a nitro group, a carboxy group, a carboxylic ester group, a sulfonic ester group, an aryl group, an aralkyl group, an acyloxy group, and an aryloxy group can be exemplified. The substitution position of the substituent may be any of 2- to 6-positions. The number of substituents is optional within the range of 1 to 5.

It is preferred that at least one oxyalkylene group exist between the phenoxy group and the nitrogen atom. The number of oxyalkylene groups in each molecule is one or more, preferably 3 to 9, and more preferably 4 to 6. The oxyalkylene group is preferably an oxyethylene group (—$CH_2CH_2O$—) or an oxypropylene group (—$CH(CH_3)CH_2O$— or —$CH_2CH_2CH_2O$—), more preferably an oxyethylene group (—$CH_2CH_2O$—).

The sulfonic ester group of the amine compound having a sulfonic ester group or ammonium salt compound having a sulfonic ester group may be any of an alkylsulfonic ester group, a cycloalkylsulfonic ester group, and an arylsulfonic ester group. In the alkylsulfonic ester group, the alkyl group preferably has 1 to 20 carbon atoms. In the cycloalkylsulfonic ester group, the cycloalkyl group preferably has 3 to 20 carbon atoms. In the arylsulfonic ester group, the aryl group preferably has 6 to 12 carbon atoms. The alkylsulfonic ester group, cycloalkylsulfonic ester group, and arylsulfonic ester group may have substituents. As preferred substituents, a halogen atom, a cyano group, a nitro group, a carboxy group, a carboxylic ester group and a sulfonic ester group can be exemplified.

It is preferred that at least one oxyalkylene group exist between the sulfonic ester group and the nitrogen atom. The number of oxyalkylene groups in each molecule is one or more, preferably 3 to 9, and more preferably 4 to 6. The oxyalkylene group is preferably an oxyethylene group (—$CH_2CH_2O$—) or an oxypropylene group (—$CH(CH_3)CH_2O$— or —$CH_2CH_2CH_2O$—), more preferably an oxyethylene group (—$CH_2CH_2O$—).

These basic compounds are used either individually or in combination.

The amount of basic compound used based on the solid contents of the actinic ray-sensitive or radiation-sensitive resin composition is generally in the range of 0.001 to 10 mass %, preferably 0.01 to 5 mass %.

The molar ratio of the acid generator to basic compound used in the composition is preferably in the range of 2.5 to 300. The molar ratio is preferred to be 2.5 or higher from the viewpoint of sensitivity and resolving power. The molar ratio is preferred to be 300 or below from the viewpoint of the inhibition of any resolving power deterioration due to thickening of resist pattern over time from exposure to heating treatment. The ratio of acid generator/basic compound is more preferably in the range of 5.0 to 200, and still more preferably 7.0 to 150.

[Surfactant]

The actinic ray-sensitive or radiation-sensitive resin composition according to the present invention preferably further contains a surfactant, and more preferably contains any one, or two or more members, of fluorinated and/or siliconized surfactants (fluorinated surfactant, siliconized surfactant, and surfactant containing both fluorine and silicon atoms).

The actinic ray-sensitive or radiation-sensitive resin composition according to the present invention when containing the above surfactant would, in the use of an exposure light source of 250 nm or below, especially 220 nm or below, realize favorable sensitivity and resolving power and produce a resist pattern with less adhesion and development defects.

As the fluorinated and/or siliconized surfactants, those described in JP-A's-62-36663, 61-226746, 61-226745, 62-170950, 63-34540, 7-230165, 8-62834, 9-54432, 9-5988 and 2002-277862 and U.S. Pat. Nos. 5,405,720, 5,360,692, 5,529,881, 5,296,330, 5,436,098, 5,576,143, 5,294,511 and 5,824,451 can be exemplified. Any of the following commercially available surfactants can be used as is.

As useful commercially available surfactants, fluorinated surfactants or siliconized surfactants, such as Eftop EF301 and EF303 (produced by Shin-Akita Kasei Co., Ltd.), Florad FC 430, 431 and 4430 (produced by Sumitomo 3M Ltd.), Megafac F171, F173, F176, F189, F113, F110, F177, F120 and R08 (produced by Dainippon Ink & Chemicals, Inc.), Surflon S-382, SC101, 102, 103, 104, 105 and 106 (produced by Asahi Glass Co., Ltd.), Troy Sol S-366 (produced by Troy Chemical Co., Ltd.), GF-300 and GF-150 (produced by TOA-GOSEI CO., LTD.), Sarfron S-393 (produced by SEIMI CHEMICAL CO., LTD.), Eftop EF121, EF122A, EF122B, RF122C, EF125M, EF135M, EF351, EF352, EF801, EF802 and EF601 (produced by JEMCO INC.), PF636, PF656, PF6320 and PF6520 (produced by OMNOVA), and FTX-204G, 208G, 218G, 230G, 204D, 208D, 212D, 218D and 222D (produced by NEOS) can be exemplified. Further, polysiloxane polymer KP-341 (produced by Shin-Etsu Chemical Co., Ltd.) can be employed as the siliconized surfactant.

As the surfactant, besides the above publicly known surfactants, use can be made of a surfactant based on a polymer having a fluorinated aliphatic group derived from a fluorinated aliphatic compound, produced by a telomerization technique (also called a telomer process) or an oligomerization technique (also called an oligomer process). The fluorinated aliphatic compound can be synthesized by the process described in JP-A-2002-90991.

The polymer having a fluorinated aliphatic group is preferably a copolymer from a monomer having a fluorinated aliphatic group and a poly(oxyalkylene) acrylate and/or poly (oxyalkylene) methacrylate, in which copolymer may have an irregular distribution or may result from block copolymerization. As the poly(oxyalkylene) group, a poly(oxyethylene) group, a poly(oxypropylene) group, and a poly(oxybutylene) group can be exemplified. Further, use can be made of a unit having alkylene groups of different chain lengths in a single chain, such as poly(oxyethylene-oxypropylene-oxyethylene block concatenation) or poly(oxyethylene-oxypropylene block concatenation). Moreover, the copolymer from a monomer having a fluorinated aliphatic group and a poly (oxyalkylene) acrylate (or methacrylate) is not limited to two-monomer copolymers and may be a three or more monomer copolymer obtained by simultaneous copolymerization of two or more different monomers having a fluorinated aliphatic group, two or more different poly(oxyalkylene) acrylates (or methacrylates), etc.

As a commercially available surfactant, Megafac F178, F-470, F-473, F-475, F-476 and F-472 (produced by Dainippon Ink & Chemicals, Inc.) can be exemplified. A copolymer from an acrylate (or methacrylate) having a $C_6F_{13}$ group and a poly(oxyalkylene) acrylate (or methacrylate); and a copolymer from an acrylate (or methacrylate) having a $C_3F_7$ group, poly(oxyethylene) acrylate (or methacrylate), and poly(oxypropylene) acrylate (or methacrylate) can further be exemplified.

In the present invention, surfactants other than the fluorinated and/or siliconized surfactants can also be employed. Specifically, nonionic surfactants including a polyoxyethylene alkyl ether such as polyoxyethylene lauryl ether, polyoxyethylene stearyl ether, polyoxyethylene cetyl ether or polyoxyethylene oleyl ether, a polyoxyethylene alkylaryl ether such as polyoxyethylene octylphenol ether or polyoxyethylene nonylphenol ether, a polyoxyethylene-polyoxypropylene block copolymer, a sorbitan fatty acid ester such as sorbitan monolaurate, sorbitan monopalmitate, sorbitan monostearate, sorbitan monooleate, sorbitan trioleate or sorbitan tristearate, and a polyoxyethylene sorbitan fatty acid ester such as polyoxyethylene sorbitan monolaurate, polyoxyethylene sorbitan monopalmitate, polyoxyethylene sorbitan monostearate, polyoxyethylene sorbitan trioleate or polyoxyethylene sorbitan tristearate can be exemplified.

These surfactants may be used either individually or in combination.

The amount of each surfactant used based on the total mass of the actinic ray-sensitive or radiation-sensitive resin composition (excluding the solvent) is preferably in the range of 0 to 2 mass %, more preferably 0.0001 to 2 mass %, and most preferably 0.0005 to 1 mass %.

[Carboxylic Acid Onium Salt]

The actinic ray-sensitive or radiation-sensitive resin composition according to the present invention may contain a carboxylic acid onium salt. As the carboxylic acid onium salt, a carboxylic acid sulfonium salt, a carboxylic acid iodonium salt, and a carboxylic acid ammonium salt can be exemplified. The especially preferred carboxylic acid onium salts are the iodonium salt and the sulfonium salt. It is preferred for the carboxylate residue of the carboxylic acid onium salt for use in the present invention to be one containing neither an aromatic group nor a carbon-carbon double bond. In particular, the especially preferred anion moiety thereof is a linear, branched, monocyclic or polycyclic alkylcarboxylate anion having 1 to 30 carbon atoms. A more preferred anion moiety is an anion of carboxylic acid wherein the alkyl group is partially or wholly fluorinated. The alkyl chain may contain an oxygen atom. Accordingly, there would be achieved securement of the transparency in 220 nm or shorter light, enhancement of the sensitivity and resolving power, and improvement of the dependency on density distribution and exposure margin.

As the fluorinated carboxylic acid anion, any of the anions of fluoroacetic acid, difluoroacetic acid, trifluoroacetic acid, pentafluoropropionic acid, heptafulorobutyric acid, nonafluoropentanoic acid, perfluorododecanoic acid, perfluorotridecanoic acid, perfluorocyclohexanecarboxylic acid, and 2,2-bistrifluoromethylpropionic acid can be exemplified.

These carboxylic acid onium salts can be synthesized by reacting a sulfonium hydroxide, an iodonium hydroxide or an ammonium hydroxide and a carboxylic acid with silver oxide in an appropriate solvent.

The content of each carboxylic acid onium salt in the composition based on the total solids of the composition is generally in the range of 0.1 to 20 mass %, preferably 0.5 to 10 mass %, and still more preferably 1 to 7 mass %.

[Dissolution Inhibiting Compound]

The actinic ray-sensitive or radiation-sensitive resin composition according to the present invention may contain a dissolution inhibiting compound of 3000 or less molecular weight that is decomposed by the action of an acid to increase the solubility in an alkali developer (hereinafter referred to as "dissolution inhibiting compound").

From the viewpoint of preventing lowering of the transmission at the wavelength of 220 nm or shorter, the dissolution inhibiting compound is preferably an alicyclic or aliphatic compound having an acid-decomposable group, such as any of cholic acid derivatives having an acid-decomposable group described in Proceeding of SPIE, 2724, 355 (1996). The acid-decomposable group and alicyclic structure can be the same as described with respect to the resin as the component (A).

When the actinic ray-sensitive or radiation-sensitive resin composition according to the present invention is exposed to a KrF excimer laser or irradiated with electron beams, preferred use is made of one having a structure resulting from substitution of the phenolic hydroxy group of a phenol compound with an acid-decomposable group. The phenol compound preferably contains 1 to 9 phenol skeletons, more preferably 2 to 6 phenol skeletons.

In the present invention, the molecular weight of the dissolution inhibiting compound is 3000 or less, preferably in the range of 300 to 3000, and more preferably 500 to 2500.

The amount of dissolution inhibiting compound added based on the total solids of the actinic ray-sensitive or radiation-sensitive resin composition is preferably in the range of 3 to 50 mass %, more preferably 5 to 40 mass %.

Specific examples of the dissolution inhibiting compounds will be shown below, which however in no way limit the scope of the present invention.

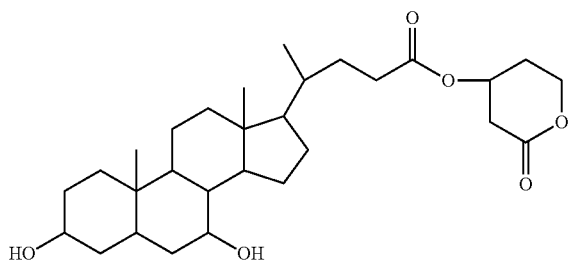

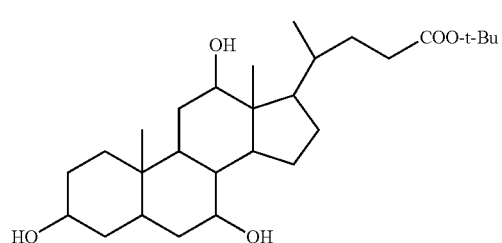

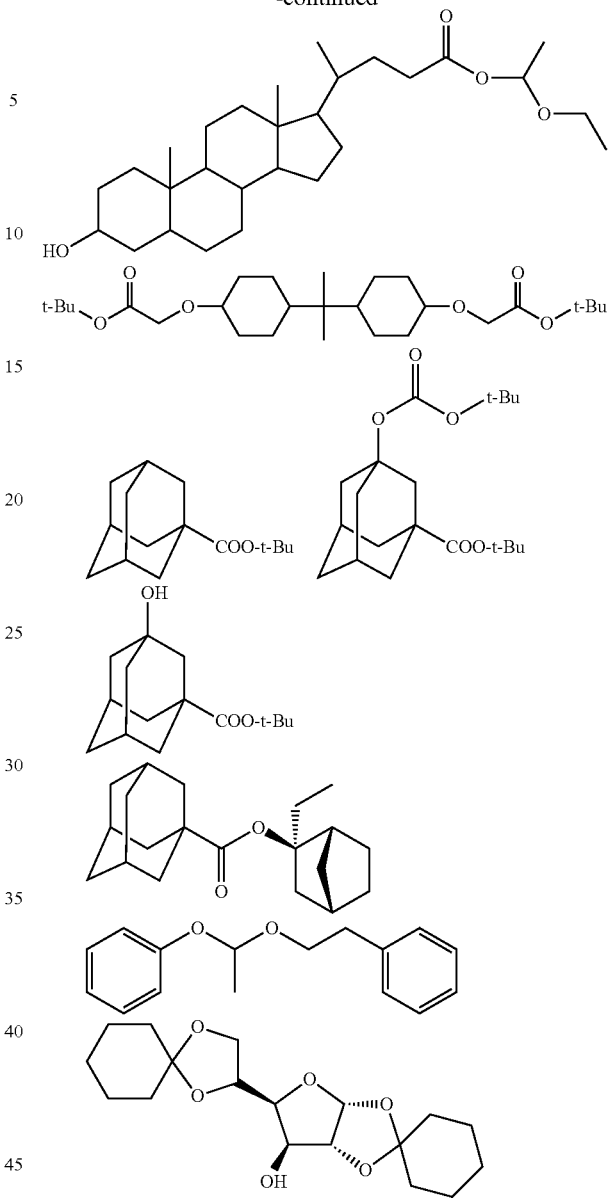

[Other Additives]

The actinic ray-sensitive or radiation-sensitive resin composition according to the present invention may further contain a dye, a plasticizer, a photosensitizer, a light absorber, a compound capable of increasing the solubility in a developer (for example, a phenolic compound of 1000 or less molecular weight or a carboxylated alicyclic or aliphatic compound), etc.

The above phenolic compound of 1000 or less molecular weight can be easily synthesized by persons of ordinary skill in the art while consulting the processes described in, for example, JP-As 4-122938 and 2-28531, U.S. Pat. No. 4,916, 210, and EP 219294.

As the nonlimiting examples of the carboxylated alicyclic or aliphatic compound, a carboxylic acid derivative of steroid structure such as cholic acid, deoxycholic acid or lithocholic acid, an adamantanecarboxylic acid derivative, adamantanedicarboxylic acid, cyclohexanecarboxylic acid, and cyclohexanedicarboxylic acid can be exemplified.

[Method of Forming Pattern]

From the viewpoint of enhancement of resolving power, it is preferred for the actinic ray-sensitive or radiation-sensitive resin composition according to the present invention to be used with a coating thickness of 30 nm to 250 nm. More preferably, the actinic ray-sensitive or radiation-sensitive resin composition is used with a coating thickness of 30 to 200 nm. This coating thickness can be attained by setting the solid content of the actinic ray-sensitive or radiation-sensitive resin composition within an appropriate range so as to cause the composition to have an appropriate viscosity, thereby improving the applicability and film forming property.

The total solids concentration of the actinic ray-sensitive or radiation-sensitive resin composition is generally in the range of 1 to 10 mass %, preferably 1 to 8.0 mass %, and more preferably 1.0 to 6.0 mass %.

The actinic ray-sensitive or radiation-sensitive resin composition according to the present invention is used in such a manner that the above components are dissolved in a given organic solvent, preferably the above mixed solvent, and filtered and applied onto a given support in the following manner. The filter medium for the filtration preferably consists of a polytetrafluoroethylene, polyethylene or nylon having a pore size of 0.1 μm or less, preferably 0.05 μm or less, and more preferably 0.03 μm or less.

For example, an actinic ray-sensitive or radiation-sensitive resin composition is applied onto a substrate, such as one for use in the production of precision integrated circuit elements (e.g., silicon/silicon dioxide coating), by appropriate application means, such as a spinner or coater, and dried to form a film.

The film is exposed through a given mask to actinic rays or radiation, preferably baked (heated), developed, and rinsed. Accordingly, a desirable pattern can be obtained.

As the actinic rays or radiation, infrared rays, visible light, ultraviolet rays, far ultraviolet rays, extreme ultraviolet rays, X-rays, and electron beams can be exemplified. Among them, preferred use is made of far ultraviolet rays with wavelength of preferably 250 nm or less, more preferably 220 nm or less, and still more preferably 1 to 200 nm, such as a KrF excimer laser (248 nm), an ArF excimer laser (193 nm) and an F2 excimer laser (157 nm), as well as X-rays, and electron beams. More preferred use is made of an ArF excimer laser, an F2 excimer laser, EUV (13 nm) and electron beams.

Prior to the formation of a resist film, the substrate may be coated with an anti-reflection film.

As the anti-reflection film, use can be made of not only an inorganic film of titanium, titanium oxide, titanium nitride, chromium oxide, carbon, amorphous silicon or the like but also an organic film composed of a light absorber and a polymer material. Also, as the organic anti-reflection film, use can be made of commercially available organic anti-reflection films, such as the DUV30 Series and DUV40 Series produced by Brewer Science Inc. and AR-2, AR-3 and AR-5 produced by Shipley Co., Ltd.

In the step for development, an alkali developer is used as in the followings. As the alkali developer for an actinic ray-sensitive or radiation-sensitive resin composition, use can be made of any of alkaline aqueous solutions of an inorganic alkali such as sodium hydroxide, potassium hydroxide, sodium carbonate, sodium silicate, sodium metasilicate or aqueous ammonia, a primary amine such as ethylamine or n-propylamine, a secondary amine such as diethylamine or di-n-butylamine, a tertiary amine such as triethylamine or methyldiethylamine, an alcoholamine such as dimethylethanolamine or triethanolamine, a quaternary ammonium salt such as tetramethylammonium hydroxide or tetraethylammonium hydroxide, a cycloamine such as pyrrole or piperidine, etc.

Before the use of the above alkali developer, appropriate amounts of an alcohol and a surfactant may be added thereto.

The alkali concentration of the alkali developer is generally in the range of 0.1 to 20 mass %.

The pH value of the alkali developer is generally in the range of 10.0 to 15.0.

Before the use of the above alkaline aqueous solution, appropriate amounts of an alcohol and a surfactant may be added thereto.

Pure water can be used as the rinse liquid. Before the use, an appropriate amount of surfactant may be added thereto.

The development operation or rinse operation may be followed by the operation for removing any developer or rinse liquid adhering onto the pattern by the use of a supercritical fluid.

At the time of irradiation with actinic rays or radiation, exposure (liquid immersion exposure) may be carried out after filling the interstice between resist film and lens with a liquid (liquid immersion medium, liquid for liquid immersion) of refractive index higher than that of air. This would bring about an enhancement of resolving power. Any liquid with a refractive index higher than that of air can be employed as the liquid immersion medium. Preferably, pure water is employed.

The liquid for liquid immersion for use in the liquid immersion exposure will now be described.

The liquid for liquid immersion preferably consists of a liquid being transparent in exposure wavelength whose temperature coefficient of refractive index is as low as possible so as to ensure minimization of any distortion of optical image projected on the resist film. Especially in the use of an ArF excimer laser (wavelength: 193 nm) as an exposure light source, however, it is more preferred to use water from not only the above viewpoints but also the viewpoints of easy procurement and easy handling.

Further, from the viewpoint of refractive index increase, use can be made of a medium of 1.5 or higher refractive index. Such a medium may be either an aqueous solution or an organic solvent.

In the use of water as a liquid for liquid immersion, a slight proportion of additive (liquid) that would not dissolve the resist film on a wafer and would be negligible with respect to its influence on an optical coat for an under surface of lens element may be added in order to not only decrease the surface tension of water but also increase a surface activating power. The additive is preferably an aliphatic alcohol with a refractive index approximately equal to that of water, for example, methyl alcohol, ethyl alcohol, isopropyl alcohol, etc. The addition of an alcohol with a refractive index approximately equal to that of water is advantageous in that even when the alcohol component is evaporated from water to cause a change of content concentration, the change of refractive index of the liquid as a whole can be minimized. On the other hand, when a substance being opaque in 193 nm rays or an impurity whose refractive index is greatly different from that of water is mixed therein, the mixing would invite a distortion of optical image projected on the resist film. Accordingly, it is preferred to use distilled water as the liquid immersion water. Furthermore, use may be made of pure water having been filtered through, for example, an ion exchange filter.

Desirably, the electrical resistance of the water is 18.3 MΩcm or higher, and the TOC (organic matter concentration) thereof is 20 ppb or below. Prior deaeration of the water is desired.

Raising the refractive index of the liquid for liquid immersion would enable an enhancement of lithography performance. From this viewpoint, an additive suitable for refractive index increase may be added to the water. Alternatively, heavy water ($D_2O$) may be used in place of water.

In the exposure of the resist film of the actinic ray-sensitive or radiation-sensitive resin composition according to the present invention via the liquid immersion medium, a hydrophobic resin (HR) may further be added. This would bring about uneven localization of the hydrophobic resin (HR) on the surface layer of the film. When the liquid immersion medium is water, there would be attained an improvement of receding contact angle on the surface of the film with reference to water upon formation of the resist film, and accordingly an enhancement of the liquid immersion water tracking property. Although the hydrophobic resin (HR) is not particularly limited as long as an improvement of receding contact angle on the surface is realized by the addition thereof, it is preferred to employ a resin having at least either a fluorine atom or a silicon atom. The receding contact angle of the film is preferably in the range of 60° to 90°, more preferably 70° or higher. The amount of resin added can be appropriately regulated so that the receding contact angle of the film falls within the above range. However, the addition amount based on the total solids of the actinic ray-sensitive or radiation-sensitive resin composition is preferably in the range of 0.1 to 10 mass %, more preferably 0.1 to 5 mass %. Although the hydrophobic resin (HR) is unevenly localized on the interface as aforementioned, differing from the surfactant, the hydrophobic resin does not have to bring a hydrophilic group in its molecule and does not need to contribute toward uniform mixing of polar/nonpolar substances.

The receding contact angle refers to a contact angle determined when the contact line at a droplet-substrate interface draws back. It is generally known that the receding contact angle is useful in the simulation of droplet mobility in a dynamic condition. In a simple definition, the receding contact angle can be defined as the contact angle exhibited at the recession of the droplet interface at the time of, after application of a droplet discharged from a needle tip onto a substrate, re-indrawing the droplet into the needle. Generally, the receding contact angle can be measured according to a method of contact angle measurement known as the dilation/contraction method.

In the operation of liquid immersion exposure, it is needed for the liquid for liquid immersion to move on a wafer while tracking the movement of an exposure head involving high-speed scanning on the wafer and thus forming an exposure pattern. Therefore, the contact angle of the liquid for liquid immersion with respect to the film in dynamic condition is important, and it is required for the actinic ray-sensitive or radiation-sensitive resin composition to be capable of tracking the high-speed scanning of the exposure head without leaving droplets.

The fluorine atom and/or silicon atom in the hydrophobic resin (HR) may be present in the principal chain of the resin or may be a substituent on the side chain thereof.

The hydrophobic resin (HR) is preferably a resin having as a partial structure containing a fluorine atom an alkyl group containing a fluorine atom, a cycloalkyl group containing a fluorine atom, or an aryl group containing a fluorine atom.

The alkyl group containing a fluorine atom (preferably having 1 to 10 carbon atoms, more preferably 1 to 4 carbon atoms) is a linear or branched alkyl group having at least one hydrogen atom thereof substituted with a fluorine atom. Further, other substituents may also be contained.

The cycloalkyl group containing a fluorine atom is a monocyclic or polycyclic alkyl group having at least one hydrogen atom thereof substituted with a fluorine atom. Further, other substituents may also be contained.

As the aryl group containing a fluorine atom, those having at least one hydrogen atom of an aryl group, such as a phenyl or naphthyl group, substituted with a fluorine atom can be exemplified. Further, other substituents may also be contained.

As preferred alkyl groups containing a fluorine atom, cycloalkyl groups containing a fluorine atom and aryl groups containing a fluorine atom, groups of the following general formulae (F2) to (F4) can be exemplified, which however in no way limit the scope of the present invention.

(F2)

(F3)

(F4)

In the general formulae (F2) to (F4), each of $R_{57}$ to $R_{68}$ independently represents a hydrogen atom, a fluorine atom or an alkyl group, in condition that at least one of each of $R_{57}$-$R_{61}$, $R_{62}$-$R_{64}$ and $R_{65}$-$R_{68}$ represents a fluorine atom or an alkyl group (preferably having 1 to 4 carbon atoms) having at least one hydrogen atom thereof substituted with a fluorine atom. It is preferred that all of $R_{57}$-$R_{61}$ and $R_{65}$-$R_{67}$ represent fluorine atoms. Each of $R_{62}$, $R_{63}$ and $R_{68}$ preferably represents an alkyl group (preferably having 1 to 4 carbon atoms) having at least one hydrogen atom thereof substituted with a fluorine atom, more preferably a perfluoroalkyl group having 1 to 4 carbon atoms. $R_{62}$ and $R_{63}$ may be bonded to each other to form a ring.

Specific examples of the groups represented by the general formula (F2) include a p-fluorophenyl group, a pentafluorophenyl group, and a 3,5-di(trifluoromethyl)phenyl group.

Specific examples of the groups represented by the general formula (F3) include a trifluoromethyl group, a pentafluoropropyl group, a pentafluoroethyl group, a heptafluorobutyl group, a hexafluoroisopropyl group, a heptafluoroisopropyl group, a hexafluoro(2-methyl)isopropyl group, a nonafluorobutyl group, an octafluoroisobutyl group, a nonafluorohexyl group, a nonafluoro-t-butyl group, a perfluoroisopentyl group, a perfluorooctyl group, a perfluoro(trimethyl)hexyl group, a 2,2,3,3-tetrafluorocyclobutyl group, and a perfluorocyclohexyl group. Of these, a hexafluoroisopropyl group, a heptafluoroisopropyl group, a hexafluoro(2-methyl)isopropyl group, an octafluoroisobutyl group, a nonafluoro-t-butyl group and a perfluoroisopentyl group are preferred. A hexafluoroisopropyl group and a heptafluoroisopropyl group are more preferred.

Specific examples of the groups represented by the general formula (F4) include —C(CF$_3$)$_2$OH, —C(C$_2$F$_5$)$_2$OH, —C(CF$_3$)(CH$_3$)OH, —CH(CF$_3$)OH and the like. Of these, —C(CF$_3$)$_2$OH is preferred.

Specific examples of the repeating units having a fluorine atom will be shown below, which however in no way limit the scope of the present invention.

In the specific examples, X$_1$ represents a hydrogen atom, —CH$_3$, —F or —CF$_3$.

X$_2$ represents —F or —CF$_3$.

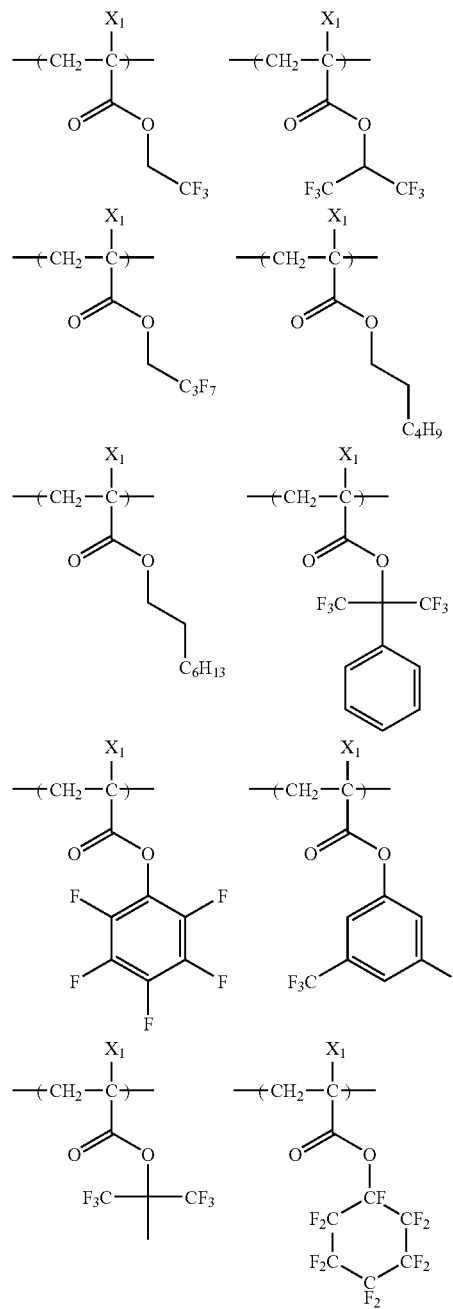

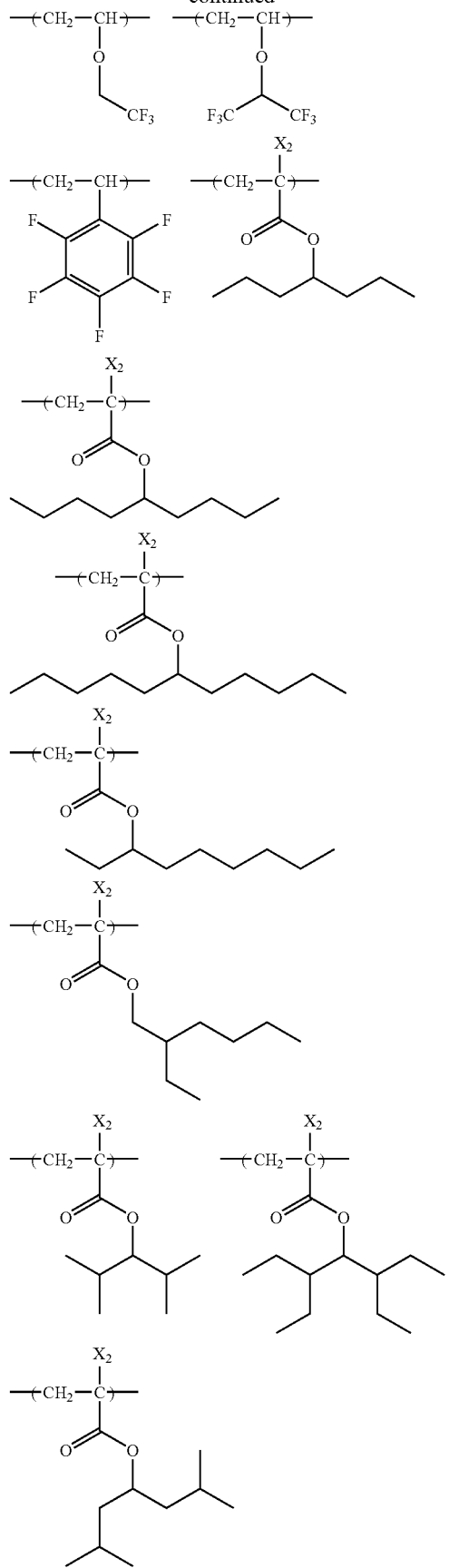

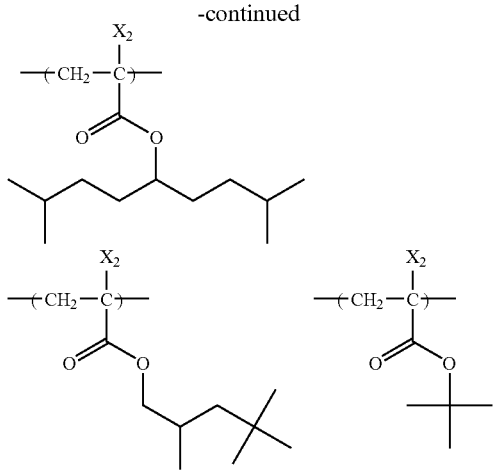

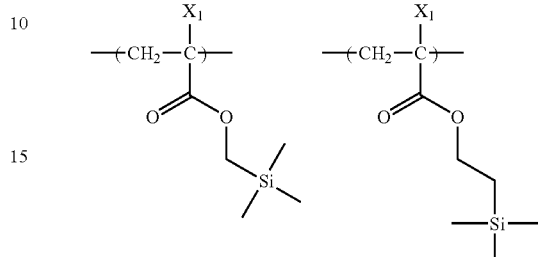

In the formulae, n is an integer of 1 to 5.

Specific examples of the repeating units having the groups represented by the general formulae (CS-1) to (CS-3) will be shown below, which however in no way limit the scope of the present invention. In the specific examples, $X_1$ represents a hydrogen atom, —$CH_3$, —F or —$CF_3$.

The hydrophobic resin (HR) may contain a silicon atom. As preferable partial structure containing the silicon atom, a resin having an alkylsilyl structure (preferably a trialkylsilyl group) or a cyclosiloxane structure can be exemplified.

As the alkylsilyl structure or cyclosiloxane structure, any of the groups represented by the following general formulae (CS-1) to (CS-3) can be exemplified.

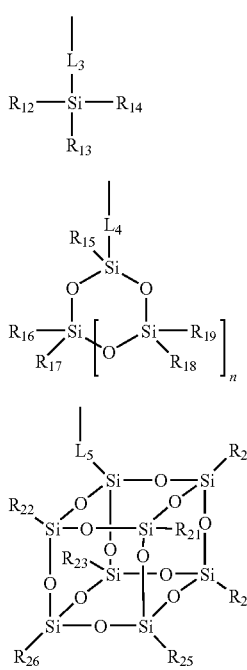

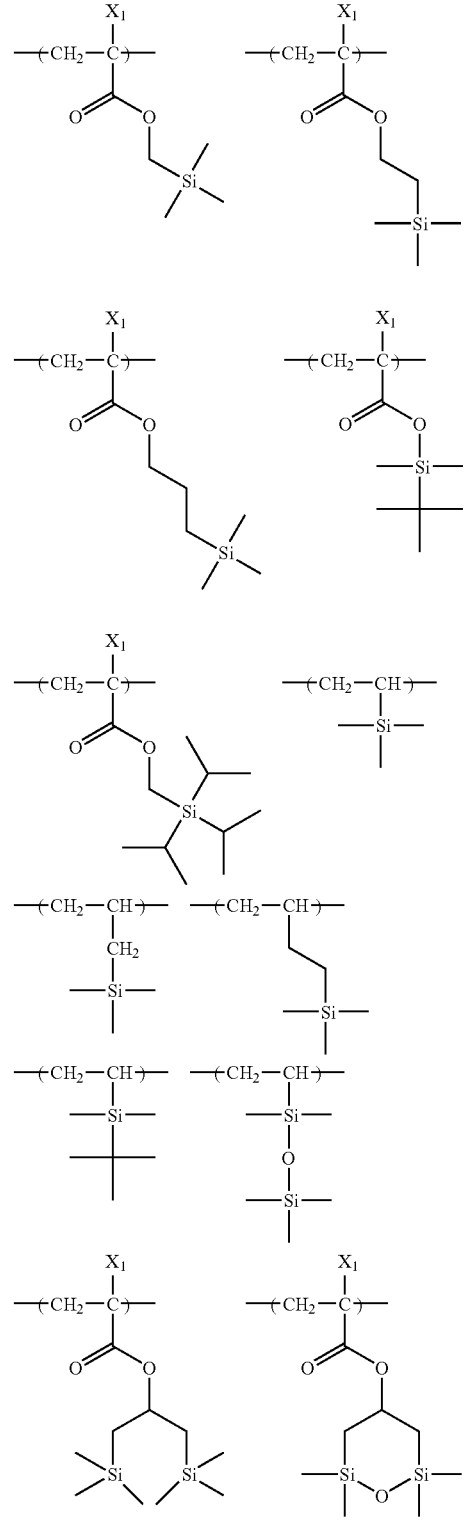

In the general formulae (CS-1) to (CS-3), each of $R_{12}$ to $R_{26}$ independently represents a linear or branched alkyl group (preferably having 1 to 20 carbon atoms) or a cycloalkyl group (preferably having 3 to 20 carbon atoms).

Each of $L_3$ to $L_5$ represents a single bond or a bivalent connecting group. As the bivalent connecting group, any one or a combination of two or more groups selected from the group consisting of an alkylene group, a phenylene group, an ether group, a thioether group, a carbonyl group, an ester group, an amido group, a urethane group and a urea group can be exemplified.

-continued

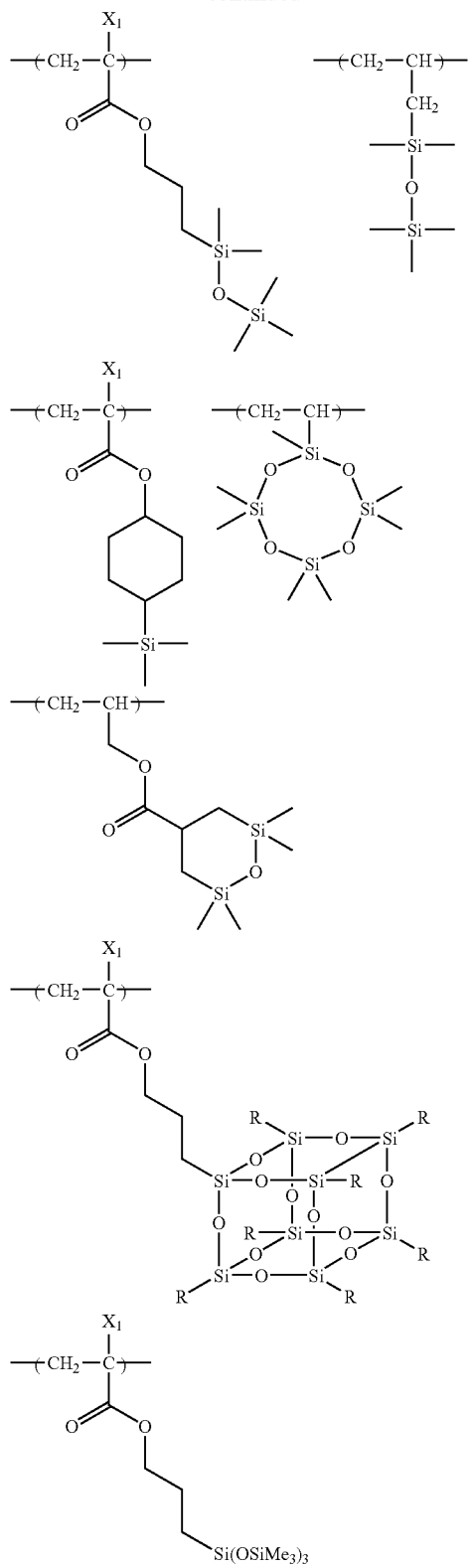

R = CH₃, C₂H₅, C₃H₇, C₄H₉

Moreover, the hydrophobic resin (HR) may have at least one group selected from among the following groups (x) to (z):

(x) an alkali soluble group,
(y) a group that is decomposed by the action of an alkali developer, resulting in an increase of solubility in the alkali developer, and
(z) a group that is decomposed by the action of an acid.

As the alkali soluble group (x), a phenolic hydroxy group, a carboxylate group, a fluoroalcohol group, a sulfonate group, a sulfonamido group, a sulfonylimido group, an (alkylsulfonyl)(alkylcarbonyl)methylene group, an (alkylsulfonyl)(alkylcarbonyl)imido group, a bis(alkylcarbonyl)methylene group, a bis(alkylcarbonyl)imido group, a bis(alkylsulfonyl)methylene group, a bis(alkylsulfonyl)imido group, a tris(alkylcarbonyl)methylene group, and a tris(alkylsulfonyl)methylene group can be exemplified.

As preferred alkali soluble groups, a fluoroalcohol group (preferably hexafluoroisopropanol group), a sulfonimido group, and a bis(carbonyl)methylene group can be exemplified.

As the repeating unit having an alkali soluble group (x), preferred use is made of any of a repeating unit resulting from direct bonding of an alkali soluble group to the principal chain of a resin like a repeating unit of acrylic acid or methacrylic acid; a repeating unit resulting from bonding, via a connecting group, of an alkali soluble group to the principal chain of a resin; and a repeating unit resulting from polymerization with the use of a chain transfer agent or polymerization initiator having an alkali soluble group to introduce the same in a polymer chain terminal.

The content of repeating units having an alkali soluble group (x) based on all the repeating units of the polymer is preferably in the range of 1 to 50 mol %, more preferably 3 to 35 mol %, and still more preferably 5 to 20 mol %.

Specific examples of the repeating units having an alkali soluble group (x) will be shown below, which however in no way limit the scope of the present invention.

In the formulae, Rx represents H, $CH_3$, $CF_3$ or $CH_2OH$.

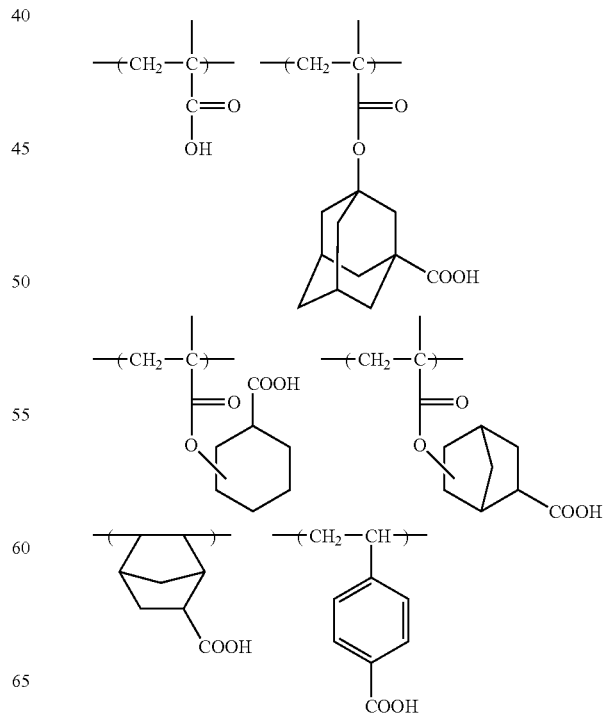

-continued
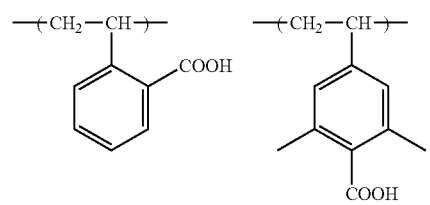
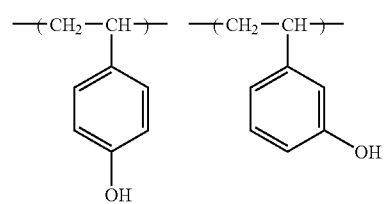
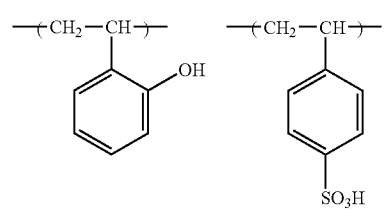
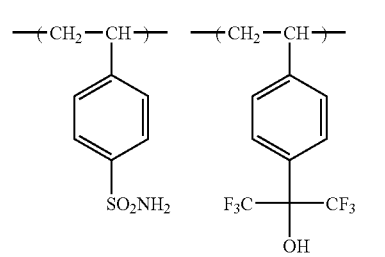
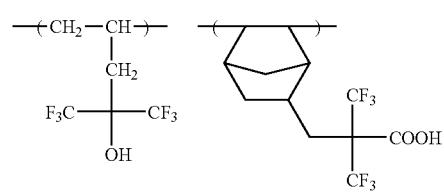
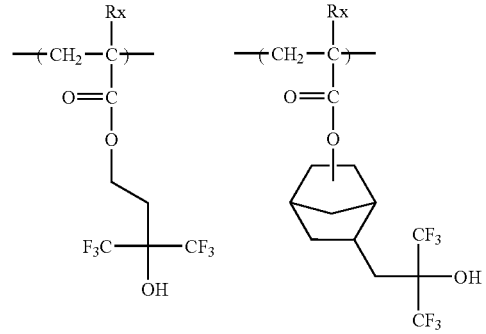
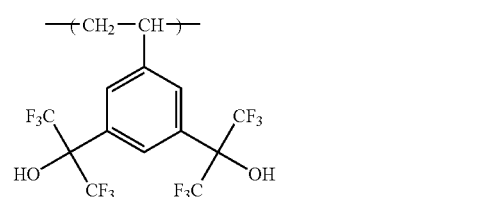
-continued
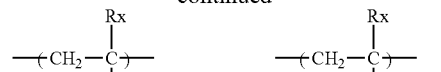
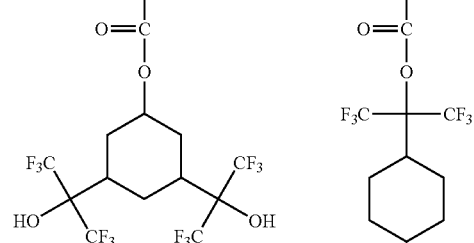
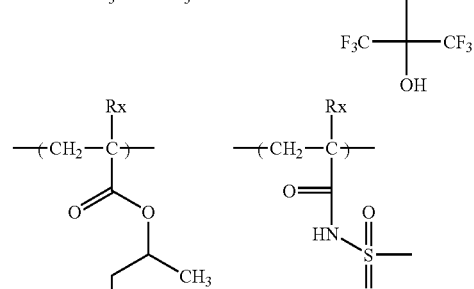
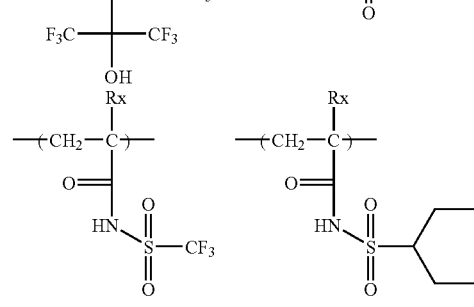
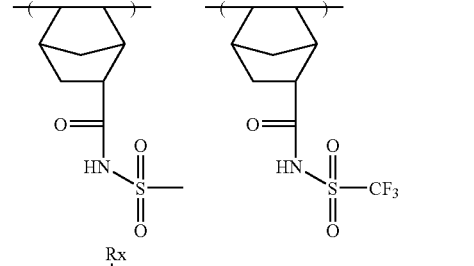
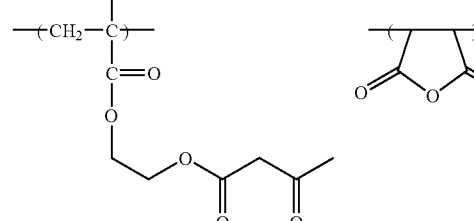
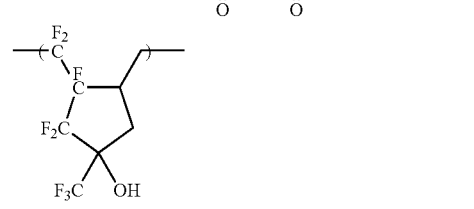
As the group (y) that is decomposed by the action of an alkali developer resulting in an increase of solubility in the alkali developer, a group having a lactone structure, an acid anhydride group, and an acid imide group can be exemplified. Of these, a group having a lactone structure is preferred.

As the repeating unit having a group (y) that is decomposed by the action of an alkali developer resulting in an increase of solubility in the alkali developer, preferred use is made of both of a repeating unit resulting from bonding of a group (y) that is decomposed by the action of an alkali developer resulting in an increase of solubility in the alkali developer to the principal chain of a resin such as a repeating unit of acrylic ester or methacrylic ester, and a repeating unit resulting from polymerization with the use of a chain transfer agent or polymerization initiator having a group (y) resulting in an increase of solubility in an alkali developer to introduce the same in a polymer chain terminal.

The content of repeating units having a group (y) resulting in an increase of solubility in an alkali developer based on all the repeating units of the polymer is preferably in the range of 1 to 40 mol %, more preferably 3 to 30 mol %, and still more preferably 5 to 15 mol %.

As specific examples of the repeating units having a group (y) resulting in an increase of solubility in an alkali developer, the same repeating units having a lactone structure as set forth with respect to the component (A) can be exemplified.

As the repeating unit having a group (z) that is decomposed by the action of an acid in the hydrophobic resin (HR), the same repeating units having an acid decomposable group as set forth with respect to the component (A) can be exemplified. The content of repeating units having a group (z) that is decomposed by the action of an acid in the hydrophobic resin (HR) based on all the repeating units of the polymer is preferably in the range of 1 to 80 mol %, more preferably 10 to 80 mol %, and still more preferably 20 to 60 mol %.

The hydrophobic resin (HR) may further have any of the repeating units represented by the following general formula (III).

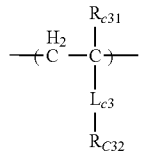

(III)

In the general formula (III), $R_{c31}$ represents a hydrogen atom, an alkyl group, an alkyl group optionally substituted with a fluorine atom, a cyano group or a group of the formula —$CH_2$—O-$Rac_2$ in which $Rac_2$ represents a hydrogen atom, an alkyl group or an acyl group. $R_{c31}$ is preferably a hydrogen atom, a methyl group, a hydroxymethyl group, or a trifluoromethyl group, more preferably a hydrogen atom of a methyl group.

$R_{c32}$ represents a group containing an alkyl group, a cycloalkyl group, an alkenyl group, or a cycloalkenyl group. These groups may be substituted with a fluorine atom or a silicon atom.

$L_{c3}$ represents a single bond or a bivalent connecting group.

In the general formula (III), the alkyl group represented by $R_{c32}$ is preferably a linear or branched alkyl group having 3 to 20 carbon atoms.

The cycloalkyl group is preferably a cycloalkyl group having 3 to 20 carbon atoms.

The alkenyl group is preferably an alkenyl group having 3 to 20 carbon atoms.

The cycloalkenyl group is preferably a cycloalkenyl group having 3 to 20 carbon atoms.

Preferably, $R_{c32}$ represents an unsubstituted alkyl group or an alkyl group substituted with a fluorine atom.

The bivalent connecting group represented by $L_{c3}$ is preferably an ester group, an alkylene group (preferably having 1 to 5 carbon atoms), an oxy group, or a phenylene group.

Further, the hydrophobic resin (HR) may also preferably have any of the repeating units represented by general formula (CII-AB) below.

(CII-AB)

In the general formula (CII-AB), each of $R_{c11}'$ and $R_{c12}'$ independently represents a hydrogen atom, a cyano group, a halogen atom or an alkyl group.

Zc' represents an atomic group for forming an alicyclic structure which contains two bonded carbon atoms (C—C).

Specific examples of the repeating units represented by the general formula (III) and general formula (CII-AB) will be shown below, which however in no way limit the scope of the present invention. In the formulae, Ra represents H, $CH_3$, $CH_2OH$, $CF_3$ or CN.

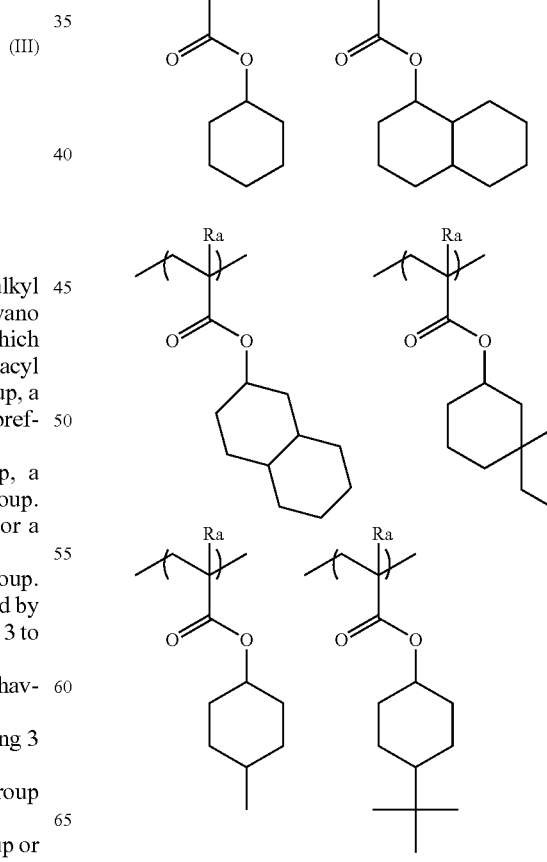

-continued
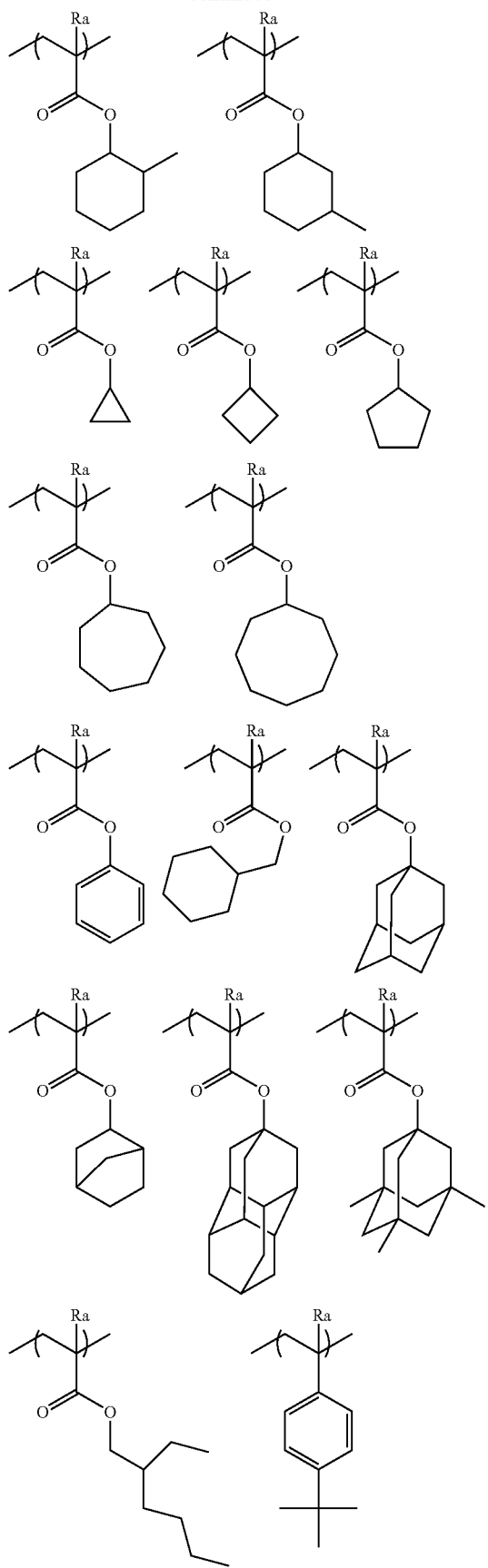
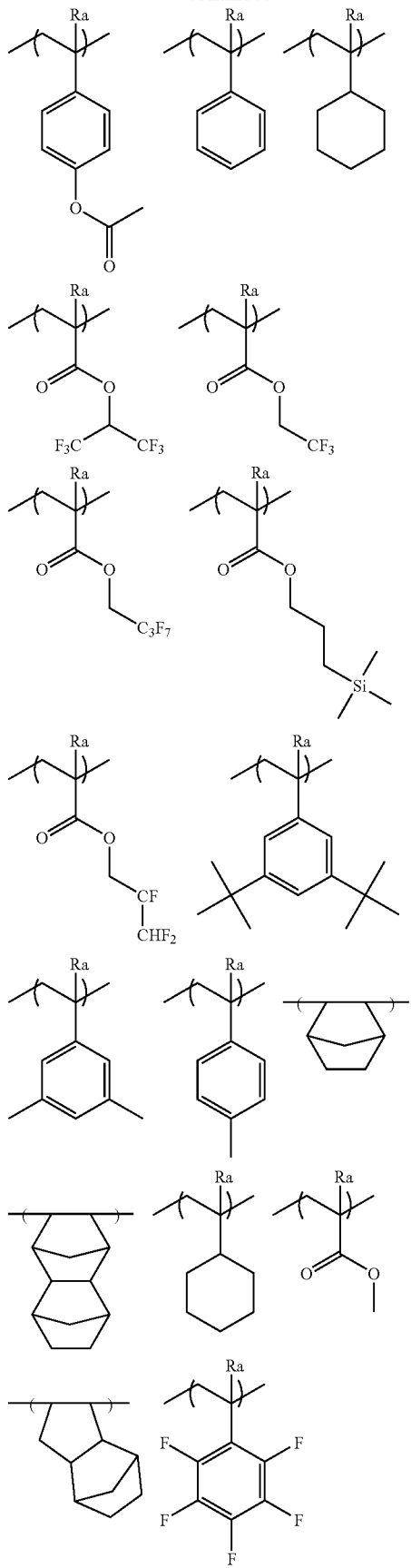

-continued

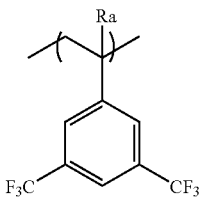

When the hydrophobic resin (HR) contains fluorine atoms, the content of the fluorine atoms based on the molecular weight of the hydrophobic resin (HR) is preferably in the range of 5 to 80 mass %, and more preferably 10 to 80 mass %. The repeating unit containing fluorine atoms preferably exists in the hydrophobic resin (HR) in an amount of 10 to 100 mass %, more preferably 30 to 100 mass %.

When the hydrophobic resin (HR) contains silicon atoms, the content of the silicon atoms based on the molecular weight of the hydrophobic resin (HR) is preferably in the range of 2 to 50 mass %, more preferably 2 to 30 mass %. The repeating unit containing silicon atoms preferably exists in the hydrophobic resin (HR) in an amount of 10 to 100 mass %, more preferably 20 to 100 mass %.

The weight average molecular weight of the hydrophobic resin (HR) in terms of standard polystyrene molecular weight is preferably in the range of 1,000 to 100,000, more preferably 1,000 to 50,000, and still more preferably 2,000 to 15,000.

The content of the hydrophobic resin (HR) in the composition based on the total solids thereof is preferably in the range of 0.01 to 10 mass %, more preferably 0.05 to 8 mass %, and most preferably 0.1 to 5 mass %.

Impurities such as metals in the hydrophobic resin (HR) should naturally be of low quantity as in the component (A). The content of residual monomers and oligomer components is preferably in the range of 0 to 10 mass %, more preferably 0 to 5 mass %, and still more preferably 0 to 1 mass %. Accordingly, there can be obtained a composition being free from in-liquid foreign matters and a change in sensitivity, etc. over time. From the viewpoint of resolving power, resist profile, sidewall of resist pattern, roughness, etc., the molecular weight distribution (Mw/Mn, also referred to as the degree of dispersal) thereof is preferably in the range of 1 to 5, more preferably 1 to 3, and still more preferably 1 to 2.

A variety of commercially available products can be used as the hydrophobic resin (HR), and also the resin can be synthesized in accordance with conventional methods (for example, by radical polymerization). As general synthesizing methods, a batch polymerization method in which a monomer species and an initiator are dissolved in a solvent and heated to carry out polymerization and a dropping polymerization method in which a solution of monomer species and initiator is dropped into a hot solvent over a period of 1 to 10 hours can be exemplified. Of these, the dropping polymerization method is preferred. As a reaction solvent, ethers such as tetrahydrofuran, 1,4-dioxane or diisopropyl ether, ketones such as methyl ethyl ketone or methyl isobutyl ketone, ester solvents such as ethyl acetate, amide solvents such as dimethylformamide or dimethylacetamide, and the aforementioned solvent capable of dissolving the composition according to the present invention, such as propylene glycol monomethyl ether acetate, propylene glycol monomethyl ether or cyclohexanone can be exemplified. Preferably, the polymerization is carried out with the use of the same solvent as that used in the composition according to the present invention. This would inhibit particle generation during storage.

The polymerization reaction is preferably carried out in an atmosphere consisting of an inert gas such as nitrogen or argon. In the initiation of polymerization, a commercially available radical initiator (azo initiator, peroxide, etc.) is used as the polymerization initiator. Among the radical initiators, an azo initiator is preferred, and azo initiators having an ester group, a cyano group and a carboxy group are more preferred. As specific preferred initiators, azobisisobutyronitrile, azobisdimethylvaleronitrile, and dimethyl 2,2'-azobis(2-methylpropionate) can be exemplified. The reaction concentration is in the range of 5 to 50 mass %, preferably 30 to 50 mass %. The reaction temperature is generally in the range of 10° to 150° C., preferably 30° to 120° C., and more preferably 60° to 100° C.

After the completion of the reaction, the mixture is allowed to stand still to cool to room temperature and purified. In the purification, use is made of routine methods, such as a liquid-liquid extraction method in which residual monomers and oligomer components are removed by water washing or by the use of a combination of appropriate solvents, a method of purification in solution form such as ultrafiltration capable of extraction removal of only components of a given molecular weight or below, a re-precipitation method in which a resin solution is dropped into a poor solvent to coagulate the resin in the poor solvent and thus remove residual monomers, etc. and a method of purification in solid form such as washing of a resin slurry obtained by filtration with the use of a poor solvent. For example, the reaction solution is brought into contact with a solvent wherein the resin is poorly soluble or insoluble (poor solvent) amounting to 10 or less, preferably 10 to 5 times the volume of the reaction solution to precipitate the resin as a solid.

The solvent for use in the operation of precipitation or re-precipitation from a polymer solution (precipitation or re-precipitation solvent) is not limited as long as the solvent is a poor solvent for the polymer. According to the type of polymer, use can be made of any one appropriately selected from among a hydrocarbon, a halogenated hydrocarbon, a nitro compound, an ether, a ketone, an ester, a carbonate, an alcohol, a carboxylic acid, water, a mixed solvent containing these solvents, and the like. Of these, it is preferred to employ a solvent containing at least an alcohol (especially methanol or the like) or water as the precipitation or re-precipitation solvent.

The amount of precipitation or re-precipitation solvent used can be determined according to intended efficiency, yield, etc. and is generally in the range of 100 to 10,000 parts by mass, preferably 200 to 2,000 parts by mass, and more preferably 300 to 1,000 parts by mass per 100 parts by mass of the polymer solution.

The temperature at which the precipitation or re-precipitation is carried out can be determined according to efficiency and operation easiness, and is generally in the range of about 0° to 50° C., and preferably about room temperature (for example, about 20° to 35° C.). The operation of precipitation or re-precipitation can be carried out by a known method such as a batch or continuous method, with the use of a common mixing vessel such as an agitation vessel.

The polymer obtained by the precipitation or re-precipitation is generally subjected to common solid/liquid separation, such as filtration or centrifugal separation, and dried before use. The filtration is carried out with the use of a filter medium ensuring solvent resistance, preferably under pressure. The drying is performed at about 30° C. to 100° C., preferably about 30° C. to 50° C. at ordinary pressure or reduced pressure (preferably at reduced pressure).

Alternatively, after the resin precipitation and separation, the obtained resin may be once more dissolved in a solvent and brought into contact with a solvent wherein the resin is poorly soluble or insoluble. Specifically, the method may include the steps of, after the completion of the radical polymerization reaction, bringing the polymer into contact with a solvent wherein the polymer is poorly soluble or insoluble to thereby precipitate a resin (step a), separating the resin from the solution (step b), re-dissolving the resin in a solvent to thereby obtain a resin solution (A) (step c), thereafter bringing the resin solution (A) into contact with a solvent wherein the resin is poorly soluble or insoluble amounting to less than 10 times (preferably 5 times or less) the volume of the resin solution (A) to thereby precipitate a resin solid (step d), and separating the precipitated resin (step e).

Specific examples of the hydrophobic resins (HR) will be shown below. The following Table 1 shows the molar ratio of individual repeating units (corresponding to individual repeating units in order from the left), weight average molecular weight, and degree of dispersal with respect to each of the resins.

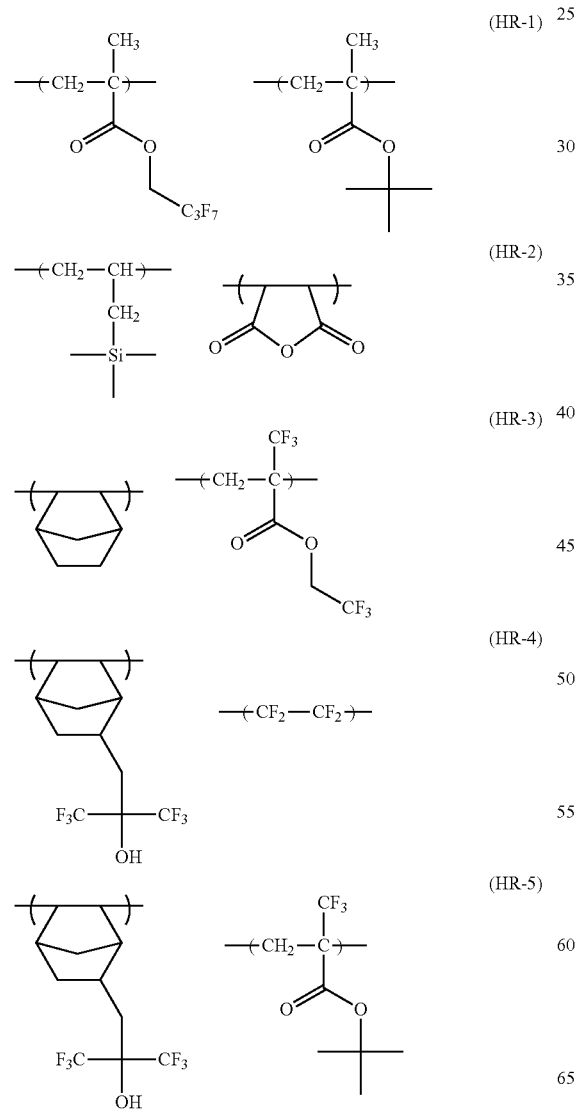

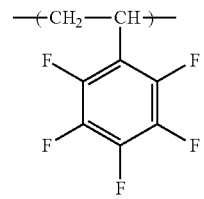

(HR-6)

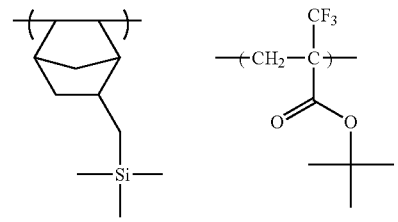

(HR-7)

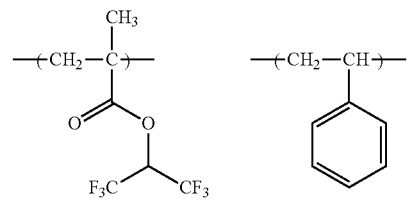

(HR-8)

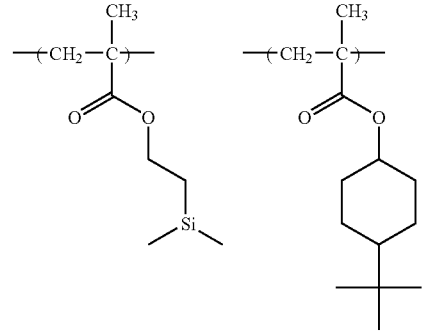

(HR-9)]

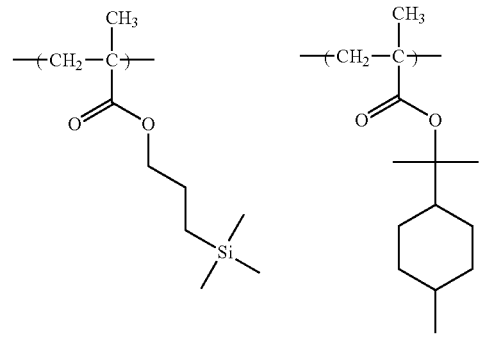

(HR-10)

-continued
(HR-11) 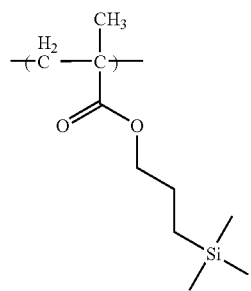 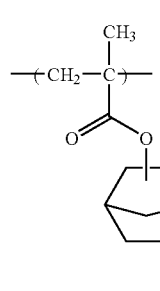
(HR-12) 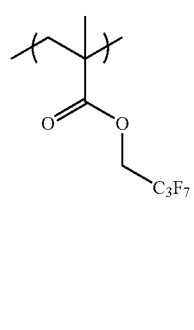 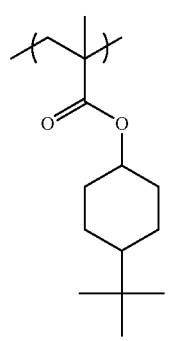
(HR-13) 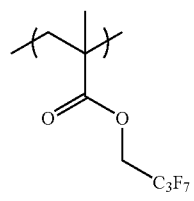 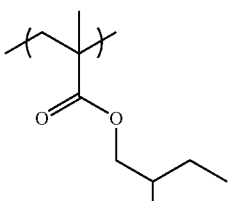
(HR-14) 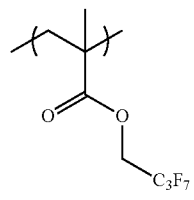 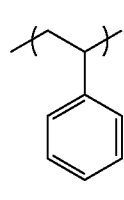
(HR-15) 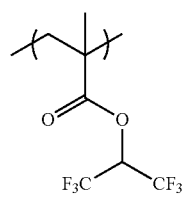
(HR-16) 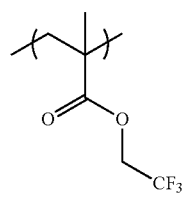
-continued
(HR-17) 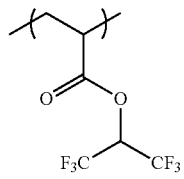
(HR-18) 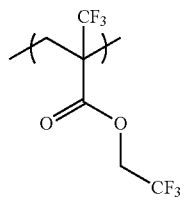 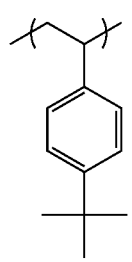
(HR-19) 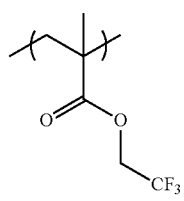 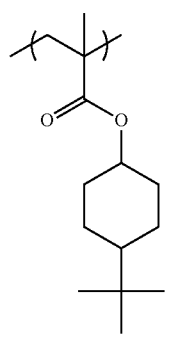
(HR-20) 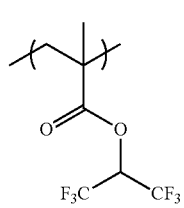 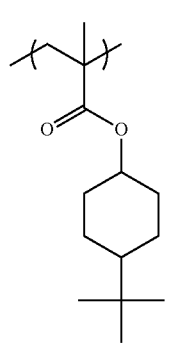
(HR-21) 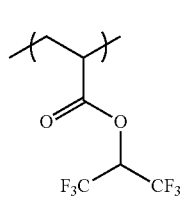 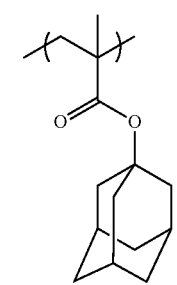
(HR-22) 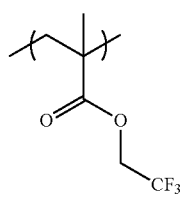 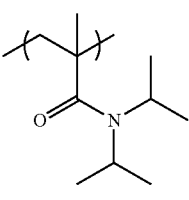

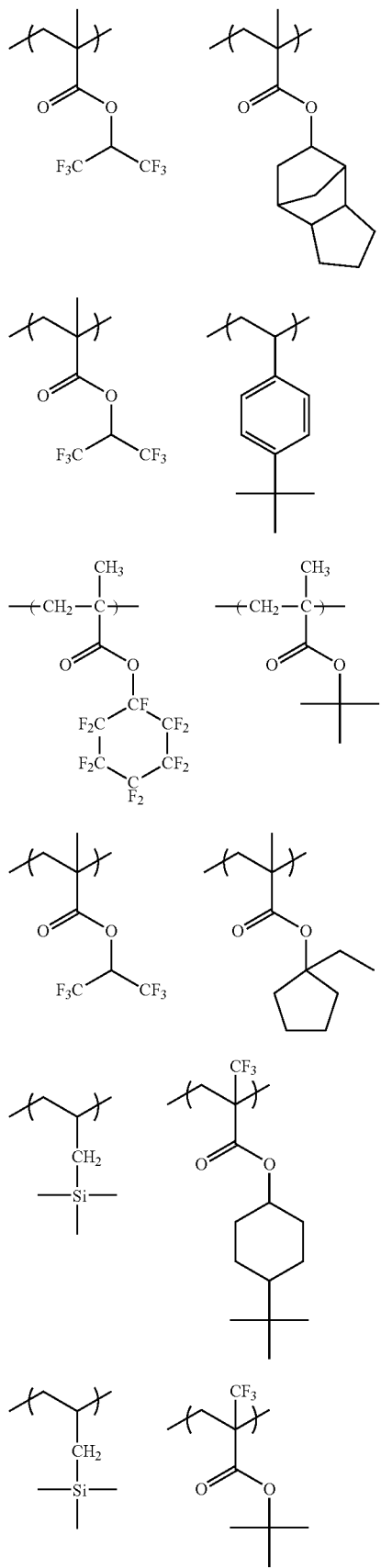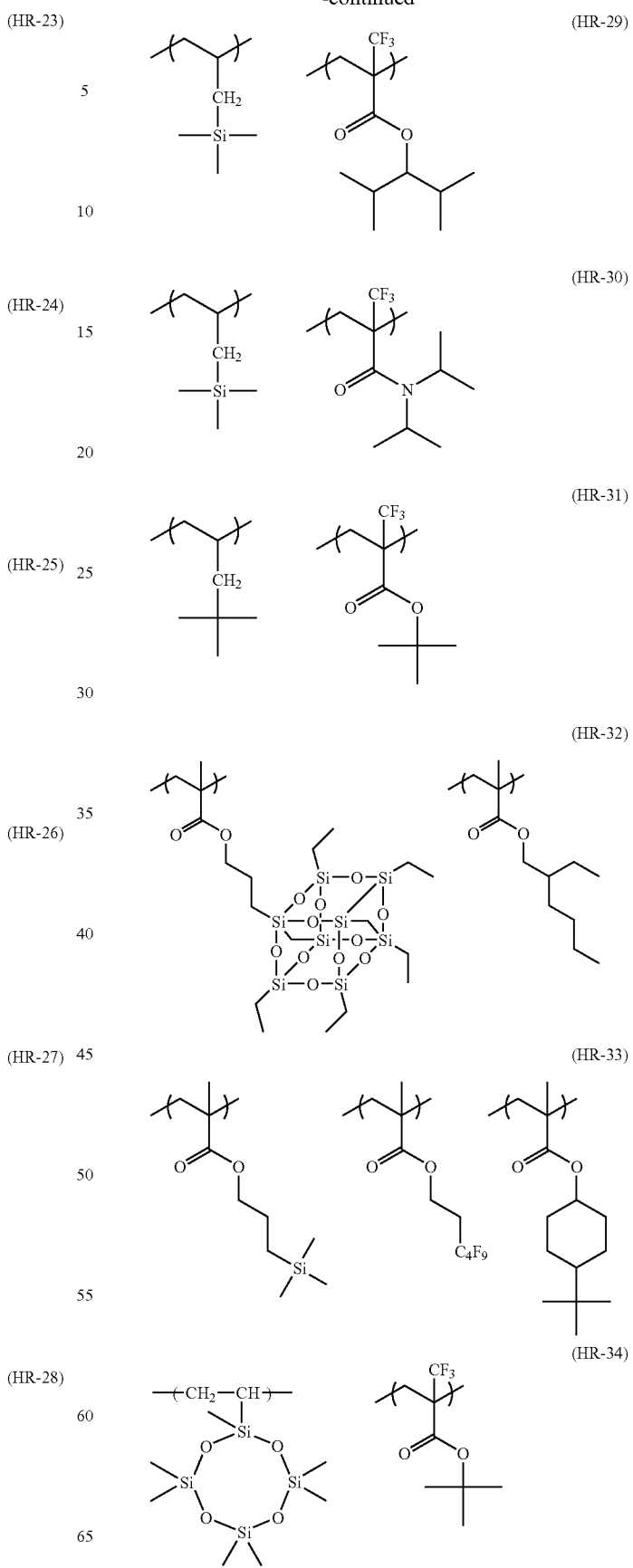

(HR-35) 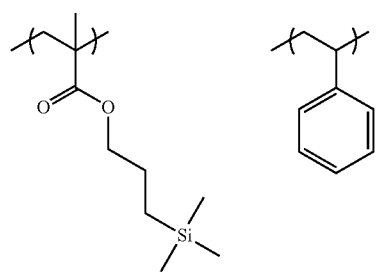 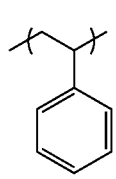
(HR-36) 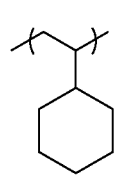 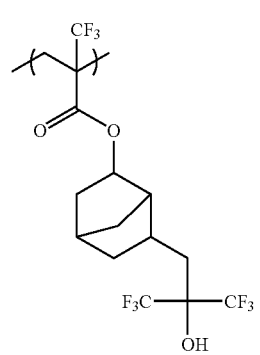
(HR-37) 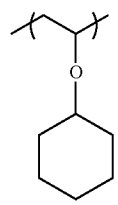 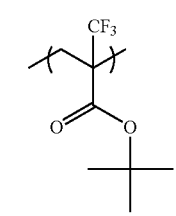
(HR-38) 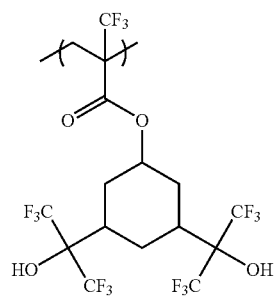 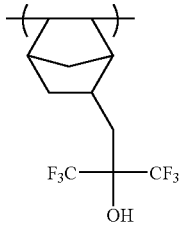
(HR-39) 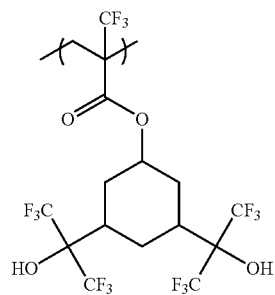 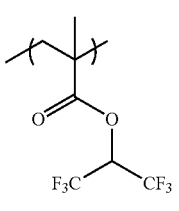
(HR-40) 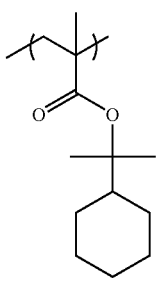 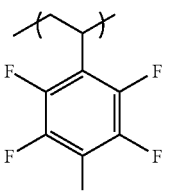
(HR-41) 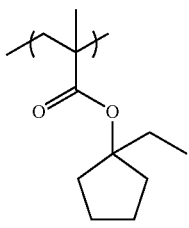 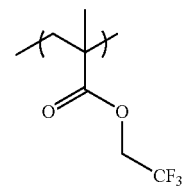
(HR-42) 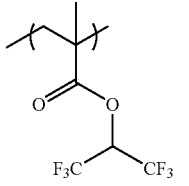 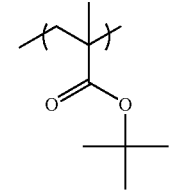
(HR-43) 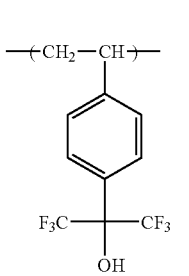 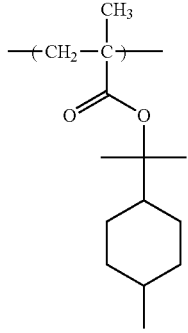
(HR-44) 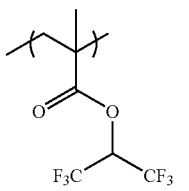 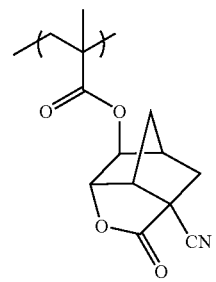
(HR-45) 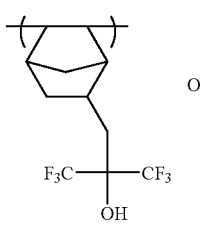 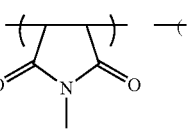 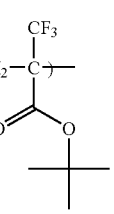

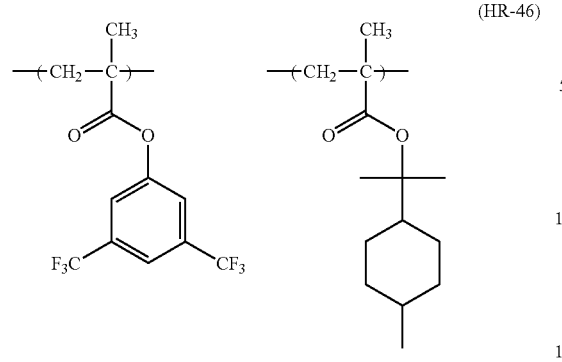
(HR-46)
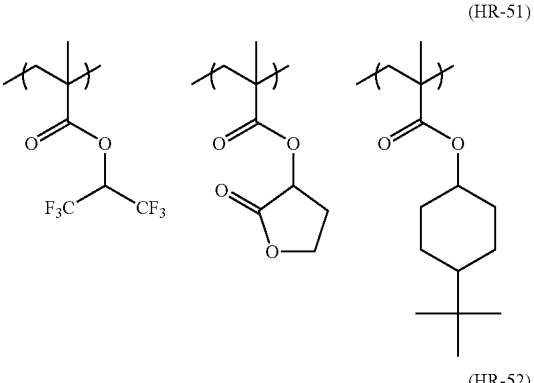
(HR-51)
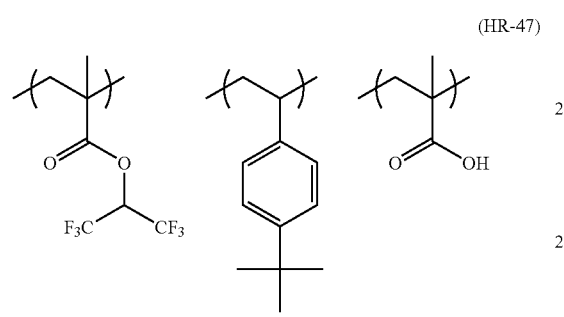
(HR-47)
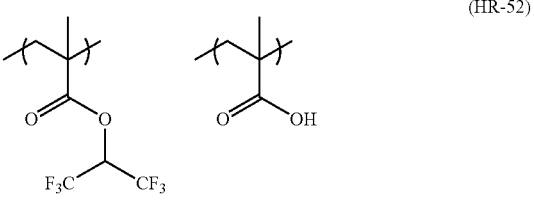
(HR-52)
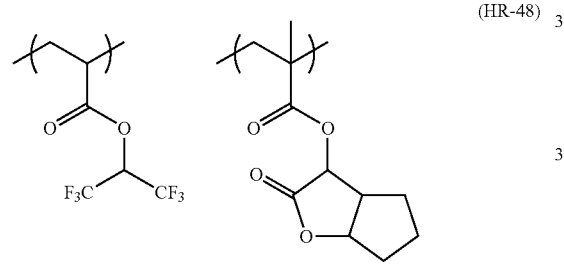
(HR-48)
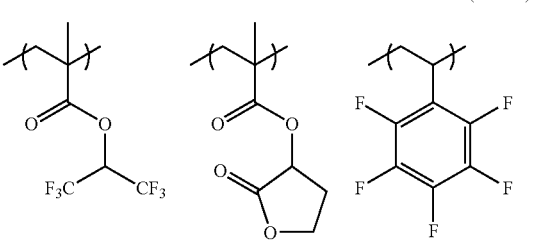
(HR-53)
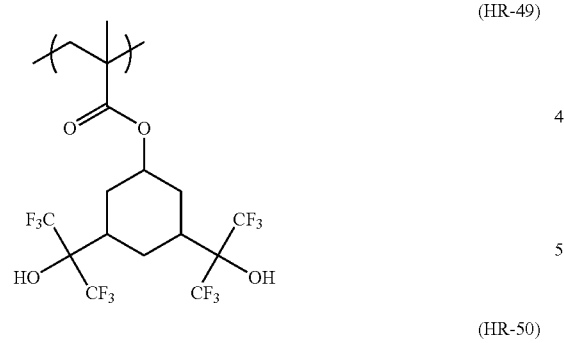
(HR-49)
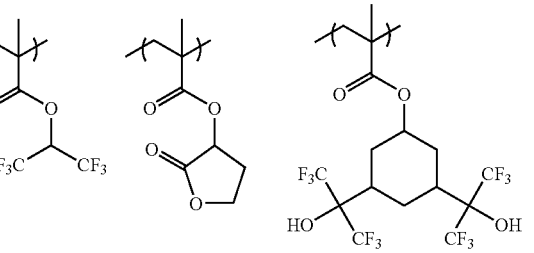
(HR-54)
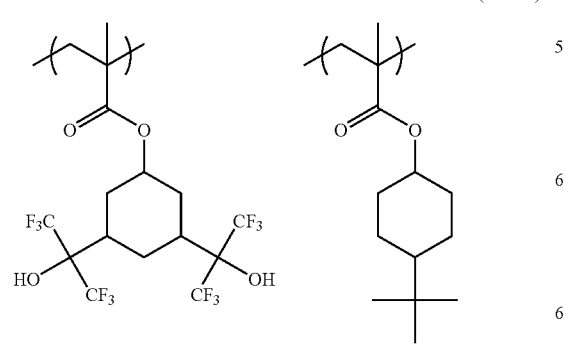
(HR-50)
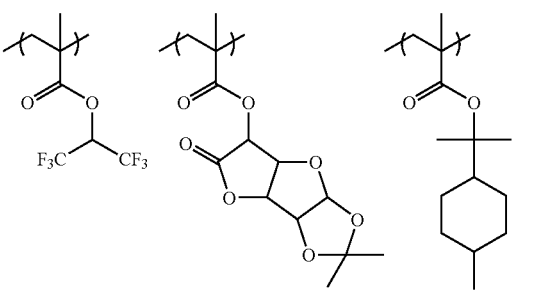
(HR-55)
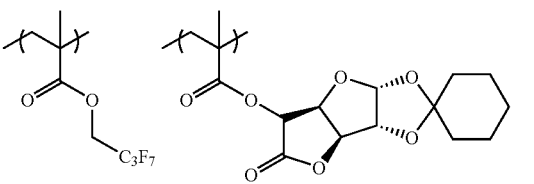
(HR-56)

(HR-57)
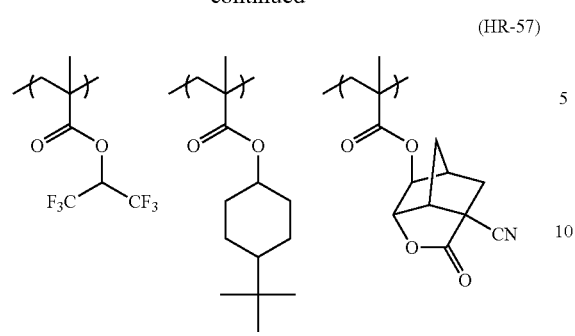
(HR-58)
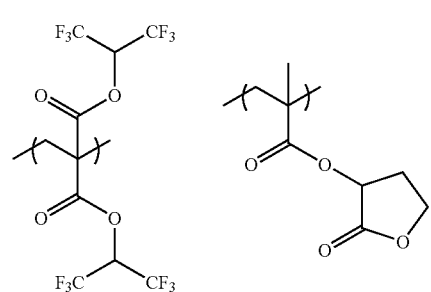
(HR-59)
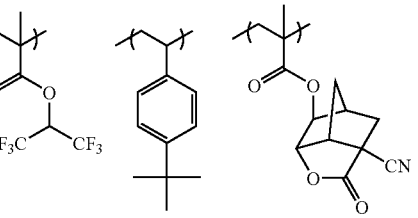
(HR-60)
(HR-61)
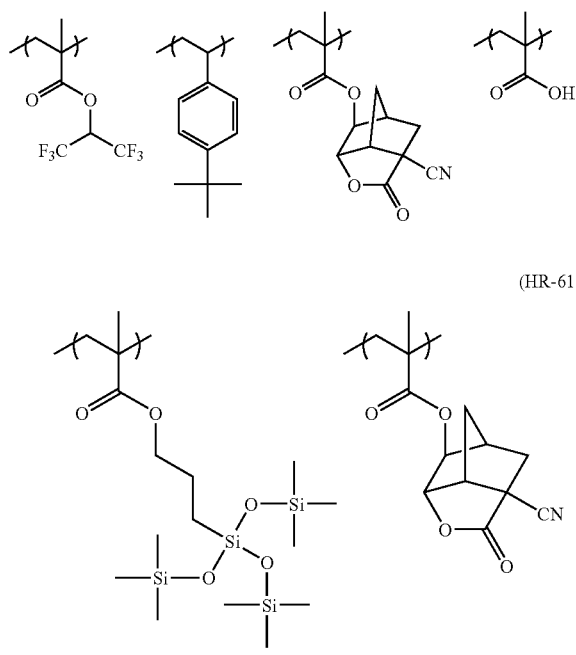
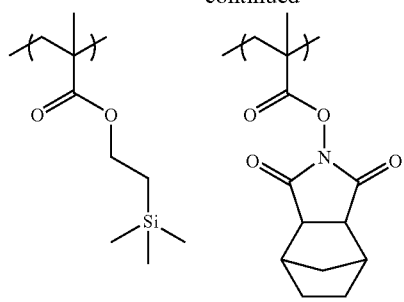
(HR-64)
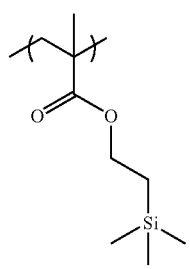
(HR-65)
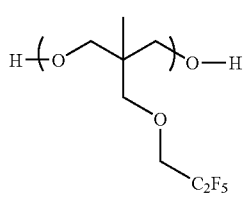
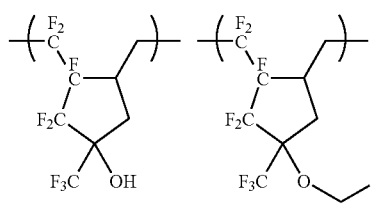
TABLE 1
| resin | composition | Mw | Mw/Mn |
|---|---|---|---|
| HR-1 | 50/50 | 4900 | 1.4 |
| HR-2 | 50/50 | 5100 | 1.6 |
| HR-3 | 50/50 | 4800 | 1.5 |
| HR-4 | 50/50 | 5300 | 1.6 |
| HR-5 | 50/50 | 4500 | 1.4 |
| HR-6 | 100 | 5500 | 1.6 |
| HR-7 | 50/50 | 5800 | 1.9 |
| HR-8 | 50/50 | 4200 | 1.3 |
| HR-9 | 50/50 | 5500 | 1.8 |
| HR-10 | 40/60 | 7500 | 1.6 |
| HR-11 | 70/30 | 6600 | 1.8 |
| HR-12 | 40/60 | 3900 | 1.3 |
| HR-13 | 50/50 | 9500 | 1.8 |
| HR-14 | 50/50 | 5300 | 1.6 |
| HR-15 | 100 | 6200 | 1.2 |
| HR-16 | 100 | 5600 | 1.6 |
| HR-17 | 100 | 4400 | 1.3 |
| HR-18 | 50/50 | 4300 | 1.3 |
| HR-19 | 50/50 | 6500 | 1.6 |
| HR-20 | 30/70 | 6500 | 1.5 |
| HR-21 | 50/50 | 6000 | 1.6 |
| HR-22 | 50/50 | 3000 | 1.2 |
| HR-23 | 50/50 | 5000 | 1.5 |
| HR-24 | 50/50 | 4500 | 1.4 |
| HR-25 | 30/70 | 5000 | 1.4 |

TABLE 1-continued

| resin | composition | Mw | Mw/Mn |
|---|---|---|---|
| HR-26 | 50/50 | 5500 | 1.6 |
| HR-27 | 50/50 | 3500 | 1.3 |
| HR-28 | 50/50 | 6200 | 1.4 |
| HR-29 | 50/50 | 6500 | 1.6 |
| HR-30 | 50/50 | 6500 | 1.6 |
| HR-31 | 50/50 | 4500 | 1.4 |
| HR-32 | 30/70 | 5000 | 1.6 |
| HR-33 | 30/30/40 | 6500 | 1.8 |
| HR-34 | 50/50 | 4000 | 1.3 |
| HR-35 | 50/50 | 6500 | 1.7 |
| HR-36 | 50/50 | 6000 | 1.5 |
| HR-37 | 50/50 | 5000 | 1.6 |
| HR-38 | 50/50 | 4000 | 1.4 |
| HR-39 | 20/80 | 6000 | 1.4 |
| HR-40 | 50/50 | 7000 | 1.4 |
| HR-41 | 50/50 | 6500 | 1.6 |
| HR-42 | 50/50 | 5200 | 1.6 |
| HR-43 | 50/50 | 6000 | 1.4 |
| HR-44 | 70/30 | 5500 | 1.6 |
| HR-45 | 50/20/30 | 4200 | 1.4 |
| HR-46 | 30/70 | 7500 | 1.6 |
| HR-47 | 40/58/2 | 4300 | 1.4 |
| HR-48 | 50/50 | 6800 | 1.6 |
| HR-49 | 100 | 6500 | 1.5 |
| HR-50 | 50/50 | 6600 | 1.6 |
| HR-51 | 30/20/50 | 6800 | 1.7 |
| HR-52 | 95/5 | 5900 | 1.6 |
| HR-53 | 40/30/30 | 4500 | 1.3 |
| HR-54 | 50/30/20 | 6500 | 1.8 |
| HR-55 | 30/40/30 | 7000 | 1.5 |
| HR-56 | 60/40 | 5500 | 1.7 |
| HR-57 | 40/40/20 | 4000 | 1.3 |
| HR-58 | 60/40 | 3800 | 1.4 |
| HR-59 | 80/20 | 7400 | 1.6 |
| HR-60 | 40/40/15/5 | 4800 | 1.5 |
| HR-61 | 60/40 | 5600 | 1.5 |
| HR-62 | 50/50 | 5900 | 2.1 |
| HR-63 | 80/20 | 7000 | 1.7 |
| HR-64 | 100 | 5500 | 1.8 |
| HR-65 | 50/50 | 9500 | 1.9 |

For the prevention of direct contact of a film with a liquid for liquid immersion, a film that is highly insoluble in the liquid for liquid immersion (hereinafter also referred to as a "top coat") may be provided between the film formed by the composition according to the present invention and the liquid for liquid immersion. The functions to be fulfilled by the top coat are applicability to an upper layer portion of the film, transparency in radiation of especially 193 nm, and high insolubility in the liquid for liquid immersion. Preferably, the top coat does not mix with the film and is uniformly applicable to an upper layer of the film.

From the viewpoint of transparency in radiation of 193 nm, the top coat preferably consists of a polymer not abundantly containing an aromatic moiety. As such, a hydrocarbon polymer, an acrylic ester polymer, polymethacrylic acid, polyacrylic acid, polyvinyl ether, a siliconized polymer, and a fluoropolymer can be exemplified. The aforementioned hydrophobic resins (HR) also find appropriate application in the top coat. From the viewpoint of contamination of an optical lens by leaching of impurities from the top coat into the liquid for liquid immersion, it is preferred to reduce the amount of residual monomer components of the polymer contained in the top coat.

At the detachment of the top coat, use may be made of a developer, or a separate peeling agent may be used. The peeling agent preferably consists of a solvent having low permeation into the film. Detachability by an alkali developer is preferred from the viewpoint of simultaneous attainment of the detachment step with the development processing step for the resist film. The top coat is preferred to be acidic from the viewpoint of detachment with the use of an alkali developer. However, from the viewpoint of non-intermixability with the resist film, the top coat may be neutral or alkaline.

The less the difference in refractive index between the top coat and the liquid for liquid immersion, the higher the resolving power. In an ArF excimer laser (wavelength: 193 nm), when water is used as the liquid for liquid immersion, the top coat for ArF liquid immersion exposure preferably has a refractive index close to that of the liquid for liquid immersion. From the viewpoint of approximation of the refractive index to that of the liquid for liquid immersion, it is preferred for the top coat to contain a fluorine atom. From the viewpoint of transparency and refractive index, it is preferred to reduce the thickness of the film.

Preferably, the top coat does not mix with the film and also does not mix with the liquid for liquid immersion. From this viewpoint, when the liquid for liquid immersion is water, it is preferred for the solvent used in the top coat to be highly insoluble in the solvent used in the actinic ray-sensitive or radiation-sensitive resin composition and be a non-water-soluble medium. When the liquid for liquid immersion is an organic solvent, the top coat may be soluble or insoluble in water.

EXAMPLE

The present invention will now be described in greater detail with reference to Examples, which however in no way limit the scope of the present invention.

Synthetic Example 1

Synthesis of Resin [1]

In a nitrogen stream, 25.5 g of cyclohexanone was placed in a three-necked flask and heated at 80° C. A solution obtained by dissolving the monomers, each corresponding to the repeating units constituting the resin (1) below, amounting in order from the left side to 2.80, 3.05, 1.26, 1.82 and 3.94 g and further a polymerization initiator (V601) (produced by Wako Pure Chemical Industries, Ltd., 0.81 g viz. 7.0 mol % based on the monomers) in 47.4 g of cyclohexanone was dropped thereinto over a period of 6 hours. After the completion of the dropping, reaction was allowed to continue at 80° C. for 2 hours. The reaction mixture was allowed to stand still to cool and was dropped into a mixed liquid consisting of 420 g of hexane and 180 g of ethyl acetate over a period of 20 min. The thus precipitated powder was collected by filtration and dried, thereby obtaining 10 g of a polymer (1). The weight average molecular weight (Mw) of the obtained resin (1) in terms of standard polystyrene molecular weight was 9570 and the degree of dispersal (Mw/Mn) thereof was 1.7. The glass transition point (Tg) of the resin (1) as measured by a DSC (manufactured by TA Instruments) was 150° C.

Resin (1) synthesized in Synthetic Example 1:
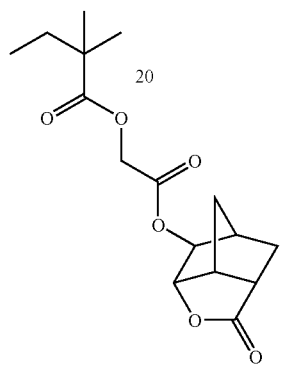
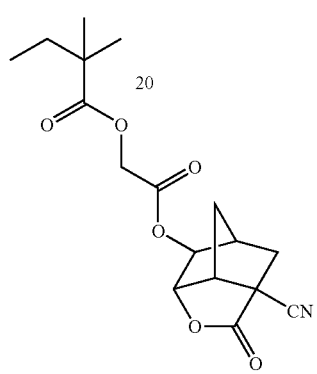
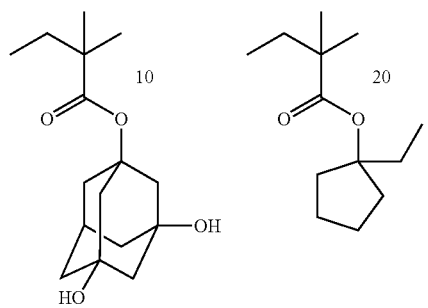
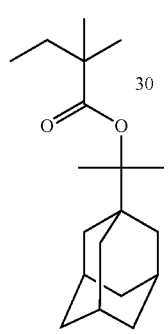
Resins (2) to (9) below for use in the present invention were synthesized in the same manner as in Synthetic Example 1.
(2)
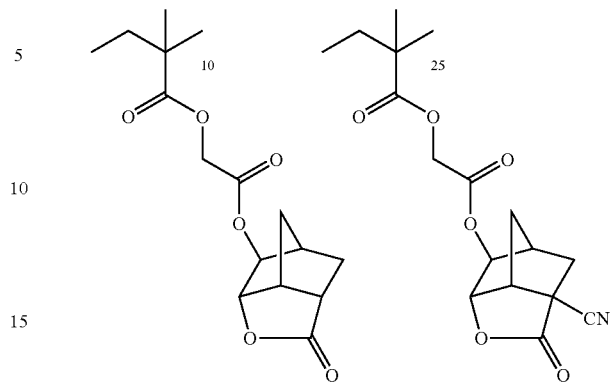
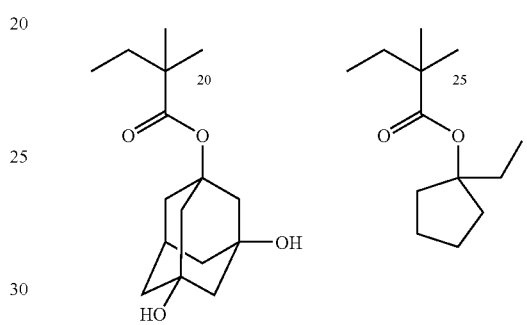
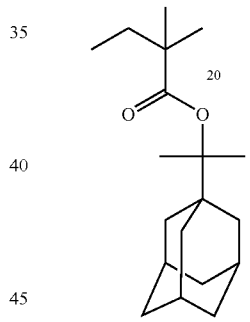
Mw: 9640
Mw/Mn: 1.7
Tg: 135° C.
(3)
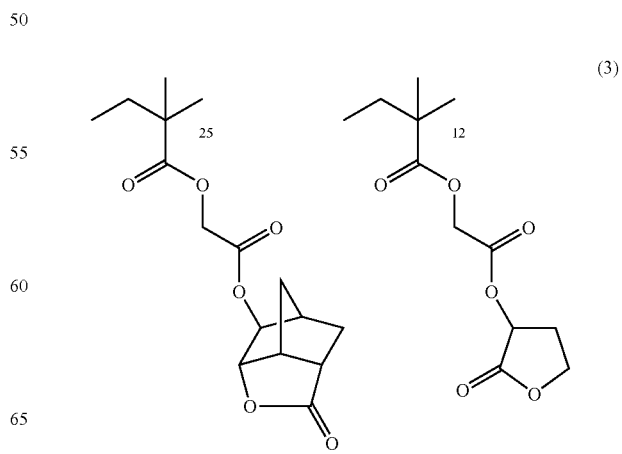

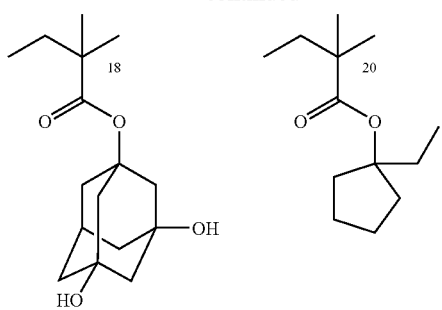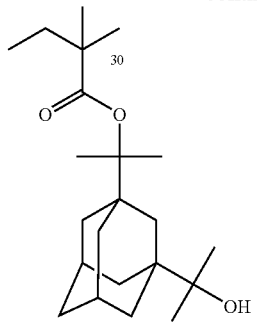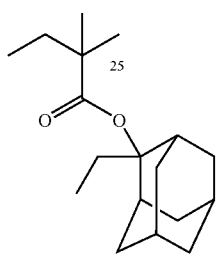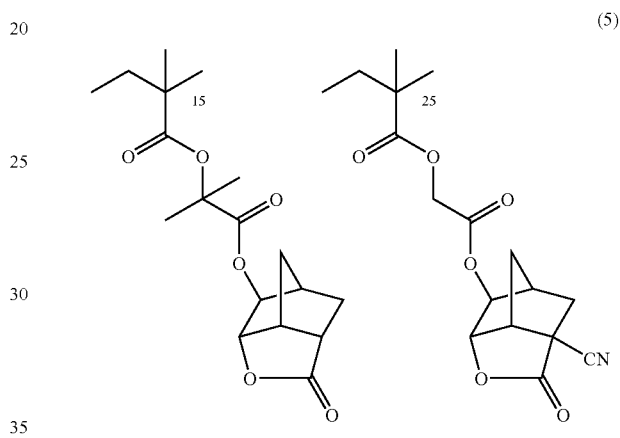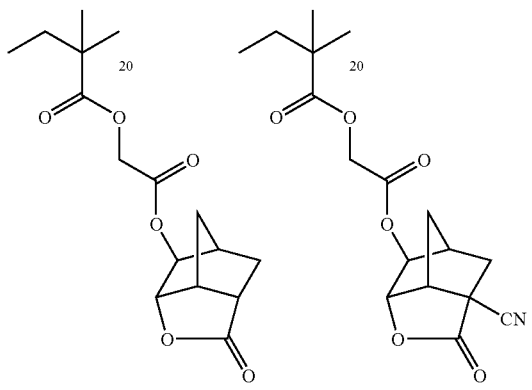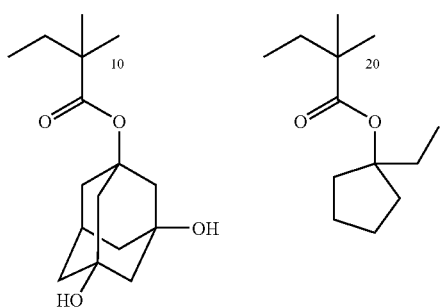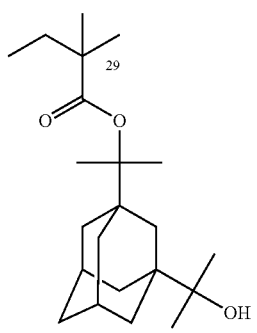

(6)
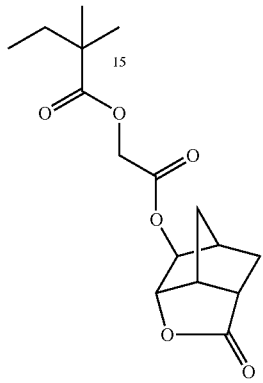
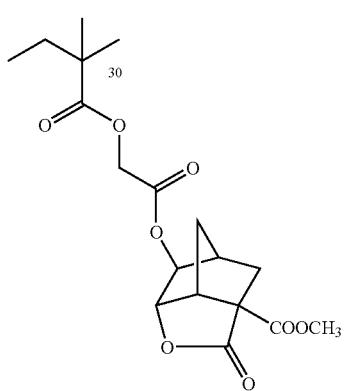
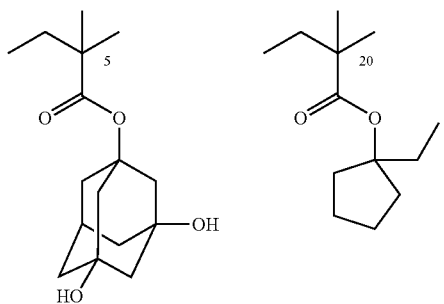
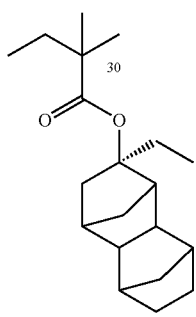
Mw: 9490
Mw/Mn: 1.8
Tg: 140° C.
(7)
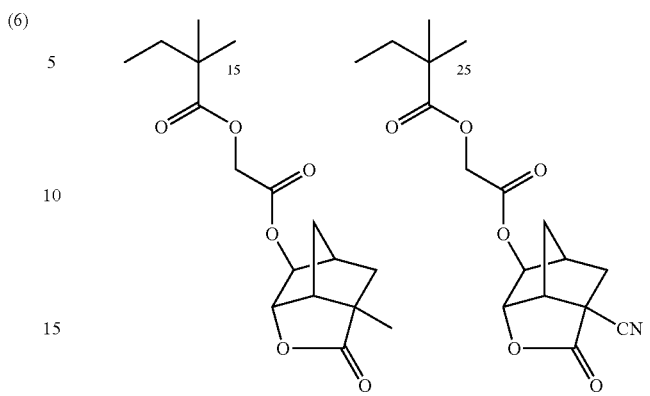
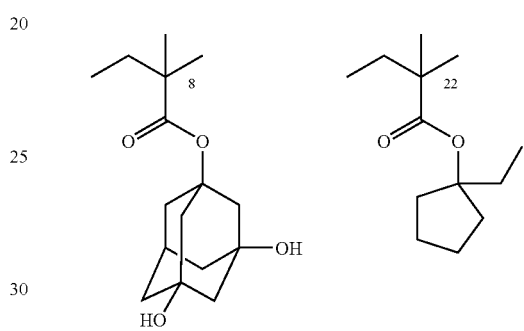
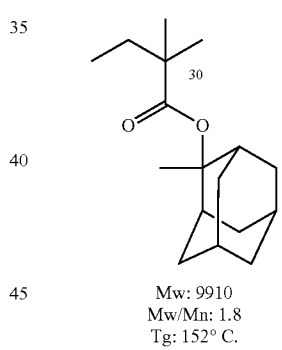
Mw: 9910
Mw/Mn: 1.8
Tg: 152° C.
(8)
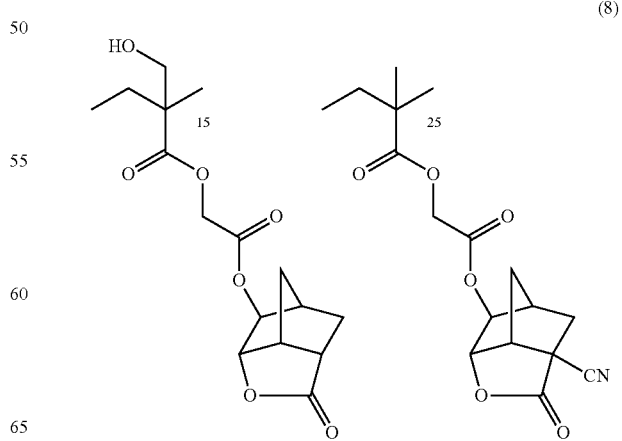

-continued
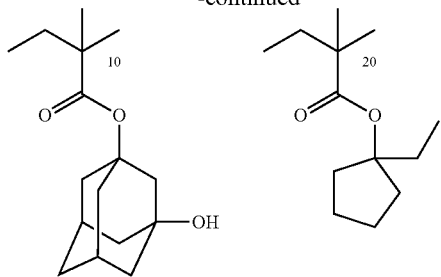
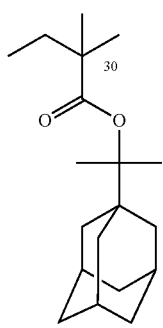
Mw: 9720
Mw/Mn: 1.7
Tg: 145° C.
(9)
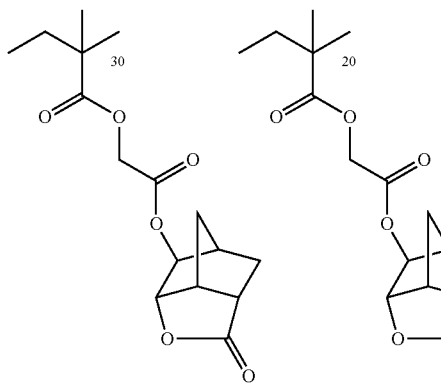
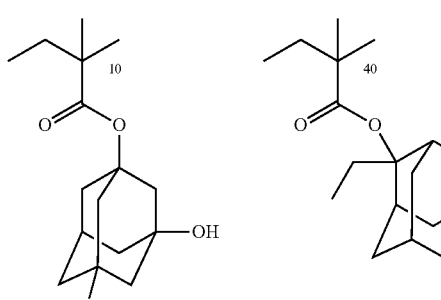
Mw: 9670
Mw/Mn: 1.8
Tg: 160° C.
(R1)
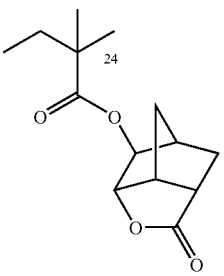
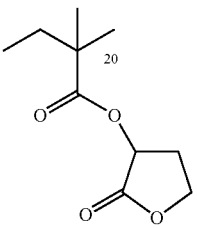
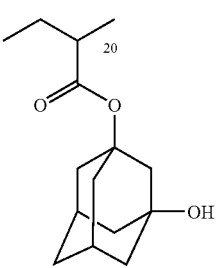
Mw: 9390
Mw/Mn: 1.9
Tg: 120° C.
(R2)
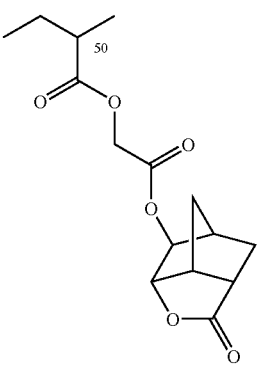
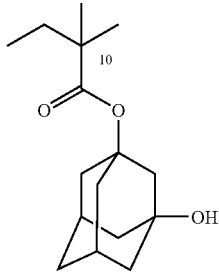
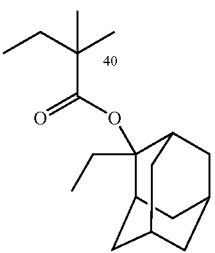
Mw: 9310
Mw/Mn: 1.9
Tg: 155° C.
Furthermore, comparative resins (R1) to (R6) were synthesized in the same manner.

-continued
(R3)
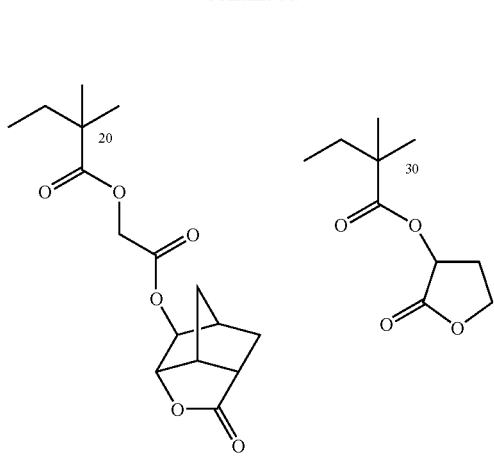
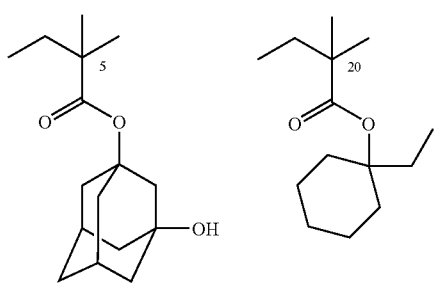
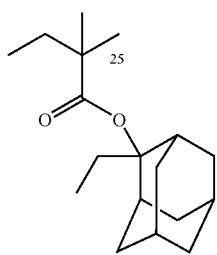
Mw: 9460
Mw/Mn: 1.8
Tg: 125° C.
(R4)
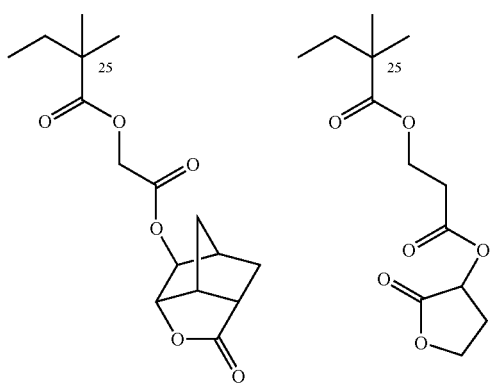
-continued
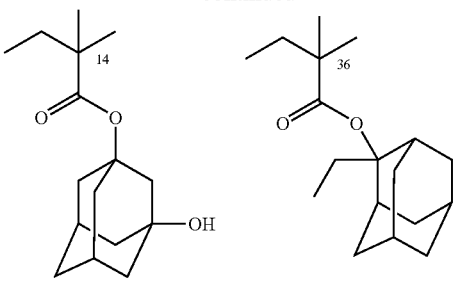
Mw: 9420
Mw/Mn: 1.8
Tg: 129° C.
(R5)
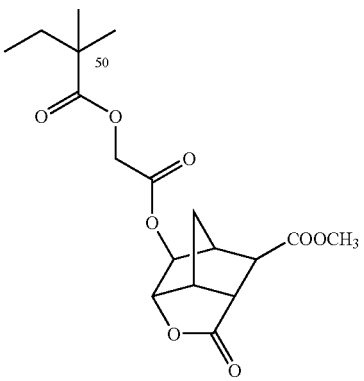
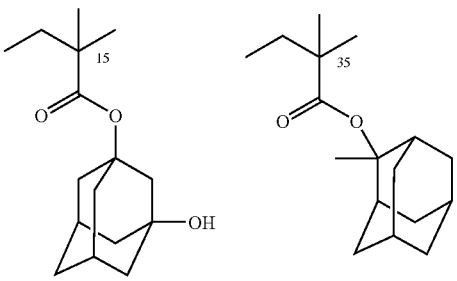
Mw: 9720
Mw/Mn: 1.8
Tg: 155° C.
(R6)
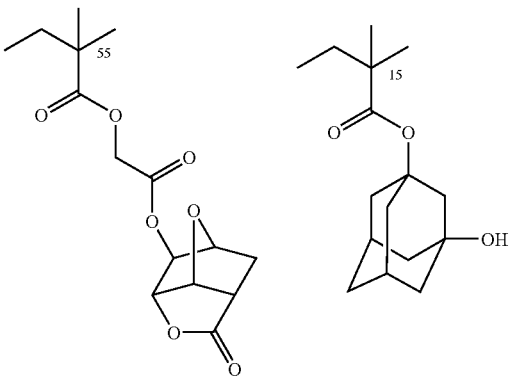

-continued

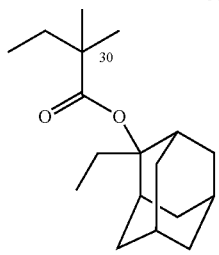

Mw: 9540
Mw/Mn: 1.8
Tg: 150° C.

<Evaluation of Hydrolysis Rate of Lactone Monomer>
(Measuring Conditions for HPLC)
Apparatus: New Shimadzu,
column: Sympack column (ODS),
eluate: acetonitrile/buffer=70/30, 1 ml/min,
buffer: distilled water/phosphoric acid/triethylamine=1000/1/1, and
detection: 254 nm.

(Preparation of Solution)
(A) Anisole Solution (Internal Standard)

1 g of 2,4-dimethylanisole was placed in a 50-ml measuring flask and measured up with acetonitrile.

(B) Lactone Sample Solution 1 mmol of a sample and 2 ml of the anisole solution (A) were placed in a 10-ml measuring flask and measured up with acetonitrile.

(Measurement)
(1) Measurement of Reference 0.3 ml of a sample solution and 2.7 ml of acetonitrile were placed in an HPLC sample tube and measured by HPLC.

(2) Measurement of Sample (Reaction with Alkali: Evaluation of Hydrolyzability)

0.3 ml of a sample solution and 1.2 ml of acetonitrile were placed in an HPLC sample tube, and 1.5 ml of a pH10 standard solution was added thereto, gently shaken so as to obtain a homogeneous mixture, and then measured by HPLC.

(3) Measurement of Sample (Reaction with Water: Evaluation of Stability)

The procedure of item 2 above was repeated except that water was used in place of the pH10 standard solution.

The monomer residual ratio (%) was determined from the area ratio between that of the monomer and of the internal standard at each reaction time with the employment of the area ratio at the beginning of the reaction as a base quantity (100%). The residual ratio of the following GBL lactone at the lapse of 10 min was regarded as a standard value (1) and the rate of alkali hydrolysis of each of other lactones was defined by a relative value according to the formula given below. The greater the value, the lower the rate of hydrolysis. The smaller the value, the higher the rate of hydrolysis.

[relative value of the rate of alkali hydrolysis]=[residual ratio of other lactone]/[residual ratio of reference lactone (GBL)]

TABLE 2

| | (relative values of the rate of alkali hydrolysis) |
|---|---|
| GBL 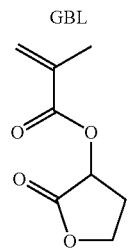 | 1 |
| 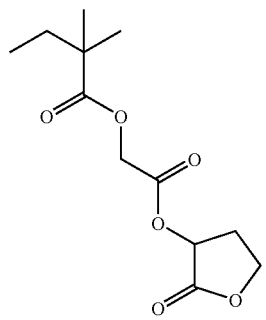 | 0.7 |
| 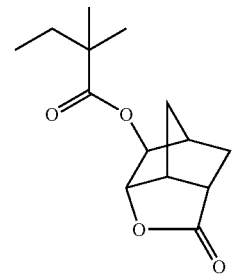 | 3.2 |
| 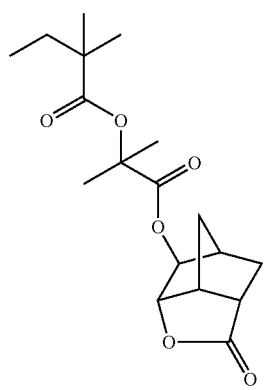 | 3 |

TABLE 2-continued (relative values of the rate of alkali hydrolysis)

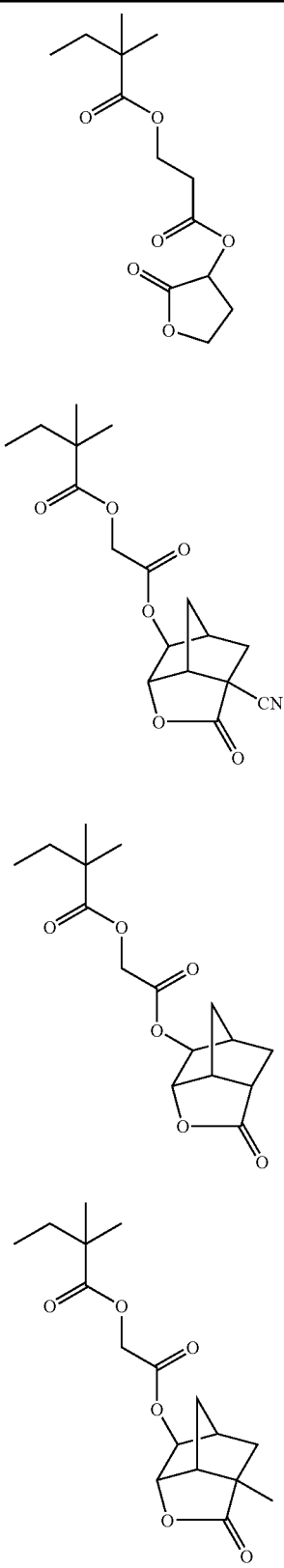

0.7

<0.1

2.8

3.3

TABLE 2-continued (relative values of the rate of alkali hydrolysis)

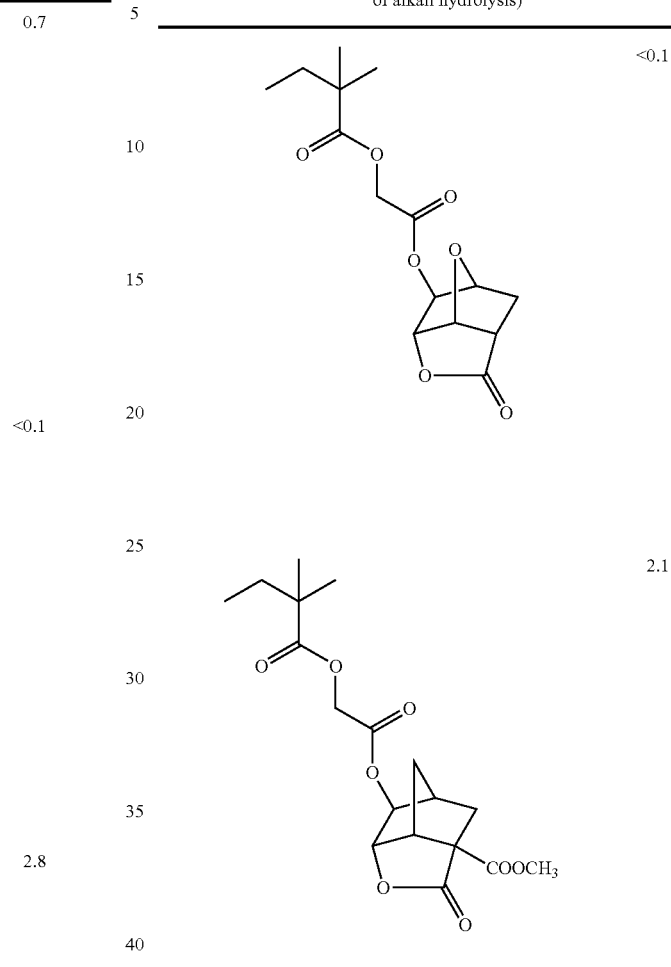

<0.1

2.1

<Preparation of Resist>

The components indicated in the following Table 3 were dissolved in a solvent to obtain a solution with the solid content of each of the components being 4 mass %. This solution was passed through a polyethylene filter of 0.05-μm pore size, thereby obtaining a actinic ray-sensitive or radiation-sensitive resin composition. The thus obtained actinic ray-sensitive or radiation-sensitive resin composition was evaluated by the following methods, the results of which being given in Table 4. Note that the ratios given in Table 3 represents the mass ratios thereof.

In Table 3, the addition mode is indicated as "addition" when the actinic ray-sensitive or radiation-sensitive resin composition contained a hydrophobic resin (HR). On the other hand, the addition mode is indicated as "TC" when the actinic ray-sensitive or radiation-sensitive resin composition was free of hydrophobic resin (HR) and when after formation of a resist film, a top coat protective film containing a hydrophobic resin (HR) was formed on an upper layer of the resist film.

TABLE 3

| | Resin (A) (3.5 g) | Photoacid generator (B) (0.3 g) | Basic compound (10 mg) | Surfactant (10 mg) | Hydrophobic resin (addition/TC) | Solvent (96.5 g) |
|---|---|---|---|---|---|---|
| Ex. 1 | (1) | PAG-1/PAG-3 = 2/1 | DIA | W-1 | addition HR-28 (30 mg) | A1/B1 = 6/4 |
| 2 | (2) | PAG-2/PAG-3 = 1/1 | DIA | W-1 | addition HR-47 (35 mg) | A1/B1 = 6/4 |
| 3 | (3) | PAG-4 | TBAH | W-2 | addition HR-41 (45 mg) | A1/A3 = 95/5 |
| 4 | (4) | PAG-1/PAG-3 = 1/1 | TMEA | W-5 | addition HR-47 (20 mg) | A1/B1 = 6/4 |
| 5 | (5) | PAG-2/PAG-4 = 2/1 | PEA | W-3 | addition HR-47 (30 mg) | A1/B1 = 6/4 |
| 6 | (6) | PAG-1/PAG-4 = 1/1 | DIA | W-2 | addition HR-50 (30 mg) | A1/B1 = 6/4 |
| 7 | (7) | PAG-1/PAG-4 = 2/1 | PEA | W-4 | addition HR-47 (30 mg) | A1/A2 = 8/2 |
| 8 | (8) | PAG-3 | PEA | W-5 | addition HR-28 (30 mg) | A1/B2 = 8/2 |
| 9 | (9) | PAG-1/PAG-4 = 1/2 | DIA | W-1 | addition HR-28 (30 mg) | A1/B1 = 6/4 |
| 10 | (4) | PAG-2 | TMEA | W-5 | addition HR-40 (30 mg) | A1/B1 = 6/4 |
| 11 | (4) | PAG-1/PAG-4 = 1/2 | DIA | W-5 | TC HR-50 | A1/B1 = 6/4 |
| Ex. 12 | (1) | PAG-5 | DIA | — | addition HR-47 (30 mg) | A1 |
| 13 | (7) | PAG-1/PAG-4 = 1/1 | DIA | W-1 | addition HR-47 (15 mg) HR-28 (15 mg) | A1/A2 = 8/2 |
| 14 | (8) | PAG-5 | DIA | W-1 | addition HR-47 (30 mg) | A1 |
| 15 | (1) | PAG-6 | DIA | — | addition HR-47 (30 mg) | A1/B2 = 6/4 |
| 16 | (1) | PAG-2 | PEA | W-2 | addition HR-28 (30 mg) | A1/B = 8/2 |
| 17 | (4) | PAG-3 | DIA | — | addition HR-47 (30 mg) | A1 |
| 18 | (3) | PAG-2 | DIA | W-1 | addition HR-47 (15 mg) HR-56 (15 mg) | A1 |
| 19 | (1) | PAG-1/PAG-3 = 1/1 | DIA | W-1 | addition HR-47 (30 mg) | A1/B2 = 8/2 |
| 20 | (1) | PAG-1/PAG-5 = 1/1 | DIA | — | addition HR-47 (30 mg) | A1 |
| Comp. 1 | R1 | PAG-2 | DIA | W-1 | addition HR-41 (30 mg) | A1/B1 = 6/4 |
| 2 | R2 | PAG-2 | TBAH | W-2 | addition HR-41 (30 mg) | A1/A3 = 95/5 |
| 3 | R3 | PAG-2 | PEA | W-2 | addition HR-28 (30 mg) | A1/A3 = 95/5 |

TABLE 3-continued

| | Resin (A) (3.5 g) | Photoacid generator (B) (0.3 g) | Basic compound (10 mg) | Surfactant (10 mg) | Hydrophobic resin (addition/TC) | Solvent (96.5 g) |
|---|---|---|---|---|---|---|
| 4 | R4 | PAG-2 | DIA | W-2 | addition HR-28 (30 mg) | A1/A3 = 95/5 |
| 5 | R5 | PAG-2 | TMEA | W-1 | addition HR-40 (30 mg) | A1/B1 = 6/4 |
| 6 | R6 | PAG-2 | TMEA | W-2 | addition HR-41 (30 mg) | A1/B1 = 6/4 |
| 7 | R4 | PAG-4 | DIA | W-2 | addition HR-28 (30 mg) | A1/A3 = 95/5 |
| 8 | R4 | PAG-2 | DIA | W-1 | TC HR-50 | A1/A3 = 95/5 |

The brevity codes used in the table represents the followings.

[Photoacid Generator]

PAG-1: $Ph_3S^+C_3F_7SO_3^-$

PAG-2: $Ph_3S^+C_4F_9SO_3^-$

PAG-3:

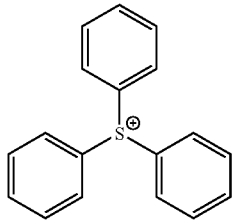

PAG-4:

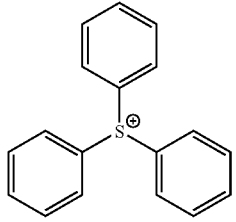

PAG-5 and PAG-6:

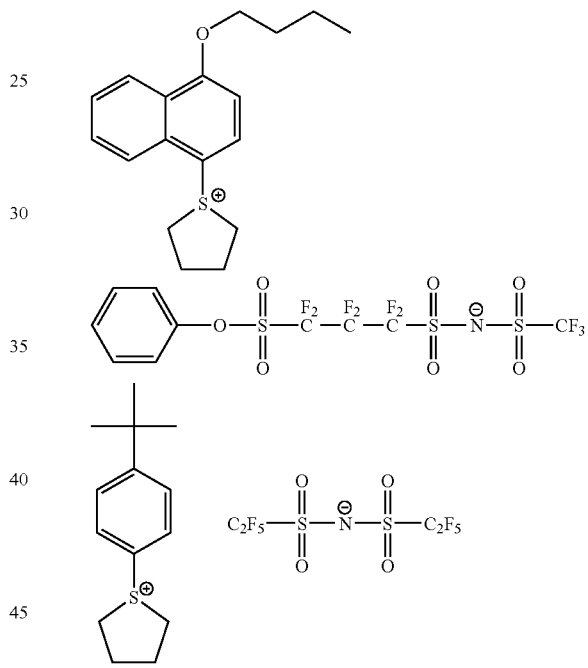

[Basic Compound]

DIA: 2,6-diisopropylaniline,
TBAH: tetrabutylammonium hydroxide,
TMEA: tris(methoxyethoxyethyl)amine, and
PEA: N-phenyldiethanolamine.

[Surfactant]

W-1: Megafac F176 (produced by Dainippon Ink & Chemicals, Inc.; fluorinated)
W-2: Megafac R08 (produced by Dainippon Ink & Chemicals, Inc.; fluorinated and siliconized),
W-3: Troy Sol S-366 (produced by Troy Chemical Co., Ltd.),
W-4: PF656 (produced by OMNOVA; fluorinated), and
W-5: PF6320 (produced by OMNOVA; fluorinated).

[Solvent]

A1: propylene glycol monomethyl ether acetate,
A2: cyclohexanone,
A3: γ-butyrolactone, B1: propylene glycol monomethyl ether, and
B2: ethyl lactate.

(Exposure Condition: ArF Liquid Immersion Exposure)

An organic anti-reflection film ARC29SR (produced by Nissan Chemical Industries, Ltd.) was applied onto a silicon wafer and baked at 205° C. for 60 seconds, thereby forming a 95-nm-thick anti-reflection film. Each of the above prepared actinic ray-sensitive or radiation-sensitive resin compositions was applied thereonto and baked at 85° C. for 60 seconds, thereby forming a 100-nm-thick resist film. The resultant wafer was exposed through a 6% half-tone mask of 50 nm 1/1 line and space pattern by means of an ArF excimer laser liquid immersion scanner (manufactured by ASML, XT-1700Fi, NA1.20, $\sigma_0/\sigma_1=0.94/0.74$). Ultrapure water was used as the liquid for liquid immersion. Thereafter, the exposed wafer was heated at 90° C. for 60 seconds, developed with an aqueous solution of tetramethylammonium hydroxide (2.38 mass %) for 30 seconds, rinsed with pure water, and spin dried to obtain a resist pattern.

(Measurement of Exposure Latitude [EL])

A formed pattern was observed by means of an SEM (eCD2, manufactured by KLA Tencor). The exposure intensity Emax for reproduction of 45 nm, optimum exposure intensity Eopt for reproduction of 50 nm, and exposure intensity Emin for reproduction of 55 nm were measured. The exposure latitude was calculated by the formula:

[Exposure latitude (%)]=100×(Emax−Emin)/Eopt.

(Measurement of Mask Error Enhancement Factor [MEEF])

Exposure was carried out through not only a line/space=50 nm/50 nm mask pattern but also line/space=47 nm/53 nm, 48 nm/52 nm, 49 nm/51 nm, 51 nm/49 nm, 52 nm/48 nm and 53 nm/47 nm mask patterns. Upon pattern formation, the line widths were measured by means of an SEM (eCD2, manufactured by KLA Tencor). A graph indicating the mask line widths on the axis of abscissas and indicating the measured line widths on the ordinate axis was drawn, and the gradient of a line resulting from first-order approximation of measurement points (viz. MEEF) was determined.

(Measurement of Line Width Roughness [LWR])

The line-width measurement at 50 points was conducted with respect to a 50-nm 1/1 line/space pattern and the $3\sigma$ value thereof (viz. LWR) was computed.

TABLE 4

| | Resin (A) | LWR (nm) | EL (%) | MEEF |
|---|---|---|---|---|
| Example | | | | |
| 1 | (1) | 6.4 | 15.5 | 4.7 |
| 2 | (2) | 6.0 | 15 | 5.7 |
| 3 | (3) | 7.0 | 14 | 6.9 |
| 4 | (4) | 5.5 | 16 | 4.1 |
| 5 | (5) | 5.6 | 16 | 4.0 |
| 6 | (6) | 6.6 | 14.5 | 6.2 |
| 7 | (7) | 6.2 | 15 | 5.1 |
| 8 | (8) | 6.6 | 14.5 | 5.8 |
| 9 | (9) | 6.8 | 14 | 6.2 |
| 10 | (4) | 5.5 | 15.8 | 4.3 |
| 11 | (4) | 5.5 | 16 | 4.1 |
| 12 | (1) | 5.3 | 15.5 | 4.6 |
| 13 | (7) | 6.0 | 15.1 | 5.1 |
| 14 | (8) | 5.3 | 16.0 | 4.2 |
| 15 | (1) | 5.3 | 16.0 | 4.2 |
| 16 | (1) | 6.1 | 15.2 | 4.5 |
| 17 | (4) | 6.2 | 15.3 | 4.4 |
| 18 | (3) | 6.0 | 15.1 | 4.1 |
| 19 | (1) | 6.0 | 15.3 | 4.5 |
| 20 | (1) | 5.4 | 15.7 | 4.4 |

TABLE 4-continued

| | Resin (A) | LWR (nm) | EL (%) | MEEF |
|---|---|---|---|---|
| Comparative Example | | | | |
| 1 | R1 | 9.9 | 10 | 10 |
| 2 | R2 | 8.9 | 10 | 10 |
| 3 | R3 | 8.5 | 9.5 | 11 |
| 4 | R4 | 8.3 | 10 | 10 |
| 5 | R5 | 8.7 | 11 | 9.5 |
| 6 | R6 | 8.3 | 12 | 9.1 |
| 7 | R4 | 8.8 | 12 | 9 |
| 8 | R4 | 8.5 | 10 | 10 |

As apparent from the results given in Table 4, the patterns formed using the actinic ray-sensitive or radiation-sensitive resin compositions according to the present invention are superior in all of the LWR, exposure latitude and MEEF, thereby proving that the actinic ray-sensitive or radiation-sensitive resin compositions according to the present invention can be appropriately used in an ArF liquid immersion exposure process.

The same experiment as described above was carried out except that the exposure condition was changed from the ArF liquid immersion exposure to an ArF dry exposure. As a result, similar patterns excelling in all of the LWR, exposure latitude and MEEF were obtained, thereby proving that the actinic ray-sensitive or radiation-sensitive resin compositions according to the present invention can also be appropriately used in an ArF dry exposure process.

What is claimed is:

1. An actinic ray-sensitive or radiation-sensitive resin composition comprising:
   (A) a resin having at least two of repeating units represented by general formula (1) below and exhibiting increased solubility in an alkali developer when acted on by an acid; and
   (B) a compound that generates an acid when exposed to actinic rays or radiation;

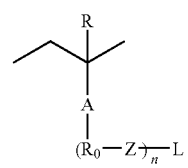

(1)

wherein:
R represents a hydrogen atom or an optionally substituted alkyl group;
A represents:

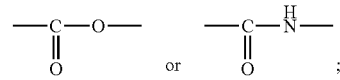

$R_0$, each independently in the presence of two or more groups, represents an optionally substituted alkylene group, an optionally substituted cycloalkylene group or a combination thereof, with the proviso that an alkylene group having two or more carbon atoms is excluded when L represents a butyrolactone;
Z, each independently in the presence of two or more groups, represents an ether bond, an ester bond, an amido bond, a urethane bond or a urea bond;

L represents a substituent with a lactone structure;
n represents the number of repetitions and is an integer of 1 to 5;
each of the at least two of the repeating units represented by the general formula (1) has different rates of alkali hydrolysis; and
the resin (A) has at least one of repeating units represented by general formula (1-1) below as the repeating unit represented by the general formula (1);

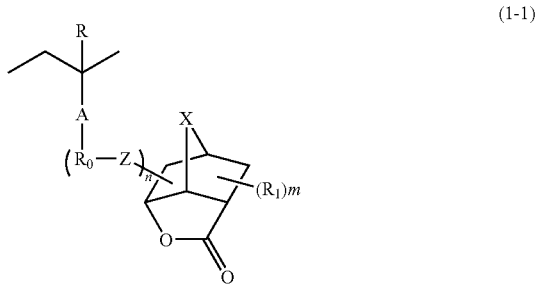

(1-1)

wherein:
R, A, $R_0$, Z and n are as defined above with respect to the general formula (1);
$R_1$, each independently in the presence of two or more groups, represents an optionally substituted alkyl group, an optionally substituted cycloalkyl group, an optionally substituted ester group, a cyano group, a hydroxy group or an alkoxy group, and provided that two or more $R_1$s are present, two thereof may be bonded to each other to form a ring;
X represents an alkylene group, an oxygen atom or a sulfur atom; and
m represents the number of substituents and is an integer of 0 to 5.

2. The composition according to claim 1, wherein the resin (A) has at least two of the repeating units represented by the general formula (1-1).

3. The composition according to claim 1, wherein a glass transition point of the resin (A) is within the range of 130° C. to 170° C.

4. The composition according to claim 1, wherein the resin (A) has both at least one repeating unit having any of groups represented by general formula (2-1) below and at least one repeating unit having any of groups represented by general formula (2-2) below;

(2-1)

(2-2)

wherein:
in the general formula (2-1),
each of $R_2$s independently represents an optionally substituted alkyl group or an optionally substituted monocyclic alkyl group, with the proviso that at least one of the $R_2$s is an optionally substituted monocyclic alkyl group, or provided that two $R_2$s are bonded to each other to form a monocyclic alkyl group; and
in the general formula (2-2),
each of $R_3$s independently represents an optionally substituted alkyl group or an optionally substituted polycyclic alkyl group, with the proviso that at least one of the $R_3$s is an optionally substituted polycyclic alkyl group, or provided that two $R_3$s are bonded to each other to form a polycyclic alkyl group.

5. The composition according to claim 1, containing any of compounds represented by general formula (I) below as the compound (B);

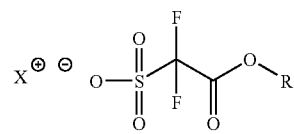

(I)

wherein $X^+$ represents a sulfonium or an iodonium, and R' of general formula (I) represents a hydrogen atom or a substituent having one or more carbon atoms.

6. The composition according to claim 5, wherein R' of general formula (I) is represented by the following formula (II);

(II)

wherein:
Rc represents a monocyclic or polycyclic organic group having 3 to 30 carbon atoms that may contain a cyclic ether, cyclic thioether, cyclic ketone, cyclic carbonate ester, lactone or lactam structure,
Y represents a hydroxy group, a halogen atom, a cyano group, a carboxy group, a hydrocarbon group having 1 to 10 carbon atoms, a hydroxyalkyl group having 1 to 10 carbon atoms, an alkoxy group having 1 to 10 carbon atoms, an acyl group having 1 to 10 carbon atoms, an alkoxycarbonyl group having 2 to 10 carbon atoms, an acyloxy group having 2 to 10 carbon atoms, an alkoxyalkyl group having 2 to 10 carbon atoms or a halogenated alkyl group having 1 to 8 carbon atoms,
m' of formula (II) is an integer of 0 to 6 and in the event of multiple Ys, they may be identical to or different from each other,
n' of formula (II) is an integer of 0 to 10, and
the number of carbon atoms constructing each of the groups R' of general formula (I) expressed by the formula (II) is 40 or less.

7. The composition according to claim 6, wherein Rc represents a polycyclic organic group.

8. The composition according to claim 1, further comprising (C) a hydrophobic resin.

9. The composition according to claim 8, wherein the content of (C)=0.01 to 10 mass % based on the total solids of the composition.

10. The composition according to claim 8, wherein (C) contains a fluorine atom.

11. The composition according to claim 8, wherein (C) contains a silicone atom.

12. The composition according to claim 8, wherein (C) contains group (x) an alkali soluble group.

13. The composition according to claim 8, wherein (C) contains group (y) a group that is decomposed by the action of an alkali developer, resulting in an increase of solubility in the alkali developer.

14. The composition according to claim 13, wherein the group (y) contains a lactone structure.

15. The composition according to claim 8, wherein (C) contains group (z) a group that is decomposed by the action of an acid.

16. A method of forming a pattern comprising:
forming the composition according to claim 8 into a film,
exposing the obtained film to actinic rays or radiation; and
developing the exposed film with an alkali developer.

17. A method of forming a pattern, comprising:
forming the composition according to claim 1 into a film,
exposing the obtained film to actinic rays or radiation; and
developing the exposed film with an alkali developer.

* * * * *